United States Patent
Matsuura et al.

(10) Patent No.: US 8,633,510 B2
(45) Date of Patent: Jan. 21, 2014

(54) IE-TYPE TRENCH GATE IGBT

(75) Inventors: Hitoshi Matsuura, Kanagawa (JP); Yoshito Nakazawa, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/470,473

(22) Filed: May 14, 2012

(65) Prior Publication Data

US 2012/0292662 A1    Nov. 22, 2012

(30) Foreign Application Priority Data

May 16, 2011  (JP) .................. 2011-109341
Feb. 1, 2012  (JP) .................. 2012-019942

(51) Int. Cl.
*H01L 29/66* (2006.01)

(52) U.S. Cl.
USPC ............. 257/139; 257/E29.201; 257/E21.382

(58) Field of Classification Search
USPC ................ 257/139, 197, E29.027, E29.066, 257/E29.197, E29.201, E21.382, 138; 438/27, 133, 137
See application file for complete search history.

(56) References Cited

U.S. PATENT DOCUMENTS

| | | | |
|---|---|---|---|
| 6,445,048 B1 | 9/2002 | Pfirsch | |
| 2004/0178457 A1* | 9/2004 | Francis et al. | 257/397 |
| 2005/0263852 A1 | 12/2005 | Ogura et al. | |
| 2006/0163650 A1* | 7/2006 | Ma | 257/330 |
| 2008/0246055 A1* | 10/2008 | Schulze et al. | 257/133 |
| 2008/0265315 A1* | 10/2008 | Mauder et al. | 257/330 |
| 2009/0039386 A1 | 2/2009 | Ogura et al. | |
| 2009/0057713 A1* | 3/2009 | Hirler | 257/143 |
| 2011/0101417 A1 | 5/2011 | Ogura et al. | |

FOREIGN PATENT DOCUMENTS

| | | |
|---|---|---|
| JP | 06/013621 A | 1/1994 |
| JP | 2000-307116 A | 11/2000 |
| JP | 2002-534811 A | 10/2002 |
| JP | 2005-340626 A | 12/2005 |
| JP | 2009-043782 A | 2/2009 |
| JP | 2010-050307 A | 3/2010 |
| WO | 00/41246 A1 | 7/2000 |

* cited by examiner

*Primary Examiner* — Brook Kebede
(74) *Attorney, Agent, or Firm* — Mattingly & Malur, PC

(57) ABSTRACT

The invention of the present application provides an IE-type trench IGBT. In the IE-type trench IGBT, each of linear unit cell areas that configure a cell area is comprised principally of linear active and inactive cell areas. The linear active cell area is divided into an active section having an emitter region and an inactive section as seen in its longitudinal direction.

20 Claims, 43 Drawing Sheets

IE-TYPE TRENCH GATE IGBT

CROSS-REFERENCE TO RELATED APPLICATIONS

The present application claims priority from Japanese patent applications JP 2012-019942 filed on Feb. 1, 2012 and JP 2011-109341 filed on May 16, 2011, the contents of which are hereby incorporated by reference into this application.

BACKGROUND

The present invention relates to a technology effective when applied to a device structure technology or the like used in a power semiconductor device (or semiconductor integrated circuit device) such as an IE (Injection Enhancement)-type trench gate IGBT (Insulated Gate Bipolar Transistor) having a floating P type region.

There has been disclosed in Japanese Patent Laid-Open No. Hei 6 (1994)-13621 (Patent Document 1), a technology in which in a trench-type power MOSFET (Metal Oxide Semiconductor Field Effect Transistor), a P+ region is provided at a trench lower end to thereby relax the concentration of an electric field on the trench lower end.

There has been disclosed in Japanese Patent Laid-Open No. 2005-340626 (Patent Document 2) or U.S. Patent Publication No. 2009-39386 (Patent Document 3) corresponding to it, a technology in which in an IE-type IGBT, a floating P type region deeper than a trench in depth is provided at a floating cell portion, and another floating P type region is provided which surrounds a trench lower end lying between the floating cell portion and an active cell portion and is coupled to the floating P type region.

There has been disclosed in Japanese Patent Application Publication No. 2002-534811 (Patent Document 4) or U.S. Pat. No. 6,445,048 (Patent Document 5), a technology in which in an IE-type IGBT, a floating P type region deeper than a trench in depth is provided at a floating cell portion, and a termination structure including a structure similar to the floating cell portion is provided at an outer peripheral portion of the entire cell area.

There has been disclosed in Japanese Patent Laid-Open No. 2009-43782 (Patent Document 6), a technology in which a floating P type region having the same depth as a trench is provided at an IE-type IGBT.

There has been disclosed in Japanese Patent Laid-Open. No. 2000-307116 (Patent Document 7), a technology in which in an IE-type IGBT, a floating P body region deeper than a trench in depth is provided only at the central part of a floating cell portion in addition to a shallow floating P type region provided at the entire floating cell portion.

There has been disclosed in Japanese Patent Laid-Open No. 2010-50307 (Patent Document 8), a technology in which in a normal type IGBT other than an IE type, an N type hole barrier region is provided in a region including a trench's lower end.

[Patent Document 1] Japanese Patent Laid-Open No. Hei 6 (1994)-13621

[Patent Document 2] Japanese Patent Laid-Open No. 2005-340626

[Patent Document 3] U.S. Patent Publication No. 2009-39386

[Patent Document 4] Japanese Patent Application Publication No. 2002-534811

[Patent Document 5) U.S. Pat. No. 6,445,048

[Patent Document 6] Japanese Patent Laid-Open No. 2009-43782

[Patent Document 7] Japanese Patent Laid-Open No. 2000-307116

[Patent Document 8] Japanese Patent Laid-Open No. 2010-50307

SUMMARY

Although a trench IGBT has widely been used as an IGBT low in on resistance, an IE-type trench IGBT using IE (Injection Enhancement) effects has been developed to further promote conductivity modulation. This type of IE-type trench IGBT has a structure in which in a cell area, active cells each coupled to an emitter electrode and inactive cells (or floating cells) each having a floating P body region are actually arranged alternately or in comb-teeth form to thereby facilitate the accumulation of holes (positive holes) on the device main surface side (emitter side) of a semiconductor substrate.

According to the results of studies carried out by the present inventors et al of the present application, it has been revealed here that when the width of an inactive cell is made wide in an attempt to carry out further promotion of conductivity modulation and simplification of a device at an IE-type trench IGBT, a breakdown voltage is rapidly reduced because there is no emitter contact in the inactive cell.

The invention of the present application has been made to solve these problems.

An object of the present invention is to provide a semiconductor device high in reliability and a manufacturing process thereof.

The above and other objects and novel features of the present invention will be apparent from the description of the specification and the accompanying drawings.

A summary of a typical one of the inventive aspects of the invention disclosed in this application will be briefly described as follows:

One invention of the present application provides an IE-type trench IGBT in which each of linear unit cell areas that configure a cell area is comprised principally of a linear active cell area and linear inactive cells area, and the linear active cell area is divided into an active section having an emitter region and an inactive section as seen in its longitudinal direction.

An advantageous effect obtained by a typical one of the inventive aspects of the invention disclosed in the present application will briefly be explained as follows:

In an IE-type trench IGBT, each of linear unit cell areas that configure a cell area is comprised principally of a linear active cell area and a linear inactive cell area. The linear active cell area is separated into an active section having an emitter region and an inactive section as seen in its longitudinal direction. It is therefore possible to more enhance IE effects.

DETAILED DESCRIPTION

[Summary of the Embodiments]

Figure 1:
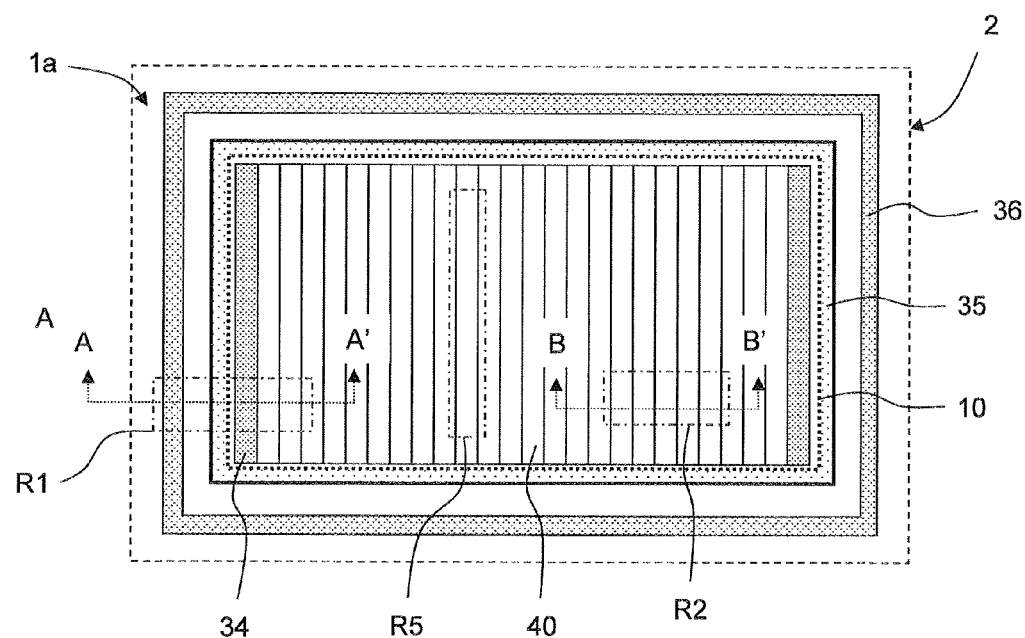
FIG. 1 is a top face typical layout diagram of a cell area of an IE-type trench gate IGBT device chip and its periphery for describing the outline of a major embodiment of the present application.

A summary of typical embodiments of the invention disclosed in the present application will first be explained.

1. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface; and (d) a number of linear unit cell areas provided within the cell area as seen on a plane basis;

wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) an active section provided within the linear active cell area and divided in a longitudinal direction thereof;

(d6) a first conductivity type emitter region of the same conductivity type as the first conductivity type, which is provided in a surface region on the first main surface side, of the second conductivity type body region at the active section; and (d7) an inactive section unprovided with the first conductivity type emitter region, which is provided within the linear active cell area and divided in a longitudinal direction thereof.

2. In the IE-type trench gate IGBT according to the above paragraph 1, the width of the linear active cell area is narrower than the width of the linear inactive cell area.

3. In the IE-type trench gate IGBT according to the above paragraph 1 or 2, a second conductivity type floating region of a conductivity type opposite to the first conductivity type is provided in a surface region on the first main surface side, of the drift region in the linear inactive cell area approximately over a whole area thereof, and the second conductivity type floating region covers lower ends of the pair of trenches and is deeper than the pair of trenches in depth.

4. In the IE-type trench gate IGBT according to any one of the above paragraphs 1 through 3, each of the linear unit cell areas has a plurality of blocks which form longitudinal direction columns thereof, and each block has the following:

(x1) an active subblock having the active section;

(x2) an inactive subblock having no active section;

(x3) a coupling trench gate electrode which couples between the pair of linear trench gate electrodes and separates the active subblock and the inactive subblock from each other; and (x4) an emitter contact portion unprovided in the inactive subblock and provided in the active subblock.

5. In the IE-type trench gate IGBT according to the above paragraph 4, the active section is provided at part of the active subblock.

6. In the IE-type trench gate IGBT according to the above paragraph 4, the active sections are provided over a full range of the active subblock.

7. In the IE-type trench gate IGBT according to any one of the above paragraphs 1 through 6, the linear inactive cell area has the following:

(y1) a first conductivity type floating region formation section which is divided in a longitudinal direction of the linear inactive cell area and which is formed in the surface region thereof on the first main surface side and has a first conductivity type floating region of the same conductivity type as the first conductivity type; and (y2) a first conductivity type floating region non-formation section which is divided in a longitudinal direction of the linear inactive cell area and which is formed in the surface region thereof on the first main surface side and unprovided with the first conductivity type floating region.

8. In the IE-type trench gate IGBT according to any one of the above paragraphs 1 through 6, a first conductivity type floating region of the same conductivity type as the first conductivity type is provided in the surface region on the first main surface side, of the linear inactive cell area approximately over a whole area thereof.

9. In the IE-type trench gate IGBT according to any one of the above paragraphs 4 through 6, a first conductivity type floating region of the same conductivity type as the first conductivity type is provided in the surface region on the first main surface side, of each of the inactive subblock and the linear inactive cell area approximately over a whole area thereof.

10. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface; and (d) a number of linear unit cell areas provided within the cell area as seen on a plane basis;

wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area;

(d6) a first conductivity type hole barrier region which is of the same conductivity type as the first conductivity type, provided in the drift region lying underneath the second conductivity type body region in the linear active cell area and which is higher than the drift region and lower than the first conductivity type emitter region in impurity concentration; and (d7) a second conductivity type floating region of a conductivity type opposite to the first conductivity type, which is provided approximately over a whole area of the surface region on the first main surface side in the linear inactive cell area, wherein the second conductivity type floating region covers lower ends of the pair of trenches and is deeper than the pair of trenches in depth.

11. In the IE-type trench gate IGBT according to the above paragraph 10, the width of each of the pair of trenches is less than or equal to 0.8 micrometers.

12. In the IE-type trench gate IGBT according to the above paragraph 10 or 11, the second conductivity type floating region is formed simultaneously with a floating field ring at an outer periphery of the cell area.

13. In the IE-type trench gate IGBT according to any one of the above paragraphs 10 through 12, the thicknesses of gate insulating films on both sides of each of the pair of linear trench gate electrodes are substantially the same.

14. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface;

(d) a number of linear unit cell areas provided within the cell area as seen on a plane basis;

(e) a metal collector electrode provided over the second main surface of the semiconductor substrate;

(f) a second conductivity type collector region of a conductivity type opposite to the first conductivity type, which is provided within the second main surface of the semiconductor substrate;

(g) a first conductivity type field stop region which is of the same conductivity type as the first conductivity type, provided on the second main surface side in the drift region so as to contact the second conductivity type collector region, and which is higher than the drift region in impurity concentration; and (h) a second conductivity type high-concentration collector contact region which is of the same conductivity type as the second conductivity type collector region, provided on the metal collector electrode side in the second conductivity type collector region, and which is more higher in impurity concentration, wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area; and (d6) a second conductivity type floating region of a conductivity type opposite to the first conductivity type, which is provided approximately over a whole area of the surface region on the first main surface side in the linear inactive cell area, wherein the second conductivity type floating region covers lower ends of the pair of trenches and is deeper than the pair of trenches in depth.

15. In the IE-type trench gate IGBT according to the above paragraph 14, each of the linear unit cell areas further has the following:

(d7) a first conductivity type hole barrier region which is of the same conductivity type as the first conductivity type, provided in the drift region lying underneath the second conductive type body region in the linear active cell area and which is higher than the drift region and lower than the first conductivity type emitter region in impurity concentration.

16. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface; and (d) a number of linear unit cell areas provided within the cell area as seen on a plane basis;

wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area; and (d6) a second conductivity type floating region of a conductivity type opposite to the first conductivity type, which is provided approximately over the whole area of the surface region on the first main surface side in the linear inactive cell area, wherein further the second conductivity type floating region covers lower ends of the pair of trenches and is deeper than the pair of trenches in depth, and wherein the IE-type trench gate IGBT further includes the following:

(e) a metal emitter electrode provided over the first main surface of the semiconductor substrate;

(f) linear dummy cell areas each of which is provided on the outermost side of the cell area and each of which extends in the same direction as the linear active cell area and has a contact portion with the metal emitter electrode; and (g) a second conductivity type cell peripheral junction area which is a conductivity type opposite to the first conductivity type, provided outside each linear dummy cell area so as to surround the periphery of the cell area as seen on a plane basis in the surface region on the first main surface side in the drift region, and which has a contact portion with the metal emitter electrode.

17. In the IE-type trench gate IGBT according to the above paragraph 16, the linear dummy cell area has the same structure as the linear active cell area except that the first conductivity type emitter region is not provided therein.

18. In the IE-type trench gate IGBT according to the above paragraph 16, the second conductivity type cell peripheral junction area extends to the inside of the linear dummy cell area.

19. In the IE-type trench gate IGBT according to the above paragraph 16, each of the linear unit cell areas further has the following:

(d7) a first conductivity type hole barrier region which is of the same conductivity type as the first conductivity type, provided in the drift region lying underneath the second conductivity type body region in the linear active cell area and which is higher than the drift region and lower than the first conductivity type emitter region in impurity concentration.

20. In the IE-type trench gate IGBT according to the above paragraph 17, each of the linear unit cell areas further has the following:

(d7) a first conductivity type hole barrier region which is of the same conductivity type as the first conductivity type, provided in the drift region lying underneath the second conductivity type body region in the linear active cell area and which is higher than the drift region and lower than the first conductivity type emitter region in impurity concentration.

A summary of other embodiments of the invention disclosed in the present application will next be explained.

21. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface;

(d) a number of linear unit cell areas provided within the cell area as seen on a plane basis;

(e) a metal collector electrode provided over the second main surface of the semiconductor substrate;

(f) a second conductivity type collector region of a conductivity type opposite to the first conductivity type, which is provided within the second main surface of the semiconductor substrate;

(g) a first conductivity type field stop region which is of the same conductivity type as the first conductivity type, provided on the second main surface side in the drift region so as to contact the second conductivity type collector region, and which is higher than the drift region in impurity concentration; and (h) a second conductivity type high-concentration collector contact region which is of the same conductivity type as the second conductivity type collector region, provided on the metal collector electrode side in the second conductivity type collector region, and which is more higher in impurity concentration, wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) an active section provided within the linear active cell area and divided in a longitudinal direction thereof;

(d6) a first conductivity type emitter region of the same conductivity type as the first conductivity type, which is provided in a surface region on the first main surface side, of the second conductivity type body region at the active section; and (d7) an inactive section unprovided with the first conductivity type emitter region, which is provided within the linear active cell area and divided in a longitudinal direction thereof.

22. In the IE-type trench gate IGBT according to the above paragraph 21, the width of the linear active cell area is narrower than the width of the linear inactive cell area.

23. In the IE-type trench gate IGBT according to the above paragraph 21 or 22, a second conductivity type floating region of a conductivity type opposite to the first conductivity type is provided in a surface region on the first main surface side, of the drift region in the linear inactive cell area approximately over a whole area thereof, and the second conductivity type floating region covers lower ends of the pair of trenches and is deeper than the pair of trenches in depth.

24. In the IE-type trench gate IGBT according to any one of the above paragraphs 21 through 23, each of the linear unit cell areas has a plurality of blocks which form longitudinal direction columns thereof, and each block has the following:

(x1) an active subblock having the active section;

(x2) an inactive subblock having no active section;

(x3) a coupling trench gate electrode which couples between the pair of linear trench gate electrodes and separates the active subblock and the inactive subblock from each other; and (x4) an emitter contact portion unprovided in the inactive subblock and provided in the active subblock.

25. In the IE-type trench gate IGBT according to the above paragraph 24, the active section is provided at part of the active subblock.

26. In the IE-type trench gate IGBT according to the above paragraph 24, the active sections are provided over a full range of the active subblock.

27. In the IE-type trench gate IGBT according to any one of the above paragraphs 21 through 26, the linear inactive cell area has the following:

(y1) a first conductivity type floating region formation section which is divided in a longitudinal direction of the linear inactive cell area and which is formed in the surface region thereof on the first main surface side and has a first conductivity type floating region of the same conductivity type as the first conductivity type; and (y2) a first conductivity type floating region non-formation section which is divided in a longitudinal direction of the linear inactive cell area and which is formed in the surface region thereof on the first main surface side and unprovided with the first conductivity type floating region.

28. In the IE-type trench gate IGBT according to any one of the above paragraphs 21 through 26, a first conductivity type floating region of the same conductivity type as the first conductivity type is provided in the surface region on the first main surface side, of the linear inactive cell area approximately over a whole area thereof.

29. In the IE-type trench gate IGBT according to any one of the above paragraphs 24 through 26, a first conductivity type floating region of the same conductivity type as the first conductivity type is provided in the surface region on the first main surface side, of each of the inactive subblock and the linear inactive cell area approximately over a whole area thereof.

30. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface;

(d) a number of linear unit cell areas provided within the cell area as seen on a plane basis;

(e) a metal collector electrode provided over the second main surface of the semiconductor substrate;

(f) a second conductivity type collector region of a conductivity type opposite to the first conductivity type, which is provided within the second main surface of the semiconductor substrate;

(g) a first conductivity type field stop region which is of the same conductivity type as the first conductivity type, provided on the second main surface side in the drift region so as to contact the second conductivity type collector region, and which is higher than the drift region in impurity concentration; and (h) a second conductivity type high-concentration collector contact region which is of the same conductivity type as the second conductivity type collector region, provided on the metal collector electrode side in the second conductivity type collector region, and which is more higher in impurity concentration, wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area; and (d6) a second conductivity type floating region of a conductivity type opposite to the first conductivity type, which is provided approximately over a whole area of the surface region on the first main surface side in the linear inactive cell area.

31. In the IE-type trench gate IGBT according to the above paragraph 30, the second conductivity type high-concentration collector contact region is a region doped with aluminum.

32. In the IE-type trench gate IGBT according to the above paragraph 31, a portion, which contacts the second conductivity type high-concentration collector contact region, of the metal collector electrode, is a metal film containing aluminum as a principal component.

33. An IE-type trench gate IGBT including the following:
(a) a semiconductor substrate having a first main surface and a second main surface;
(b) a drift region provided within the semiconductor substrate and having a first conductivity type;
(c) a cell area provided over the first main surface;
(d) a number of linear unit cell areas provided within the cell area as seen on a plane basis;
(e) a metal collector electrode provided over the second main surface of the semiconductor substrate;
(f) a second conductivity type collector region of a conductivity type opposite to the first conductivity type, which is provided within the second main surface of the semiconductor substrate;
(g) a first conductivity type field stop region which is of the same conductivity type as the first conductivity type, provided on the second main surface side in the drift region so as to contact the second conductivity type collector region, and which is higher than the drift region in impurity concentration; and
(h) a second conductivity type high-concentration collector contact region which is of the same conductivity type as the second conductivity type collector region, provided on the metal collector electrode side in the second conductivity type collector region, and which is more higher in impurity concentration,
wherein the second conductivity type high-concentration collector contact region is a region doped with aluminum.

34. In the IE-type trench gate IGBT according to the above paragraph 33, a portion, which contacts the second conductivity type high-concentration collector contact region, of the metal collector electrode, is a metal film containing aluminum as a principal component.

35. A trench gate IGBT including the following:
(a) a semiconductor substrate having a first main surface and a second main surface;
(b) a drift region provided within the semiconductor substrate and having a first conductivity type;
(c) a cell area provided over the first main surface;
(d) a number of linear unit cell areas provided within the cell area as seen on a plane basis;
(e) a metal collector electrode provided over the second main surface of the semiconductor substrate;
(f) a second conductivity type collector region of a conductivity type opposite to the first conductivity type, which is provided within the second main surface of the semiconductor substrate;
(g) a first conductivity type field stop region which is of the same conductivity type as the first conductivity type, provided on the second main surface side in the drift region so as to contact the second conductivity type collector region, and which is higher than the drift region in impurity concentration; and
(h) a second conductivity type high-concentration collector contact region which is of the same conductivity type as the second conductivity type collector region, provided on the metal collector electrode side in the second conductivity type collector region, and which is more higher in impurity concentration,
wherein the second conductivity type high-concentration collector contact region is a region doped with aluminum.

36. In the trench gate IGBT according to the above paragraph 35, a portion, which contacts the second conductivity type high-concentration collector contact region, of the metal collector electrode, is a metal film containing aluminum as a principal component.

37. An IGBT including the following:
(a) a semiconductor substrate having a first main surface and a second main surface;
(b) a drift region provided within the semiconductor substrate and having a first conductivity type;
(c) a cell area provided over the first main surface;
(d) a number of linear unit cell areas provided within the cell area as seen on a plane basis;
(e) a metal collector electrode provided over the second main surface of the semiconductor substrate;
(f) a second conductivity type collector region of a conductivity type opposite to the first conductivity type, which is provided within the second main surface of the semiconductor substrate;
(g) a first conductivity type field stop region which is of the same conductivity type as the first conductivity type, provided on the second main surface side in the drift region so as to contact the second conductivity type collector region, and which is higher than the drift region in impurity concentration; and
(h) a second conductivity type high-concentration collector contact region which is of the same conductivity type as the second conductivity type collector region, provided on the metal collector electrode side in the second conductivity type collector region, and which is more higher in impurity concentration,
wherein the second conductivity type high-concentration collector contact region is a region doped with aluminum.

38. In the IGBT according to the above paragraph 37, a portion, which contacts the second conductivity type high-concentration collector contact region, of the metal collector electrode, is a metal film containing aluminum as a principal component.

39. In the IGBT according to the above paragraph 21, 30, 33, 35 or 37, a portion, which contacts the second main surface of the semiconductor substrate, of the metal collector electrode, is a metal film containing aluminum as a principal component.

40. In the IE-type trench gate IGBT according to the above paragraph 39, the region doped with the aluminum is introduced by heat treatment when the metal film containing the aluminum as the principal component is grown.

Next, other summary of embodiments disclosed in the present application will further be explained.

41. An IE-type trench gate IGBT including the following:
(a) a semiconductor substrate having a first main surface and a second main surface;
(b) a drift region provided within the semiconductor substrate and having a first conductivity type;
(c) a cell area provided over the first main surface; and
(d) a number of linear unit cell areas provided within the cell area and over its periphery as seen on a plane basis;
wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area;

(d6) a second conductivity type floating region of a conductivity type opposite to the first conductivity type, which is provided approximately over a whole area of the surface region on the first main surface side in the linear inactive cell area;

(d7) an end trench provided in the surface region of the first main surface along the end of the linear inactive cell area;

(d8) a peripheral second conductivity type region which is provided in a surface region on the first main surface side, lying outside the cell area along the end trench and which is deeper than the body region and electrically coupled to the metal emitter electrode; and (d9) a peripheral contact portion with the metal emitter electrode, which is provided in the surface on the first main surface side on the peripheral second conductivity type region along the end trench, wherein the second conductivity type floating region covers lower ends of the pair of trenches and is deeper than the pair of trenches in depth, and wherein further another trench equivalent to the end trench or deeper than the same and such that a region being formed with the peripheral second conductivity type region and lying below the gate wiring and the peripheral contact portion and between the two is separated into regions close to and distant from the end trench on a plane basis is not provided on the side opposite to the end trench with respect to the peripheral contact portion.

42. In the IE-type trench gate IGBT according to the above paragraph 41, the peripheral second conductivity type region is formed approximately simultaneously with the floating region.

43. In the IE-type trench gate IGBT according to the above paragraph 41 or 42, the peripheral second conductivity type region is deeper than the end trench.

44. An IE-type trench gate IGBT including the following:

(a) an MCZ monocrystal silicon semiconductor substrate having a first main surface and a second main surface;

(b) a drift region provided within the semiconductor substrate and having a first conductivity type;

(c) a cell area provided over the first main surface; and (d) a number of linear unit cell areas provided within the cell area as seen on a plane basis;

wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) an active section provided within the linear active cell area and divided in a longitudinal direction thereof;

(d6) a first conductivity type emitter region of the same conductivity type as the first conductivity type, which is provided in a surface region on the first main surface side, of the second conductivity type body region at the active section; and (d7) an inactive section unprovided with the first conductivity type emitter region, which is provided within the linear active cell area and divided in a longitudinal direction thereof.

45. In the IE-type trench gate IGBT according to the above paragraph 44, the resistivity of the drift region ranges from about 20 Ωcm to about 85 Ωcm.

46. In the IE-type trench gate IGBT according to the above paragraph 44 or 45, the semiconductor substrate is manufactured by HMCZ growth or CMCZ growth.

47. In the IE-type trench gate IGBT according to any one of the above paragraphs 44 through 46, an oxygen defect concentration at loading of the semiconductor substrate ranges from about $3 \times 10^{17}/cm^3$ to about $7 \times 10^{17}/cm^3$.

48. In the IE-type trench gate IGBT according to any one of the above paragraphs 44 through 47, the width of the linear active cell area is narrower than the width of the linear inactive cell area.

49. In the IE-type trench gate IGBT according to any one of the above paragraphs 44 through 48, a second conductivity type floating region of a conductivity type opposite to the first conductivity type is provided in a surface region on the first main surface side, of the drift region in the linear inactive cell area approximately over a whole area thereof, and the second conductivity type floating region covers lower ends of the pair of trenches and is deeper than the pair of trenches in depth.

50. The IE-type trench gate IGBT according to any one of the above paragraphs 44 through 49 further includes the following:

(e) a metal collector electrode provided over the second main surface of the semiconductor substrate;

(f) a second conductivity type collector region of a conductivity type opposite to the first conductivity type, which is provided within the second main surface of the semiconductor substrate; and (g) a first conductivity type field stop region which is of the same conductivity type as the first conductivity type, provided on the second main surface side in the drift region so as to contact the second conductivity type collector region, and which is higher than the drift region in impurity concentration.

51. In the IE-type trench gate IGBT according to the above paragraph 50, the value of the carrier concentration of the second conductivity type collector region/the carrier concentration of the first conductivity type field stop region ranges from about 1.1 to about 4.

52. The IE-type trench gate IGBT according to the above paragraph 50 or 51 further includes the following:

(h) a second conductivity type high-concentration collector contact region which is of the same conductivity type as the second conductivity type collector region, provided on the metal collector electrode side in the second conductivity type collector region, and which is more higher in impurity concentration, wherein the second conductivity type high-concentration collector contact region is a region doped with aluminum.

53. In the IGBT according to the above paragraph 52, a portion, which contacts the second conductivity type high-concentration collector contact region, of the metal collector electrode, is a metal film containing aluminum as a principal component.

54. An IE-type trench gate IGBT including the following:

(a) an MCZ monocrystal silicon semiconductor substrate having a first main surface and a second main surface;

(b) a drift region provided within the semiconductor substrate and having a first conductivity type;

(c) a cell area provided over the first main surface;

(d) a number of linear unit cell areas provided within the cell area as seen on a plane basis;

(e) a metal collector electrode provided over the second main surface of the semiconductor substrate;

(f) a second conductivity type collector region of a conductivity type opposite to the first conductivity type, which is provided within the second main surface of the semiconductor substrate;

(g) a first conductivity type field stop region which is of the same conductivity type as the first conductivity type, provided on the second main surface side in the drift region so as to contact the second conductivity type collector region, and which is higher than the drift region in impurity concentration; and (h) a second conductivity type high-concentration collector contact region which is of the same conductivity type as the second conductivity type collector region, provided on the metal collector electrode side in the second conductivity type collector region, and which is more higher in impurity concentration, wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area; and (d6) a second conductivity type floating region of a conductivity type opposite to the first conductivity type, which is provided approximately over a whole area of the surface region on the first main surface side in the linear inactive cell area.

55. In the IE-type trench gate IGBT according to the above paragraph 54, the resistivity of the drift region ranges from about 20 Ωcm to about 85 Ωcm.

56. In the IE-type trench gate IGBT according to the above paragraph 54 or 55, the semiconductor substrate is manufactured by HMCZ growth or CMCZ growth.

57. In the IE-type trench gate IGBT according to any one of the above paragraphs 54 through 56, an oxygen defect concentration at loading of the semiconductor substrate ranges from about $3 \times 10^{17}/cm^3$ to about $7 \times 10^{17}/cm^3$.

58. In the IE-type trench gate IGBT according to any one of the above paragraphs 54 through 57, the value of the carrier concentration of the second conductivity type collector region/the carrier concentration of the first conductivity type field stop region ranges from about 1.1 to about 4.

59. In the IE-type trench gate IGBT according to any one of the above paragraphs 54 through 58, the second conductivity type high-concentration collector contact region is a region doped with aluminum.

60. In the IE-type trench gate IGBT according to the above paragraph 59, a portion, which contacts the second conductivity type high-concentration collector contact region, of the metal collector electrode, is a metal film containing aluminum as a principal component.

Next, other summary of embodiment disclosed in the present application will further be explained.

61. An IE-type trench gate IGBT including the following:

(a) a semiconductor substrate having a first main surface and a second main surface;

(b) a drift region provided within the semiconductor substrate and having a first conductivity type;

(c) a cell area provided over the first main surface;

(d) a number of linear unit cell areas provided within the cell area and over its periphery as seen on a plane basis;

(e) a metal gate electrode provided over the first main surface;

(f) a metal emitter electrode provided over the first main surface; and (g) a gate wiring provided at a peripheral outer portion of a cell formation are along a first side of the cell formation area, wherein each of the linear unit cell areas has the following:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides as seen on a plane basis;

(d3) a second conductivity type body region of a conductivity type opposite to the first conductivity type, which is provided in a surface region on the first main surface side, of the drift region;

(d4) linear inactive cell areas provided adjacent to each other on both sides so as to sandwich the linear active cell area therebetween from both sides thereof on a plane basis with the pair of linear trench gate electrodes as boundaries;

(d5) a first conductivity type emitter region of the same conductivity type as the first conductivity type, which is provided in a surface region on the first main surface side, of the second conductivity type body region in the linear active cell area;

(d6) a second conductivity type floating region of a conductivity type opposite to the first conductivity type, which is provided approximately over a whole area of the surface region on the first main surface side in the linear inactive cell area;

(d7) an end trench provided in the surface region of the first main surface along the end of the linear inactive cell area;

(d8) a peripheral second conductivity type region which extends from a surface region on the first main surface side below the gate wiring to the neighborhood of the end trench along the end trench and which is deeper than the body region and electrically coupled to the metal emitter electrode; and (d9) the metal emitter electrode and a peripheral contact portion lying over the surface on the first main surface side on the peripheral second conductivity type region and provided between the gate wiring and the end trench along the end trench, wherein the second conductivity type floating region covers lower ends of the pair of trenches and is deeper than the pair of trenches in depth, and wherein further another trench equivalent to the end trench or deeper than the same and such that a region being formed with the peripheral second conductivity type region and lying below the gate wiring and the peripheral contact portion and between the two is separated into regions close to the gate wiring and close to the end trench on a plane basis is not provided between the gate wiring and the peripheral contact portion.

62. In the IE-type trench gate IGBT according to the above paragraph 61, the peripheral second conductivity type region is formed approximately simultaneously with the floating region.

63. In the IE-type trench gate IGBT according to the above paragraph 61 or 62, the peripheral second conductivity type region is deeper than the end trench.

[Description of Descriptive Format, Basic Terms and Usage in the Present Application]

1. In the embodiments described below, the invention of the present application may be described by being divided into a plurality of sections as needed for convenience. However, unless specified not to be so in particular, they are not independently separated from each other. In terms of respective parts of a single example, one thereof relates to details of some of the other or modifications of some or all thereof, etc. A description of similar parts will no be repeated in principle. The components in the embodiments are not indispensable unless shown explicitly not to be so in particular, unless the number thereof is limited theoretically and unless obviously they are not so from the context.

Further, the term "semiconductor device" mentioned in the present application means that mainly, various single transistors (active elements), or resistors, capacitors and the like centering on the various single transistors, are integrated over a semiconductor chip or the like (e.g., single crystal silicon substrate). Here, as a typical one of various transistors, there can be illustrated an MISFET (Metal Insulator Semiconductor Field Effect Transistor) typified by a MOSFET (Metal Oxide Semiconductor Filed Effect Transistor). At this time, as typical ones of various single transistors, there can be illustrated a power MOSFET and an IGBT (Insulated Gate Bipolar Transistor). These are classified into power semiconductor devices solely. A bipolar transistor, a thyristor, a power diode and the like are included therein in addition to the power MOSFET and the IGBT.

As a typical form of the power MOSFET, there is known a double diffused vertical power MOSFET in which a source electrode is provided at the surface and a drain electrode is provided at the back surface. The double diffused vertical power MOSFET can principally be classified into two types: The first type is a planar gate type principally described in embodiments and the second type is a trench gate type such as a U-MOSFET or the like.

As the power MOSFET, an LD-MOSFET (Lateral-Diffused MOSFET) is known in addition to the above.

2. Similarly, even if the materials, composition and the like are referred to like "A to X" and the like in the description of embodiments and the like, elements other than A are included therein as ones of principal components unless shown explicitly not to be so in particular and unless obviously they are not so from the context. If, for example, the component is referred to, it shows the meaning of "X containing A as a principal component". Even if, for example, "silicon member" or the like is referred to, it is not limited to pure silicon. It is needless to say that it also includes a SiGe alloy, a multi-component alloy containing other silicon as a principal component and a member containing other additives or the like. Likewise, even though a "silicon oxide film", a "silicon oxide-based insulting film" and the like are referred to, it is needless to say that they include not only relatively pure undoped silicon dioxide but also a thermal oxide film such as FSG (Fluorosilicate Glass), TEOS-based silicon oxide, SiOC (Silicon Oxicarbide) or Carbon-doped Silicon oxide or OSG (Organosilicate glass), PSG (Phosphorus Silicate Glass), BPSG (Borophosphosilicate Glass) or the like, a CVD oxide film, SOG (Spin ON Glass), coat-based silicon oxide such as Nano-Clustering Silica (NCS), a silica-based Low-k insulating film (porous insulating film) with pores introduced in a member similar to these, and a complex film with another silicon-based insulating film with these taken as principal components.

Alongside of the silicon oxide-based insulating film, a silicon nitride-based insulating film is known as a silicon-based insulating film commonly used in the semiconductor field. As materials that belong to this system, there may be mentioned SiN, SiCN, SiNH, SiCNH, etc. When "silicon nitride" is referred to here, it includes both of SiN and SiNH unless shown explicitly not to be so in particular. Likewise, when "SiCN" is referred to, it includes both SiCN and SiCNH unless shown explicitly not to be so in particular.

3. Similarly, although graphics, positions, attributes and the like are suitably illustrated, it is needless to say that they are not limited to such illustrations strictly unless shown explicitly not to be so in particular and unless obviously they are not so from the context.

4. Further, even when reference is made to a specific numerical value and numerical quantity, a numerical value exceeding the specific numerical value may be taken and a numerical value less than the specific numerical value may be taken, unless shown explicitly not to be so in particular, unless limited to the number theoretically and unless obviously they are not so from the context.

5. When reference is made to the term "wafer", it normally indicates a monocrystalline silicon wafer over which a semiconductor device (semiconductor integrated circuit device and electronic device being also the same) are formed. It is however needless to say that the wafer includes an epitaxial wafer, a complex wafer comprised of an insulated board such as an SOI substrate, an LCD glass substrate or the like, and a semiconductor layer or the like, etc.

6. In a manner similar to the case where the power MOSFET has been explained previously, IGBT in general is roughly divided into a Planar Gate type and a Trench Gate type. While the trench gate type IGBT is relatively low in on resistance, an "IE-type trench gate IGBT" (or "active cell thinned-out type trench gate IGBT") using IE (Injection Enhancement) effects has been developed therefor in order to further promote conductivity modulation and thereby further reduce the on resistance. The IE-type trench gate IGBT is configured as a structure in which active cells each coupled to an emitter electrode and inactive cells each having a floating P body region are actually arranged alternately or in comb-teeth form to thereby facilitate the accumulation of holes (positive holes) on the device main surface side (emitter side) of a semiconductor substrate.

7. In the present application, of the IE-type trench gate IGBTs, one in which the width of a principal active cell is narrower than that of a principal inactive cell is referred to as a "narrow active cell IE-type trench gate IGBT".

The direction to cut across a trench gate is assumed to be a "cell width direction". The direction (longitudinal direction) orthogonal to this direction, in which a trench gate (linear gate portion) extends, is assumed to be a "cell length direction".

In the present application, "linear unit cell areas" (each comprised principally of a linear active cell area and linear inactive cell areas) are principally handled. On the other hand, the linear unit cell areas are periodically repeated and arranged in an internal area of a semiconductor chip to thereby configure a "cell area". A cell peripheral junction area is normally provided around the cell area. Further, a floating field ring or a field limiting ring or the like is provided therearound to configure a termination structure. Here, the floating field ring or the field limiting ring indicates impurity regions or an impurity region group which is provided in the surface (device surface) of a drift region separately from a P type body region (P type well region) and has the same conductivity type as the P type well region, and which has similar concentrations (concentration corresponding to the degree free of full depletion when a backward voltage is applied to a main junction), and surrounds the cell area in single form or multi form in a ring fashion.

These floating field rings may be provided with a field plate. The field plate indicates a portion which is a conductor film pattern coupled to the floating field ring and which extends upwardly of the surface (device surface) of the drift region through an insulating film and surrounds the cell areas in ring form.

It is rational that each linear unit cell area used as a periodic element that configures the cell area is handled as a set in which half-width linear inactive cell areas are placed on both sides with the linear active cell area as the center. However, when the linear inactive cell areas are concretely explained in individual form, inconvenience occurs because they are separated from each other on both sides. Therefore, in such a case, a concrete integral portion is called the "linear inactive cell area".

[Further Detailed Description of the Embodiments]

Embodiments will be explained in further detail. In the respective drawings, the same or similar components will be indicated by the same or similar symbols or reference numerals, and description thereof will not be repeated in principle.

When the accompanying drawings become cumbersome on the contrary or distinction from voids is clear, hatching or the like may be omitted even in the case of sections. Even in the case of holes closed on a plane basis as apparent from description and the like in relation to this, the outline of a background may be omitted. Further, although not in the case of the sections, hatching may be provided to manifest that they are not voids.

Incidentally, as a patent application that has disclosed an IE-type IGBT developed by the inventors et al of the present application, there has been known, for example, Japanese Patent Application No. 2012-577 (Japanese Application Date: Jan. 5, 2012).

1. Description of Outlines of Major Embodiments of the Present Application (Refer Principally to FIGS. 1 through 5):

In this section, concrete examples will be shown to complement the previous definitions and the like. Further, typical concrete examples of the present application will be extracted to explain their outlines, and their whole preliminary description will be made.

Figure 2:
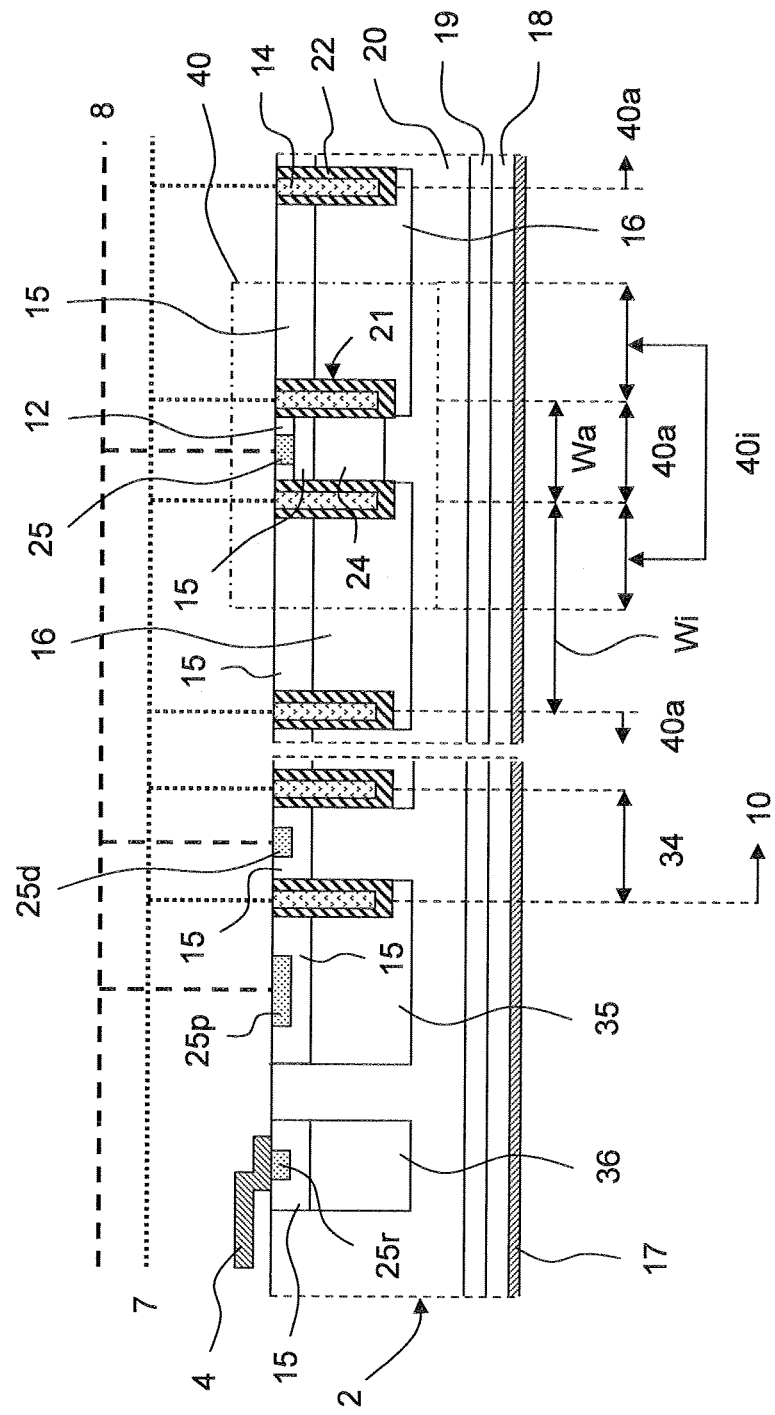
FIG. 2 is a device typical sectional view corresponding to a section taken along A-A' of a cell area end cutout region R1 of FIG. 1.
Figure 3:
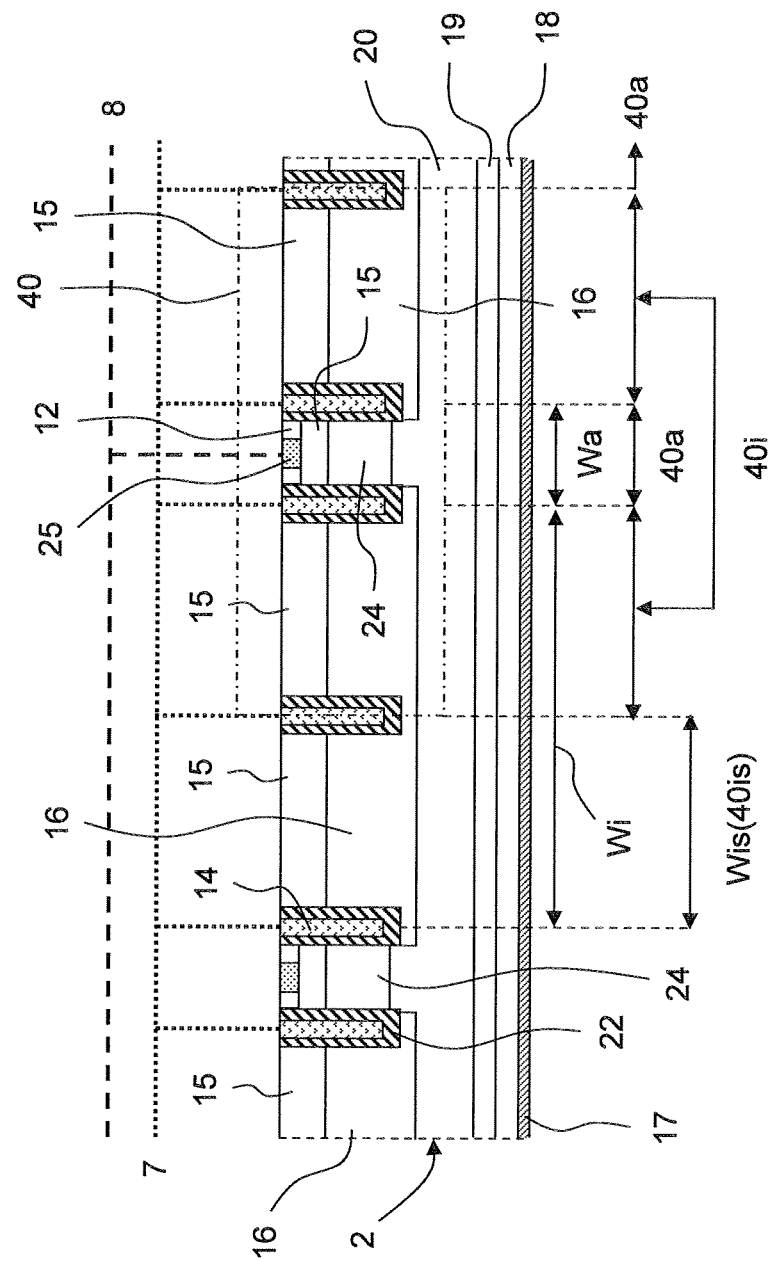
FIG. 3 is a device typical sectional view corresponding to a section taken along line B-B' of a cell area internal cutout region R2 of FIG. 1.
Figure 4:
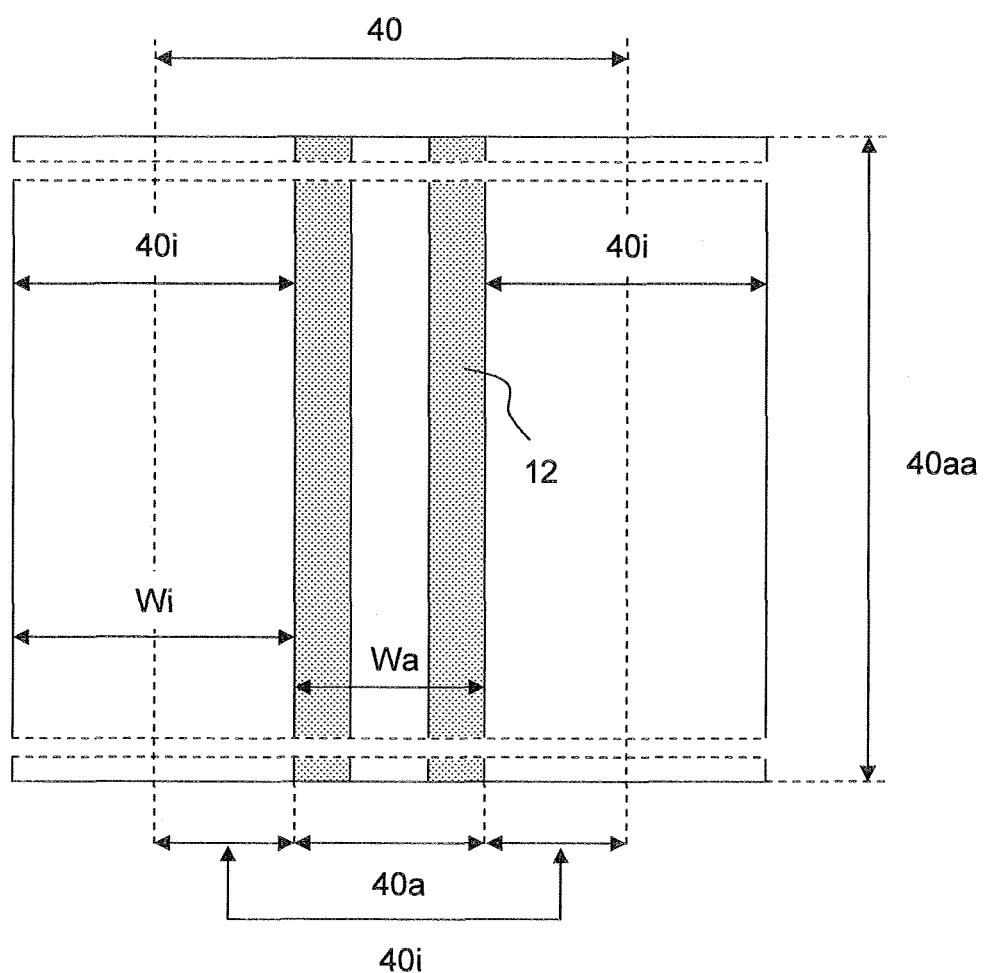
FIG. 4 is an enlarged top view of a linear unit cell area of FIG. 1 and its peripheral R5 related to a first embodiment (one-dimensional active cell thinned-out structure: corresponding to FIGS. 6 to 8) of the present application.
Figure 5:
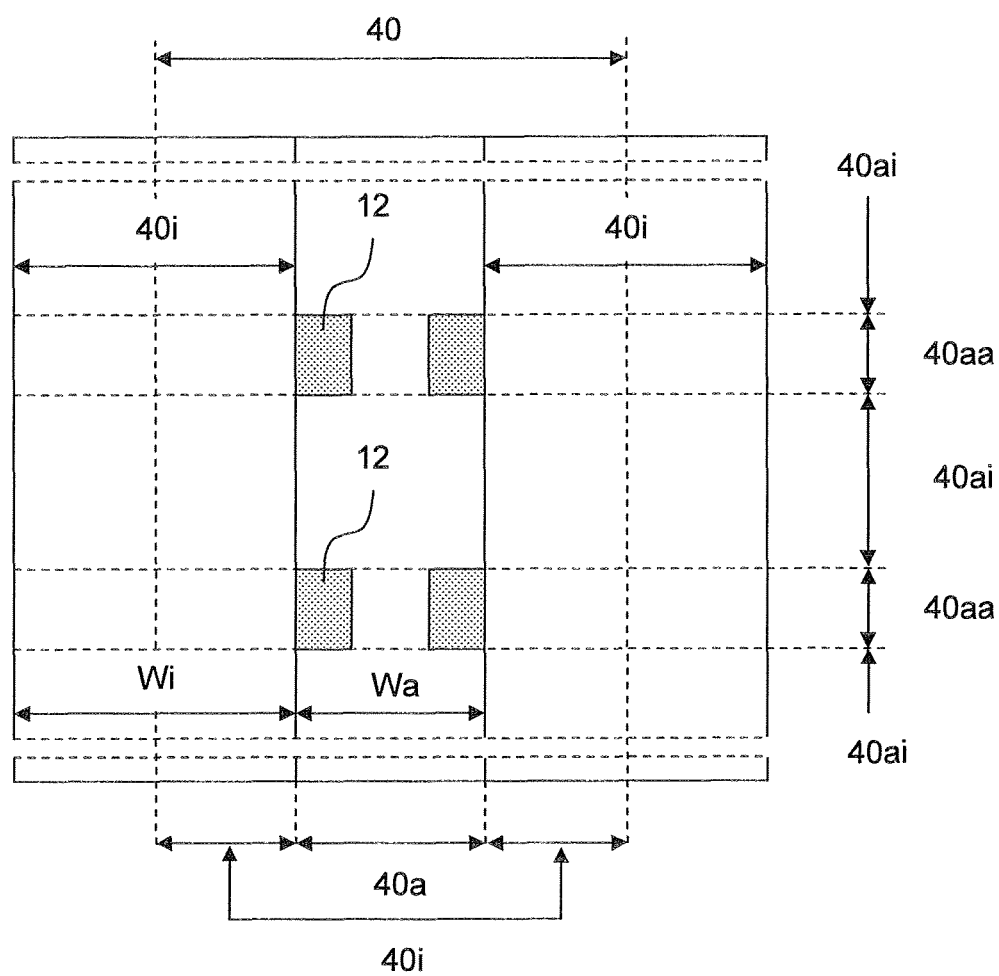
FIG. 5 is an enlarged top view of a linear unit cell area of FIG. 1 and its peripheral R5 related to a fifth embodiment (two-dimensional active cell thinned-out structure: corresponding to FIGS. 30 through 32) of the present application.

FIG. 1 is a top face typical layout diagram of a cell area of an IE-type trench gate IGBT device chip for describing the outline of a major embodiment of the present application and its periphery. FIG. 2 is a device typical sectional view corresponding to a section taken along A-A' of a cell area end cutout region R1 of FIG. 1. FIG. 3 is a device typical sectional view corresponding to a section taken along line B-B' of a cell area internal cutout region R2 of FIG. 1. FIG. 4 is an enlarged top view of a linear unit cell area of FIG. 1 and its peripheral R5 related to a first embodiment (one-dimensional active cell thinned-out structure: corresponding to FIGS. 6 to 8) of the present application. FIG. 5 is an enlarged top view of a linear unit cell area of FIG. 1 and its peripheral R5 related to a fifth embodiment (two-dimensional active cell thinned-out structure: corresponding to FIGS. 30 through 32) of the present application. The outlines of the major embodiments of the present application will be explained based on these.

(1) Description of Planar Structure of Cell Area and its Periphery (Refer Principally to FIG. 1):

A top view of an internal area (inner portion of a guard ring or the like corresponding to an outermost portion of a termination structure, i.e., a major part of the chip 2) of a device chip 2 for an IE-type trench gate IGBT that is of a main target of the present application is first shown in FIG. 1. As shown in FIG. 1, the major part of the internal area of the chip 2 (semiconductor substrate) is occupied by a cell area 10. In the cell area 10, a P type cell peripheral junction area 35 (second conductivity-type cell peripheral junction area) that takes on a ring shape is provided at its outer peripheral portion so as to surround the cell area 10. A P type floating field ring 36 (i.e., field limiting ring) that takes on single or plural ring shapes at intervals is provided outside the cell peripheral junction area 35. The P type floating field ring 36 configures the termination structure for the cell area 10 together with the cell peripheral junction area 35, guard ring 4 (refer to FIG. 6), etc.

In the present embodiment, a number of linear unit cell areas 40 are laid out in the cell area 10. A pair or more pairs (one row or a few rows or so at the mention of one side) of dummy cell areas 34 (liner dummy cell areas) are disposed in these end areas.

(2) Description of Narrow Active Cell Type Unit Cell and Alternate Arrangement System (Refer Principally to FIG. 2):

Next, a section taken along line A-A' of the cell area end cutout region R1 of FIG. 1 is shown in FIG. 2. As shown in FIG. 2, a P+ type collector region 18 is provided in a semiconductor region (silicon monocrystal region in the present embodiment) of a back surface 1b (main surface or second main surface on the back side of the semiconductor substrate) of the chip 2. A metal collector electrode 17 is provided at the surface of the chip 2. An N type field stop region 19 (first conductivity type field stop region) is provided between an N- type drift region 20 (first conductivity type drift region) and the P+ type collector region 18 (second conductivity type collector region) that configure a major portion of the semiconductor substrate 2.

On the other hand, a number of trenches 21 are provided in a semiconductor region on the surface side 1a of the N- type drift region 20 (main surface or first main surface of the front side of the semiconductor substrate). Each of trench gate electrodes 14 is embedded in each trench 21 through a gate insulating film 22. These trench gate electrodes 14 are coupled to a metal gage electrode 5.

These trenches 21 serve to compart or lay out respective regions. For example, a dummy cell area 34 is sectioned from both sides by the pair of trenches 21. The cell area 10 and the cell peripheral junction area 35 are sectioned by one of the pair of trenches 21. The cell peripheral junction area 35 is coupled to a metal emitter electrode 8 through a P+ type body contact region 25p. Incidentally, unless otherwise noted in the present application, the thickness of the gate insulating film 22 at any trenches is also assumed to be almost identical (it is however not excluded that the thickness of a given portion is made different from other portions as compared with other portions if necessary). Making emitter contact between the cell peripheral junction area 35 and the dummy cell area 34 enables prevention of a reduction in breakdown voltage even where the width of the dummy cell area 34 or the like changes on a process basis.

A P type floating field ring 36 is provided in the semiconductor region on the surface side 1a of the N− type drift region 20 located outside the cell peripheral junction area 35. A field plate 4 is provided over the surface 1a and coupled to the floating field ring 36 through a P+ type body contact region 25r.

Next, the cell area 10 will further be described. The dummy cell area 34 is basically identical to a linear active cell area 40a in both structure and size except that an N+ type emitter region 12 is not provided. A P+ type body contact region 25d provided in the surface of a P type body region 15 is coupled to the metal emitter electrode 8. Most of internal regions in the cell area 10 take repeated structures (incidentally, targetability in the strict sense is not required, and this is the same subsequently) in which the linear unit cell area 40 is directed to a translational target as a unit cell. The linear unit cell area 40 taken as the unit cell is comprised of a linear active cell area 40a and half-width linear inactive cell areas 40i provided on both sides thereof. Described specifically however, a full-width linear inactive cell area 40i can be considered to be disposed between the adjacent linear active cell areas 40a (refer to FIG. 4).

A P type body region 15 is provided in the semiconductor surface region on the front main surface 1a (first main surface) side of the semiconductor substrate in the linear active cell area 40a. An N+ type emitter region 12 (first conductivity type emitter region) and a P+ type body contact region 25 are provided in the surface of the P type body region 15. The P+ type body contact region 25 is coupled to the metal emitter electrode 8. In the linear active cell area 40a, an N type hole barrier region 24 is provided in the N− type drift region 20 located below the P type body region 15.

On the other hand, a P type body regions 15 is likewise provided in the semiconductor surface region on the front main surface 1a (first main surface) side of the semiconductor substrate in the linear inactive cell area 40i. A P type floating region 16 (second conductivity type floating region) deeper than the trenches 21 lying on both sides, which cover their lower ends, is provided in the N− type drift region 20 located below the P type body region 15. Providing such a P type floating region 16 makes it possible to broaden the width Wi of the linear inactive cell area without causing a sharp reduction in breakdown voltage. It is thus possible to effectively enhance hole storage effects. Incidentally, in the IE-type trench gate IGBT, no contact is formed from the emitter electrode 8 to the P type floating region 16, and a direct hole discharge path or passage from the P type floating region 16 to the emitter electrode 8 is shut off to thereby increase the hole concentration of the N− type drift region 20 (N base region) located below the linear active cell area 40a. As a result, the concentration of electrons injected from each MOSFET in the IGBT to the N base region is increased to thereby reduce an on resistance.

In the present embodiment, the width Wa of the linear active cell area 40a is set narrower than the width Wi of the linear inactive cell area 40i. In the present application, this is referred to as a "narrow active cell type unit cell". A device having the narrow active cell type unit cell will principally be described concretely below. The invention of the present application is however not limited to it. It is needless to say that the present invention can be applied even to a device having a "non-narrow active cell type unit cell".

In the example of FIG. 2, the linear active cell areas 40a and the linear inactive cell areas 40i are alternately arranged to configure the linear unit cell area 40. On the other hand, this configuration is referred to as an "alternate arrangement system". Unless otherwise noted in particular (concretely except for FIG. 3 basically), a description will be made below as being predicated on the alternate arrangement system. It is needless to say that a "non-alternate arrangement system" may be adopted.

The major portion that illustratively contains the respective parts of the various embodiments of the present application has been explained in FIG. 2. In the following description, however, they will be described with being divided into a cell portion (section and planar structure) and components such as a cell peripheral portion, etc. They are however not those that fall to pieces. As shown in FIG. 2, the various modified examples are replaced with the respective components, which in turn configure the main portion. This is not limited to FIG. 2 but can be applied even to the next FIG. 3.

(3) Description of Non-Alternate Arrangement System (Refer Principally to FIG. 3):

A concrete example of a linear unit cell area 40 of a non-alternate arrangement system is next shown in FIG. 3. As shown in FIG. 3, although there is shown in the example of FIG. 2, one linear inactive cell area 40i inserted between the adjacent linear active cell areas 40a, a plurality of linear inactive subcell areas 40is (device elements each corresponding to the linear inactive cell area 40i of FIG. 2) inserted between adjacent linear active cell areas 40a are shown in the example of FIG. 3. Even in the example of the non-alternate arrangement system, principally, the width Wa of the linear active cell area 40a is set narrower than the width Wis of the linear inactive subcell area 40is. In a manner similar to the above, this is referred to as a "narrow active cell type unit cell" in the present application. That is, the definition of the narrow active cell type unit cell is performed by the width Wis of the linear inactive subcell area 40is other than the width Wi of the linear inactive cell area 40i. Incidentally, the number (hereinafter called "insertion number") of the linear inactive subcell areas 40is inserted between the linear active cell areas 40a needs not to be constant but may be changed in a range from a single piece to a few pieces depending on the places.

In a manner similar to this, the insertion number may be set plural partly even in the alternate arrangement system. Incidentally, the merit of the alternate arrangement system is that since the number of trenches is low, the planar structure can relatively be simplified. On the other hand, the merit of the non-alternate arrangement system resides in that the width Wi of the linear inactive cell region wide relatively can be set without a reduction in breakdown voltage.

(4) Description of Active Cell One-Dimensional Thinned-Out Structure (Refer Principally to FIG. 4):

One example of a detailed planar structure of the linear unit cell region major portion and its peripheral cutout region R5 in FIG. 1 is shown in FIG. 4. As shown in FIG. 4, N+ type emitter regions 12 are provided over the lengthwise full area of the linear active cell area 40a. That is, the full area in the longitudinal direction of the linear active cell area 40a serves as an active section 40aa. Here, the active section 40aa is called a section in the longitudinal direction of the linear active cell area 40a provided with the N+ type emitter regions 12.

This structure is called an "active cell one-dimensional thinned-out structure" in the present application.

(5) Description of Active Cell Two-Dimensional Thinned-Out Structure (Refer Principally to FIG. 5):

One example of a detailed planar structure of the linear unit cell region major portion of FIG. 1 and its peripheral cutout region R5 is shown in FIG. 5. As shown in FIG. 5, for example, active sections 40aa each having a constant length are provided at predetermined intervals in the longitudinal direction of the linear active cell area 40a. An inactive section 40ai with no N+ type emitter regions 12 is formed between the active sections. That is, parts in the longitudinal direction of the linear active cell area 40a serve as the active sections 40aa on a local dispersion basis. Incidentally, here, the distribution thereof at predetermined intervals and in predetermined length means that they are periodical. The substantial periodic provision thereof however corresponds to a local dispersive distribution. The local dispersive distribution does not necessarily mean that they are set wider than in that case and periodic or quasi-periodic.

2. Description of Device Structure of IE-Type Trench Gate IGBT in the First Embodiment (P Type Deep Floating & Hole Barrier Structure) of the Present Application (Refer Principally to FIGS. 6 through 8):

In this section, a description will be made of one example (corresponding to FIGS. 1, 2 and 4 of the section 1) illustrative of a concrete chip top face layout and a unit cell structure (active one-dimensional thinned-out structure) common to the respective embodiments in the light of the description of the section 1. The cell structure described in this section is of a narrow active cell unit cell of an alternate arrangement system.

Incidentally, when an IGBT device 2 having a breakdown voltage of 600 volts is taken for example, a 3-mm to 6-mm square is average as a chip size. For convenience of explanation, a chip that is 4 mm in height and 5.2 mm in width will be explained herein by way of example. A description will be made herein with the breakdown voltage of the device as 600 volts or so.

Figure 6:
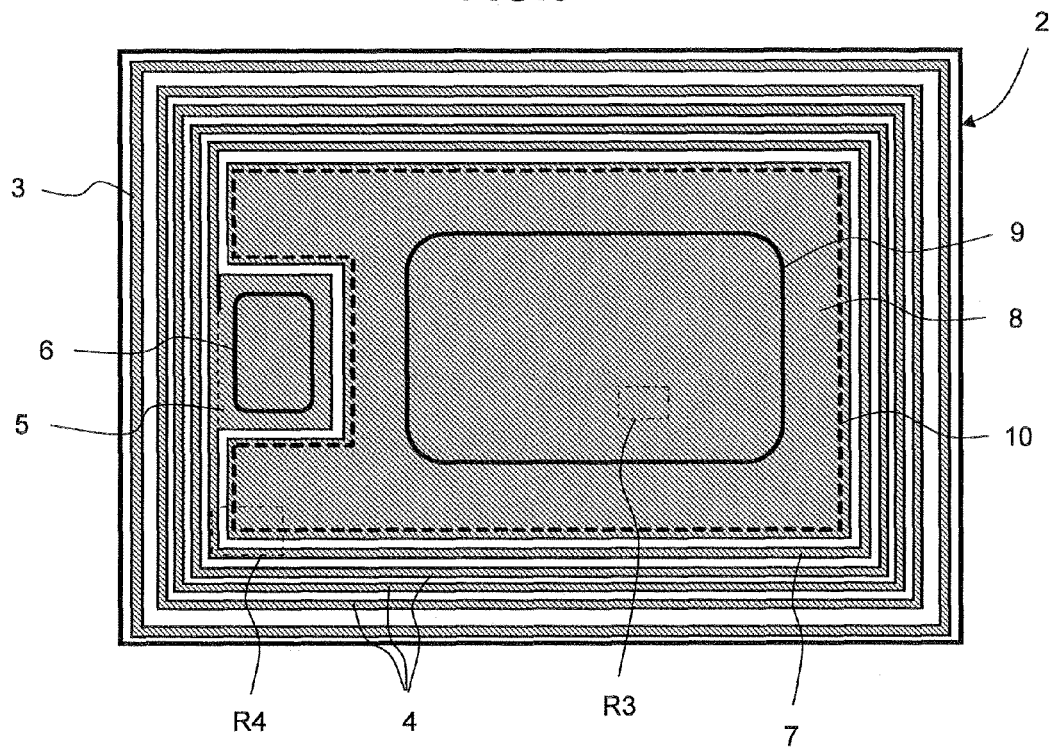
FIG. 6 is an overall top view (which approximately corresponds to FIG. 1 but near a more concrete form) of the IE-type trench gate IGBT device chip according to the first embodiment (common even to other embodiments) of the present application.
Figure 7:
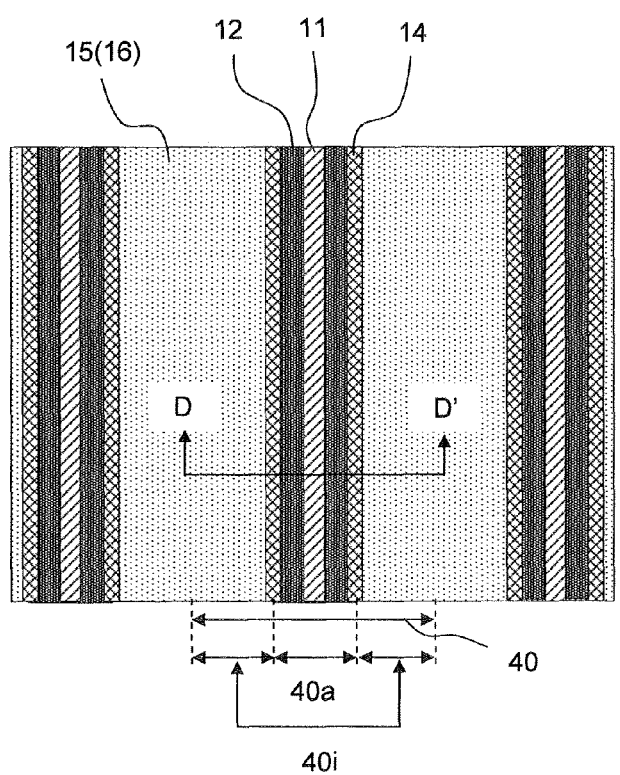
FIG. 7 is an enlarged top view (P-type deep floating & hole barrier linear unit cell structure) of a cell area internal cutout region R3 of FIG. 6.
Figure 8:
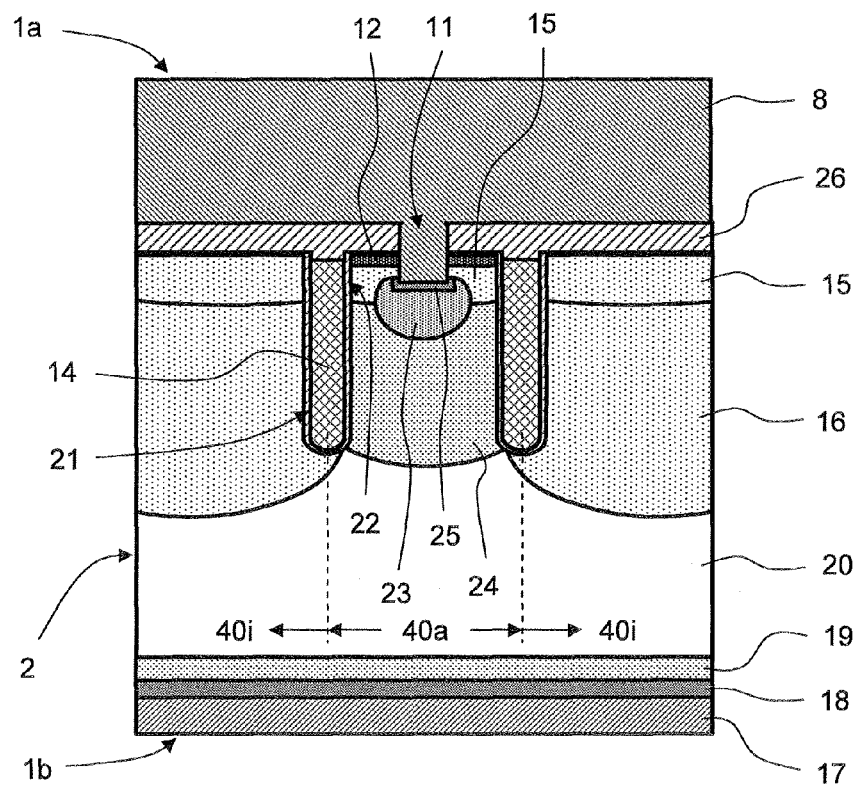
FIG. 8 is a device sectional view corresponding to a section taken along line D-D' of FIG. 7.

FIG. 6 is an overall top view (which approximately corresponds to FIG. 1 but is near a more concrete form) of the IE-type trench gate IGBT device chip according to the first embodiment (common even to other embodiments) of the present application. FIG. 7 is an enlarged top view (P-type deep floating & hole barrier linear unit cell structure) of a cell area internal cutout region R3 of FIG. 6. FIG. 8 is a device sectional view corresponding to a section taken along line D-D' of FIG. 7. The device structure of the IE-type trench gate IGBT according to the first embodiment (P type deep floating & hole barrier structure) of the present application will be explained based on these.

As shown in FIG. 6, an annular guard ring 3 comprised of, for example, an aluminum-based wiring layer or the like is provided at an outer peripheral portion of a top face 1a of the IGBT device chip 2. A few (single or plural) annular field plates 4 (comprised of, for example, the same aluminum-based wiring layer or the like as described above) coupled to an annular floating field ring or the like are provided inside the guard ring 3. A cell area 10 is provided inside the field plates 4 (floating field ring 36) and at a major portion of an internal area of the top face 1a of the chip 2. A metal emitter electrode 8 comprised of, for example, the same aluminum-based wiring layer or the like as described previously covers over the surface of the cell area 10 up to its external proximity. The central part of the metal emitter electrode 8 serves as a metal emitter pad 9 for coupling bonding wires and the like. A metal gate wiring 7 comprised of, for example, the same aluminum-based wiring layer or the like as described previously is disposed between the metal emitter electrode 8 and the field plate 4. The metal gate wiring 7 is coupled to a metal gate electrode 5 comprised of, for example, the same aluminum-based wiring layer or the like as described previously. The center part of the metal gate electrode 5 serves as a gate pad 6 for coupling bonding wires and the like.

Next, an enlarged top view of the cell area internal cutout region R3 of FIG. 6 is shown in FIG. 7. As shown in FIG. 7, the cell area 10 is comprised of linear active cell areas 40a and linear inactive areas 40i alternately disposed in the transverse direction. A trench gate electrode 14 is disposed between the linear active cell area 40a and the linear inactive cell area 40i. A linear contact groove 11 (or contact hole) is provided at the central part of the linear active cell area 40a. Linear N+ type emitter regions 12 are provided in the linear active cell areas 40a located on both sides of the contact groove 11. On the other hand, a P type body region 15 and a P type floating region 16 are provided vertically (refer to FIG. 2 or 8) approximately over its whole surface in each linear inactive cell area 40i.

Next, a section taken along line D-D' of FIG. 7 is shown in FIG. 8. As shown in FIG. 8, a P+ type collector region 18 and an N type field stop region 19 are formed in a semiconductor region of the back surface 1b of the semiconductor chip 2 so as to have vertical contact with each other. A metal collector electrode 17 is formed over the back surface 1b of the semiconductor chip 2.

An N type hole barrier region 24 (first conductivity type hole barrier region), the P type body region 15 and the N+ type emitter region 12 are provided in an N− type drift region 20 (semiconductor region on the surface side of the semiconductor substrate) on the surface 1a (first main surface) side of the semiconductor chip 2 in the linear active cell area 40a in order from below. An interlayer insulating film 26 is formed over the surface 1a of the semiconductor chip 2. A contact groove 11 (or contact hole) that extends to inside the semiconductor substrate is formed at the interlayer insulating film 26 portion in the linear active cell area 40a. A P+ type body contact region 25 and a P+ type latchup prevention region 23 are provided in the semiconductor region at the bottom of the contact groove 11 or the like. The P type body region 15 and the N+ type emitter region 12 are coupled to the metal emitter electrode 8 provided over the interlayer insulating film 26, via the contact groove 11 or the like.

Here, the N type hole barrier region 24 is a barrier region for preventing holes from entering a passage from the N− type drift region 20 to the N+ type emitter region 12. The N type hole barrier region 24 is lower than the N+ type emitter region 12 and higher than the N− type drift region 20 in impurity concentration. The existence of the N type hole barrier region 24 makes it possible to effectively prevent holes stored in each linear inactive cell area 40i from entering an emitter passage (passage extending from the N− type drift region 20 to the P+ type body contact region 25) of the linear active cell area 40a.

On the other hand, the P type floating region 16 and the P type body region 15 are provided in the N− type drift region 20 (semiconductor region on the surface side of the semiconductor substrate) on the surface 1a (first main surface) side of the semiconductor chip 2 in the linear inactive cell area 40i in order from below. The P type floating region 16 is deeper than the trench 21 in depth and distributed so as to cover the lower end of the trench 21.

Here, one example illustrative of principal dimensions of the respective parts of the device (refer to FIGS. 8 and 4) is shown to illustrate the device structure more specifically. That is, the width Wa of the linear active cell area is 2.3 micrometers or so, the width Wi of the linear inactive cell area is 6 micrometers or so (it is desired that the width Wa of the linear active cell area is narrower than the width Wi of the linear inactive cell area, and, for example, a range from 2 to 3 is particularly suitable for the value of Wi/Wa), a contact width is 0.5 micrometers or so, a trench width is 0.7 micrometers or so (0.8 micrometers or less is particularly suitable), a trench depth is 3 micrometers or so, the depth of the N+ type emitter region 12 is 250 nm or so, the depth of the P type body region 15 (channel region) is 0.8 micrometers or so, the depth of the P+ type latchup prevention region 23 is 1.4 micrometers or so, the depth of the P type floating region 16 is 4.5 micrometers or so, the thickness of the N type field stop region 19 is 1.5 micrometers or so, the thickness of the P+ type collector region is 0.5 micrometers or so, and the thickness of the semiconductor substrate 2 is 70 micrometers or so (there is shown here an example of a breakdown voltage of 600 volts or so). Incidentally, the thickness of the semiconductor substrate 2 strongly depends on a breakdown voltage to be determined. Thus, the thickness thereof is, for example, 120 micrometers or so at a breakdown voltage of 1200 volts. The thickness thereof is, for example, 40 micrometers or so at a breakdown voltage of 400 volts.

Incidentally, the dimensions of the corresponding parts are approximately identical to those shown herein even in the following examples and the example of the section 1, and their description will therefore not be repeated.

3. Description of Manufacturing Method Corresponding to the Device Structure According to the First Embodiment of the Present Application (Refer Principally to FIGS. 9 through 26):

This section shows one example of a manufacturing method corresponding to the device structure described in the section 2. A description will be made below centering on the cell area 10, but peripheral portions and the like will refer to FIGS. 1, 2, 4 and so on as needed.

Figure 9:
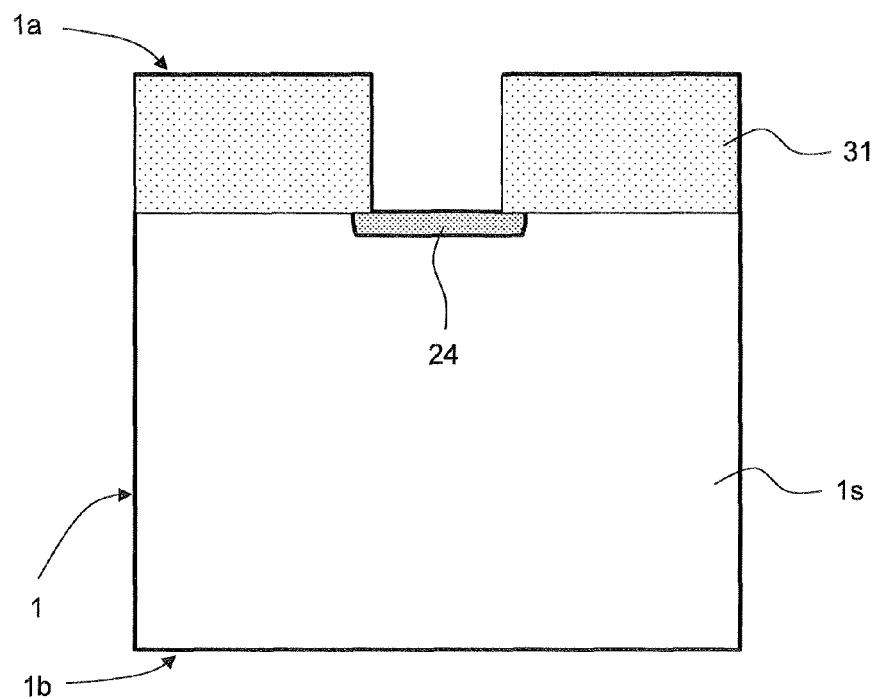
FIG. 9 is a device sectional view in a manufacturing process (hole barrier region introduction step) corresponding to FIG. 8 for describing a manufacturing method corresponding to a device structure of the first embodiment of the present application.
Figure 10:
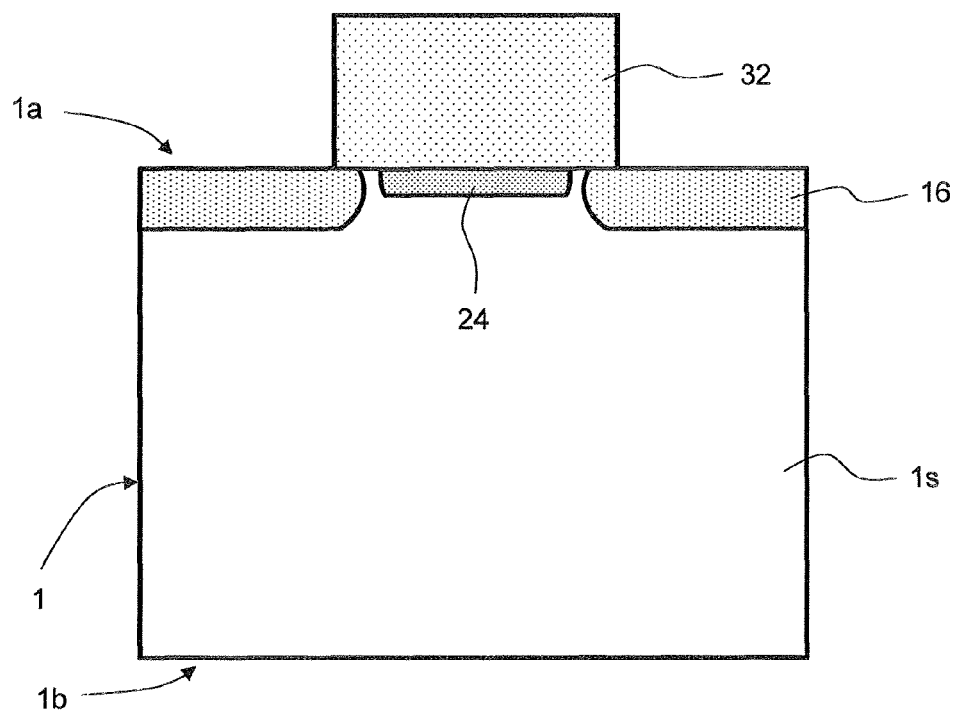
FIG. 10 is a device sectional view in the manufacturing process (P-type floating region introduction step) corresponding to FIG. 8 for describing the manufacturing method corresponding to the device structure of the first embodiment of the present application.
Figure 11:
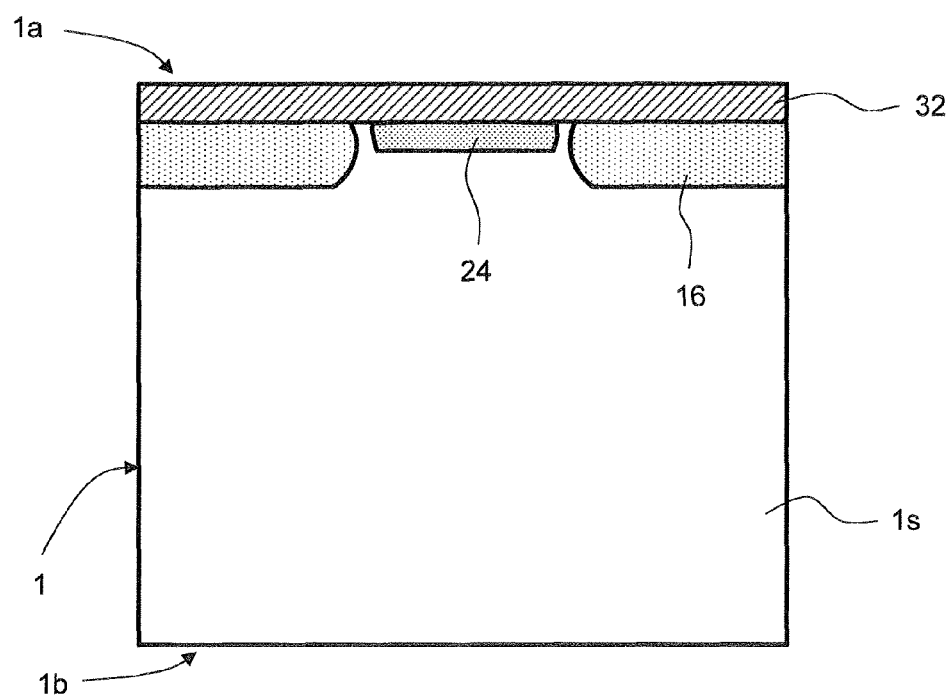
FIG. 11 is a device sectional view in the manufacturing process (trench processing hardmask deposition step) corresponding to FIG. 8 for describing the manufacturing method corresponding to the device structure of the first embodiment of the present application.
Figure 12:
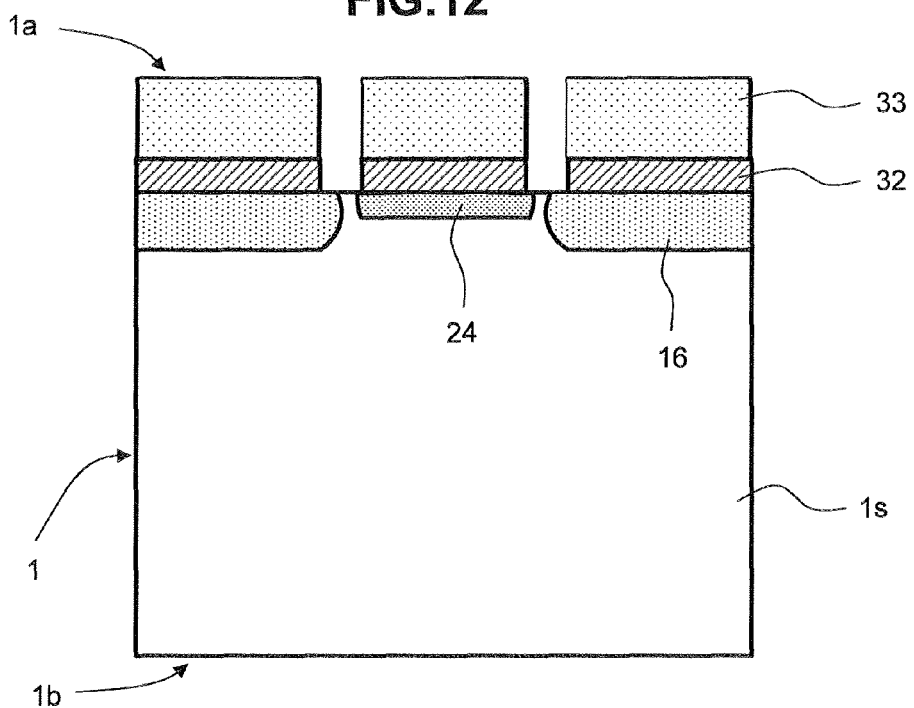
FIG. 12 is a device sectional view in the manufacturing process (trench hardmask processing step) corresponding to FIG. 8 for describing the manufacturing method corresponding to the device structure of the first embodiment of the present application.
Figure 13:
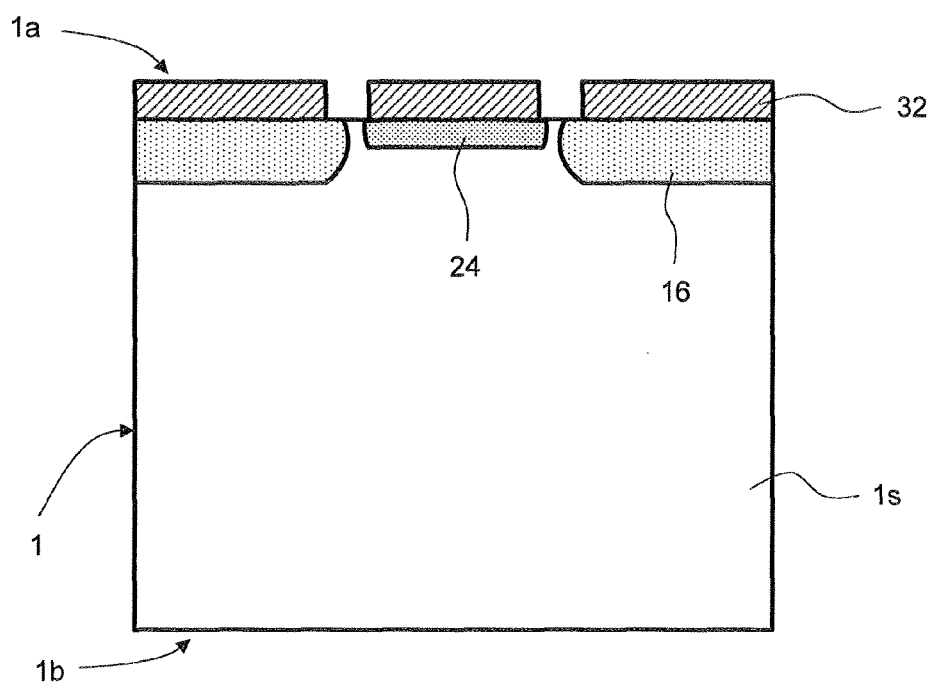
FIG. 13 is a device sectional view in the manufacturing process (trench hardmask processing resist removal step) corresponding to FIG. 8 for describing the manufacturing method corresponding to the device structure of the first embodiment of the present application.
Figure 14:
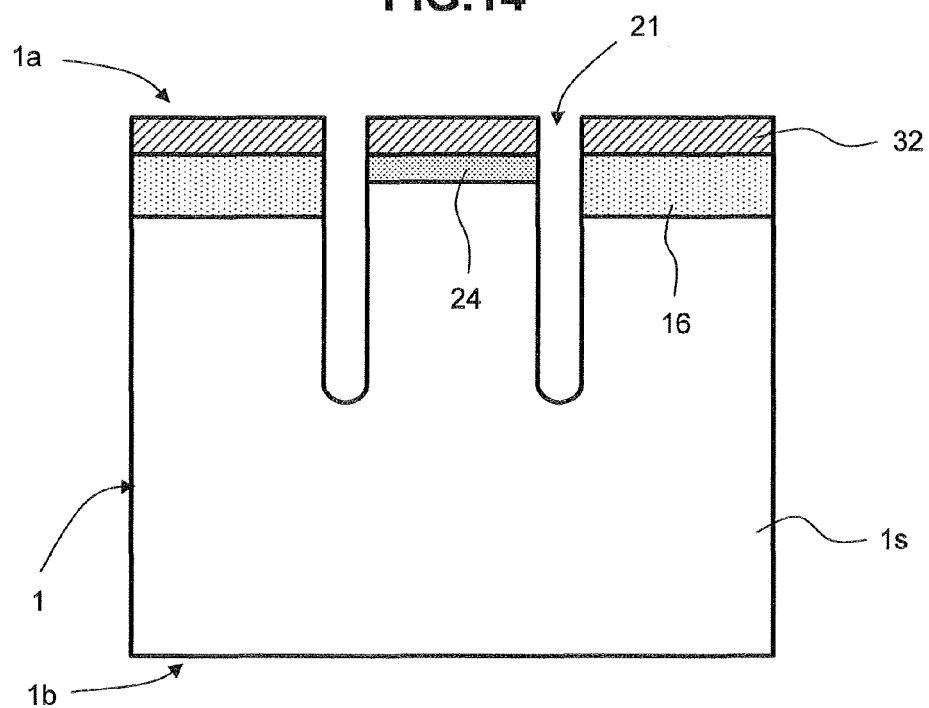
FIG. 14 is a device sectional view in the manufacturing process (trench processing step) corresponding to FIG. 8 for describing the manufacturing method corresponding to the device structure of the first embodiment of the present application.
Figure 15:
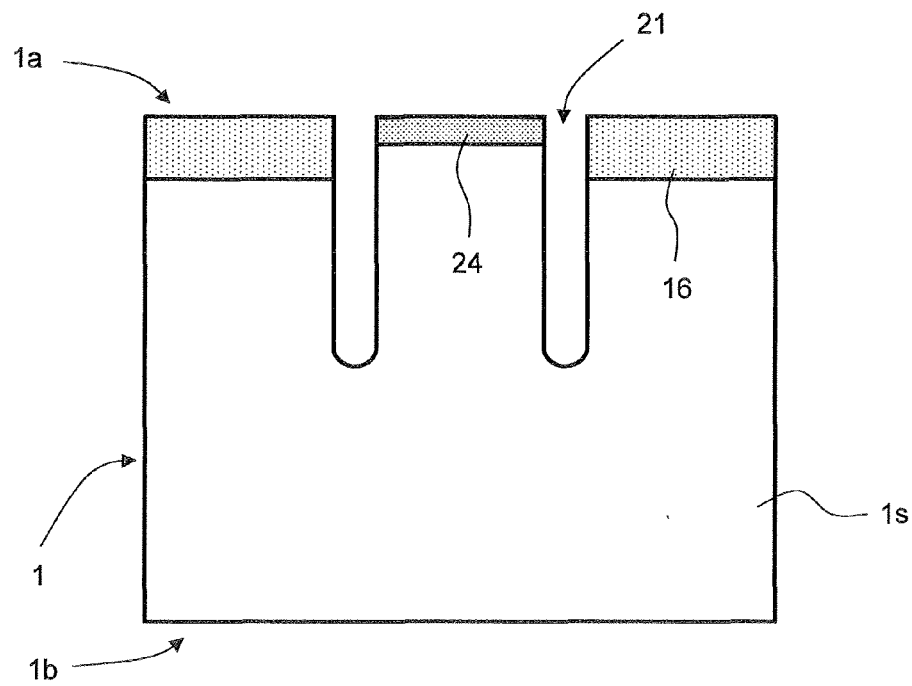
FIG. 15 is a device sectional view in the manufacturing process (trench processing hardmask removal step) corresponding to FIG. 8 for describing the manufacturing method corresponding to the device structure of the first embodiment of the present application.
Figure 16:
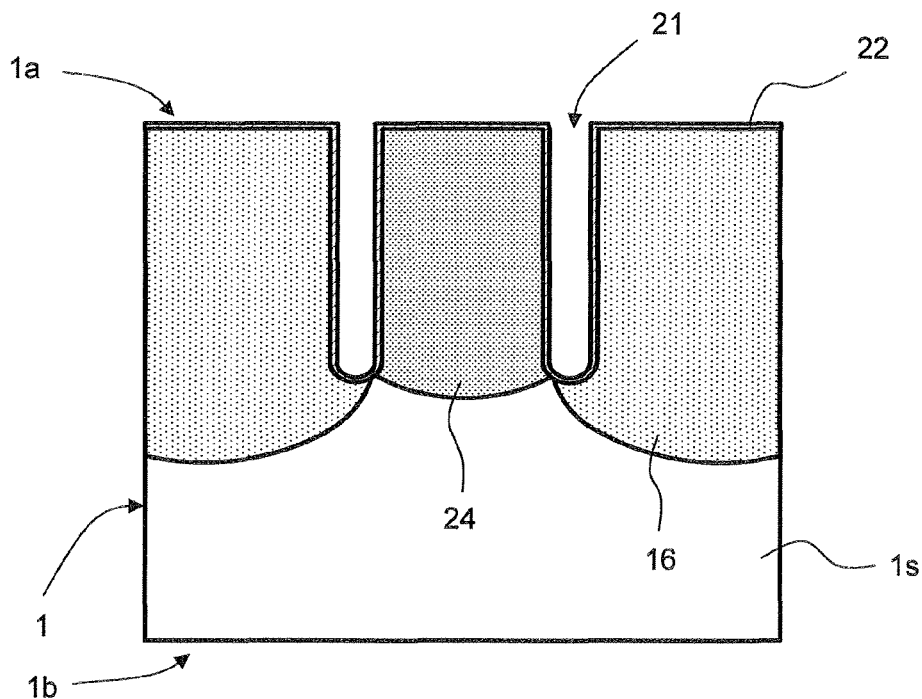
FIG. 16 is a device sectional view in the manufacturing process (extension diffusion and gate oxidizing step) corresponding to FIG. 8 for describing the manufacturing method corresponding to the device structure of the first embodiment of the present application.
Figure 17:
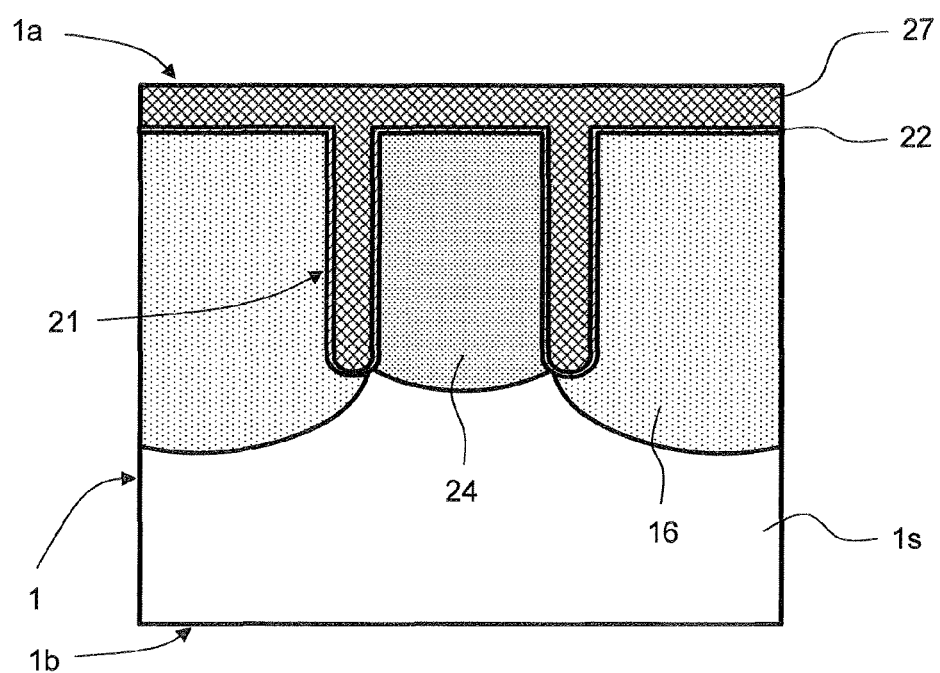
FIG. 17 is a device sectional view in the manufacturing process (gate polysilicon deposition step) corresponding to FIG. 8 for describing the manufacturing method corresponding to the device structure of the first embodiment of the present application.
Figure 18:
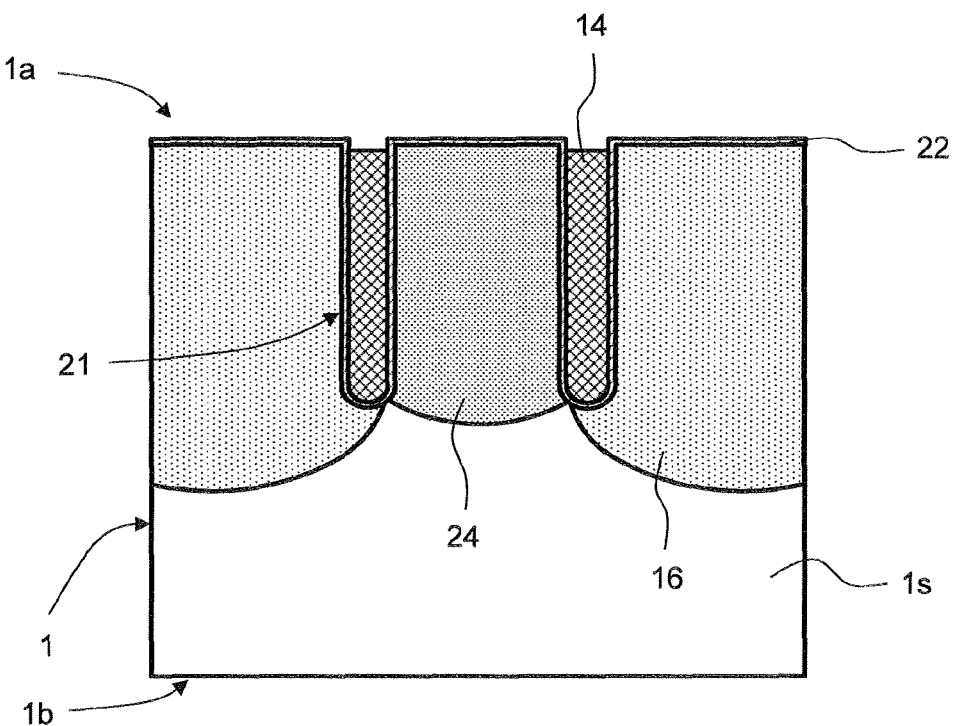
FIG. 18 is a device sectional view in the manufacturing process (gate polysilicon etchback step) corresponding to FIG. 8 for describing the manufacturing method corresponding to the device structure of the first embodiment of the present application.
Figure 19:
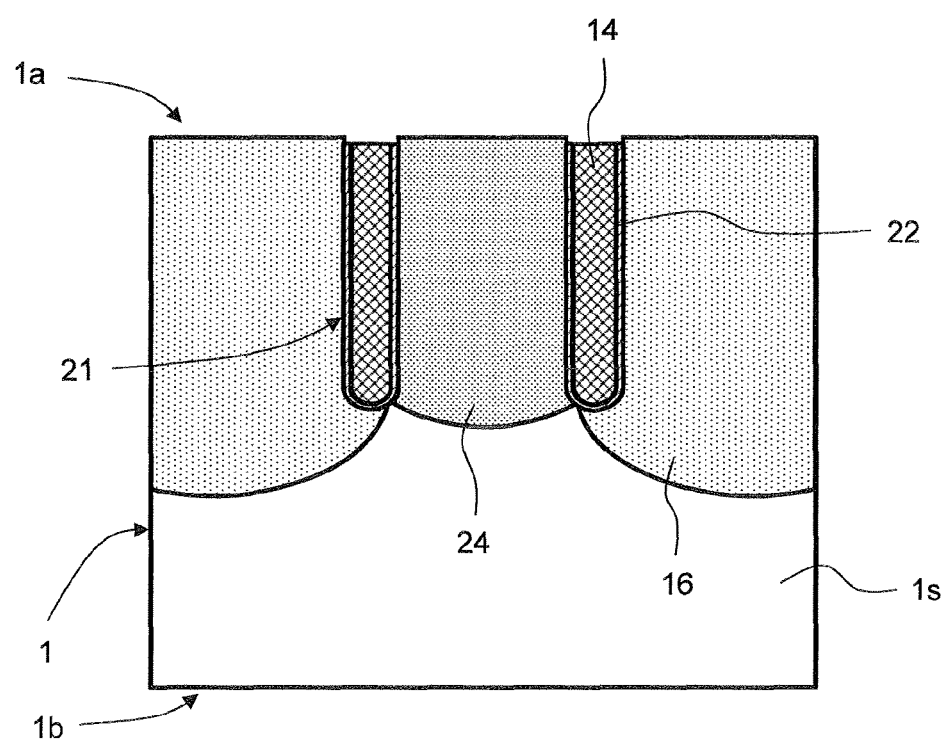
FIG. 19 is a device sectional view in the manufacturing process (gate oxide film etchback step) corresponding to FIG. 8 for describing the manufacturing method corresponding to the device structure of the first embodiment of the present application.
Figure 20:
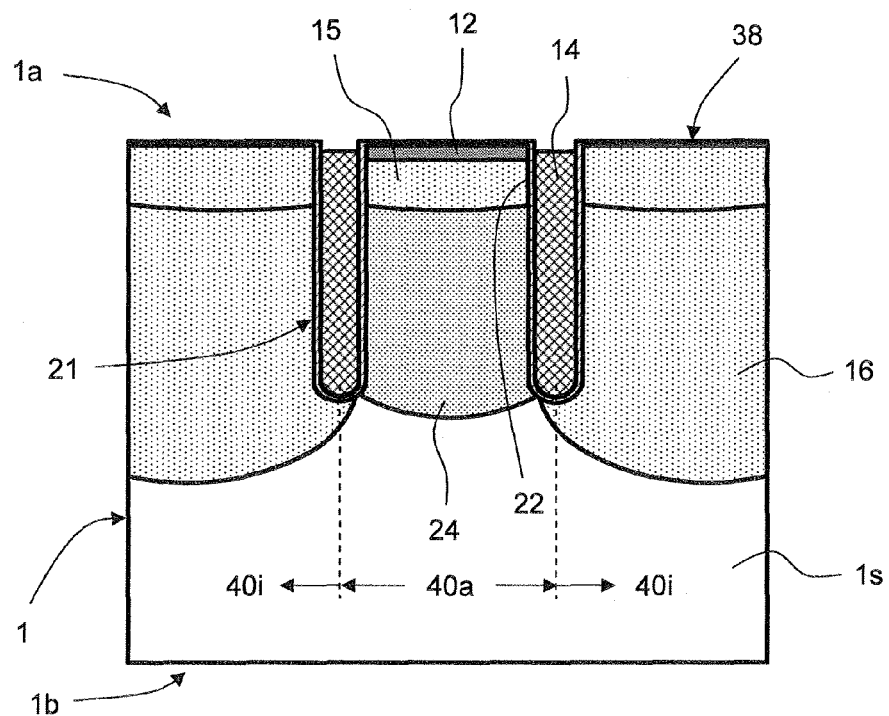
FIG. 20 is a device sectional view in the manufacturing process (P-type body region and N+ type emitter region introduction step) corresponding to FIG. 8 for describing the manufacturing method corresponding to the device structure of the first embodiment of the present application.
Figure 21:
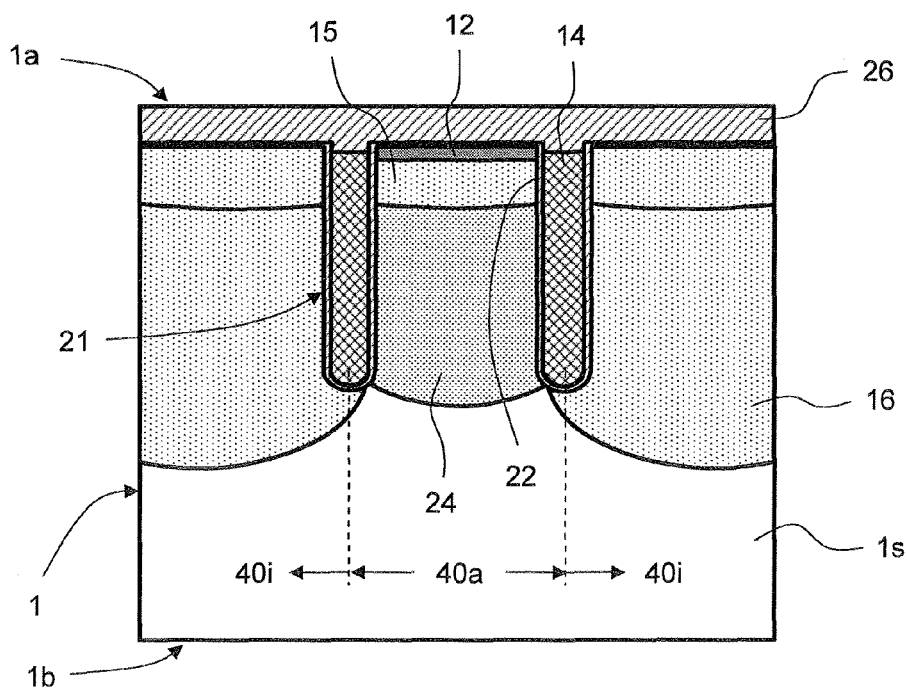
FIG. 21 is a device sectional view in the manufacturing process (interlayer insulating film deposition step) corresponding to FIG. 8 for describing the manufacturing method corresponding to the device structure of the first embodiment of the present application.
Figure 22:
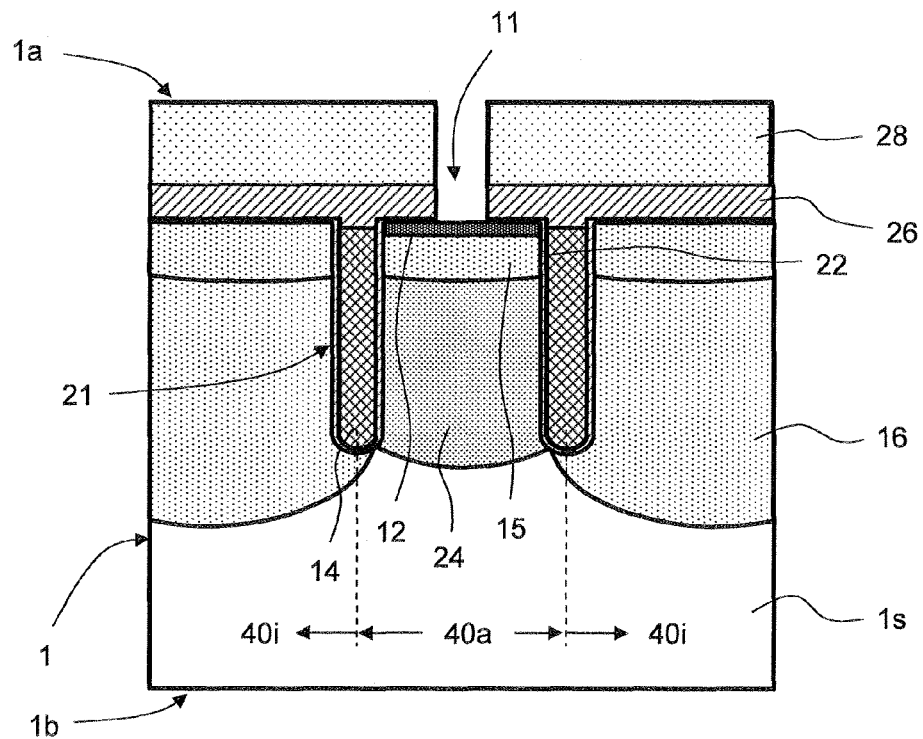
FIG. 22 is a device sectional view in the manufacturing process (contact hole formation step) corresponding to FIG. 8 for describing the manufacturing method corresponding to the device structure of the first embodiment of the present application.
Figure 23:
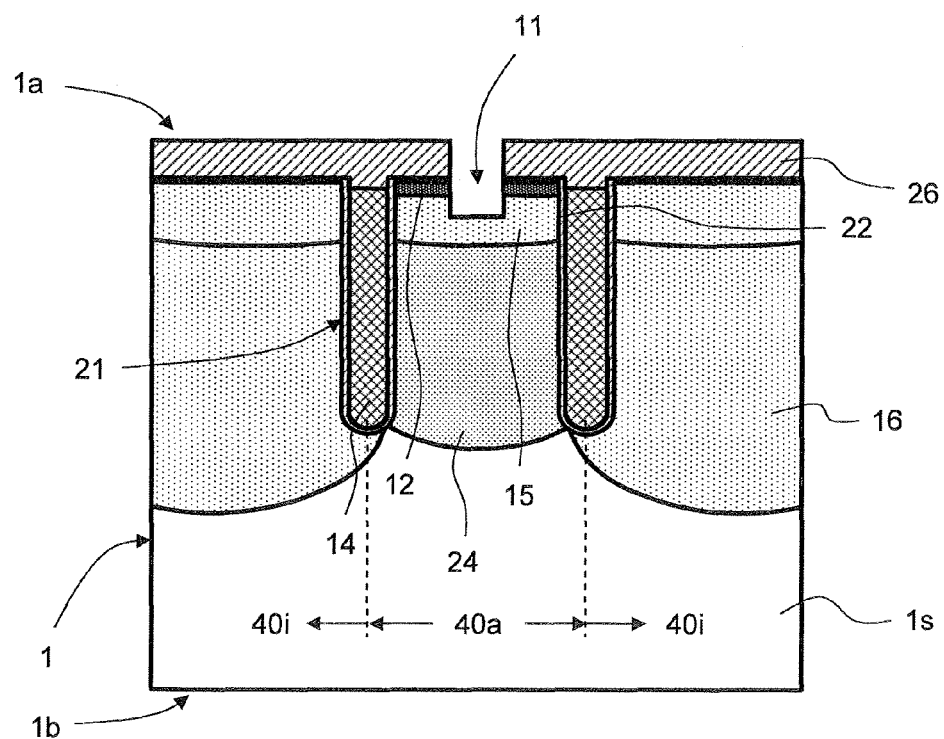
FIG. 23 is a device sectional view in the manufacturing process (substrate etching step) corresponding to FIG. 8 for describing the manufacturing method corresponding to the device structure of the first embodiment of the present application.
Figure 24:
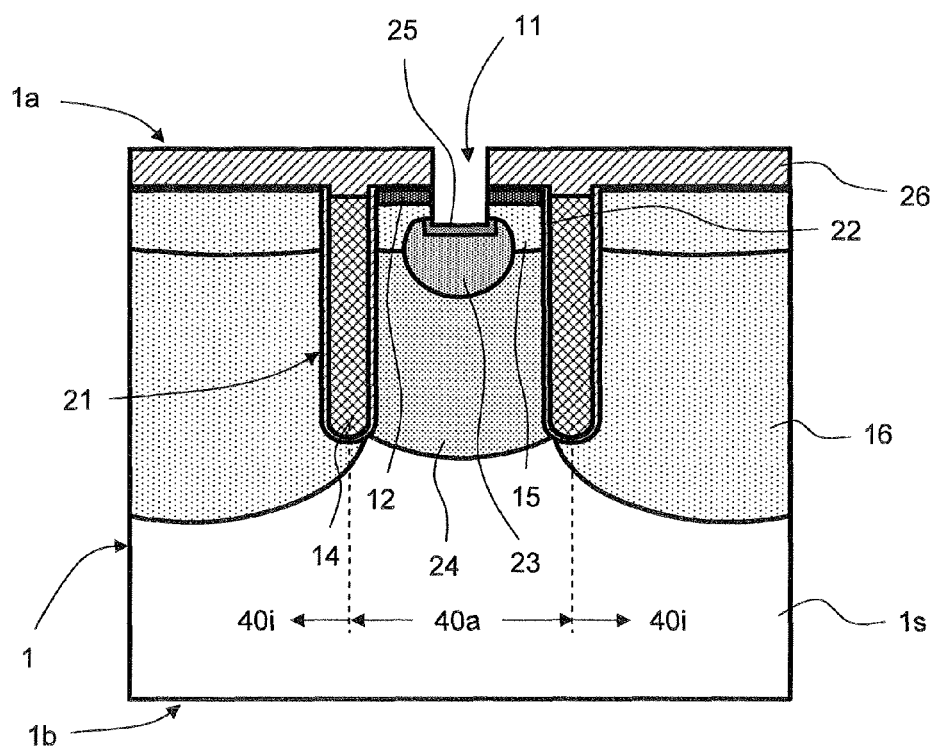
FIG. 24 is a device sectional view in the manufacturing process (P+ type body contact region and P+ type latchup prevention region introduction step) corresponding to FIG. 8 for describing the manufacturing method corresponding to the device structure of the first embodiment of the present application.
Figure 25:
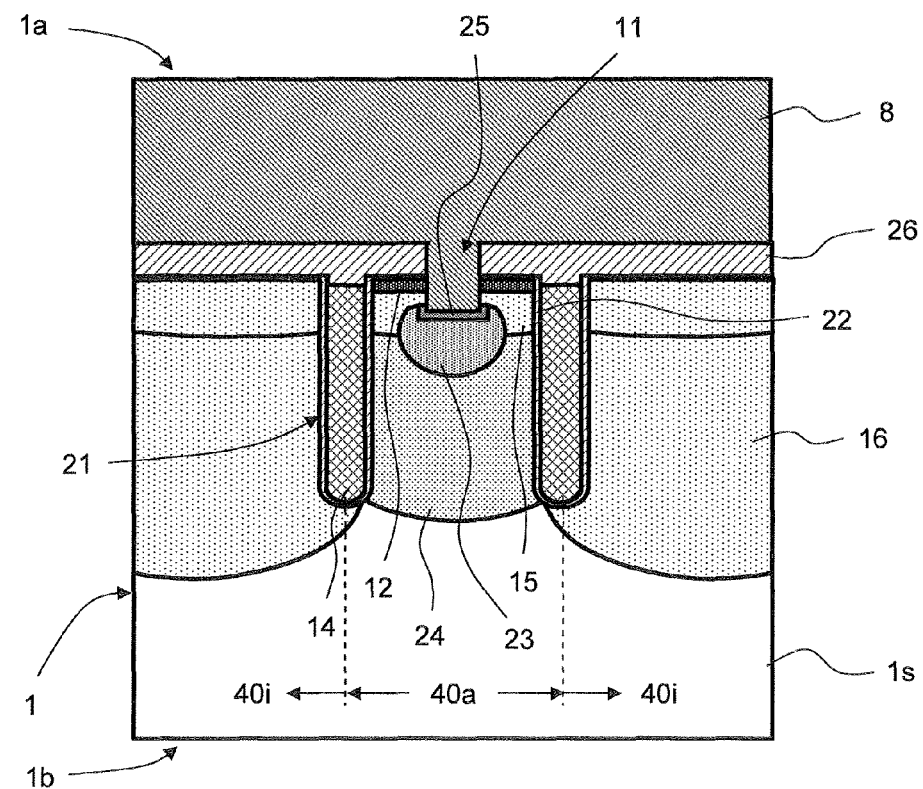
FIG. 25 is a device sectional view in the manufacturing process (surface metal deposition step) corresponding to FIG. 8 for describing the manufacturing method corresponding to the device structure of the first embodiment of the present application.
Figure 26:
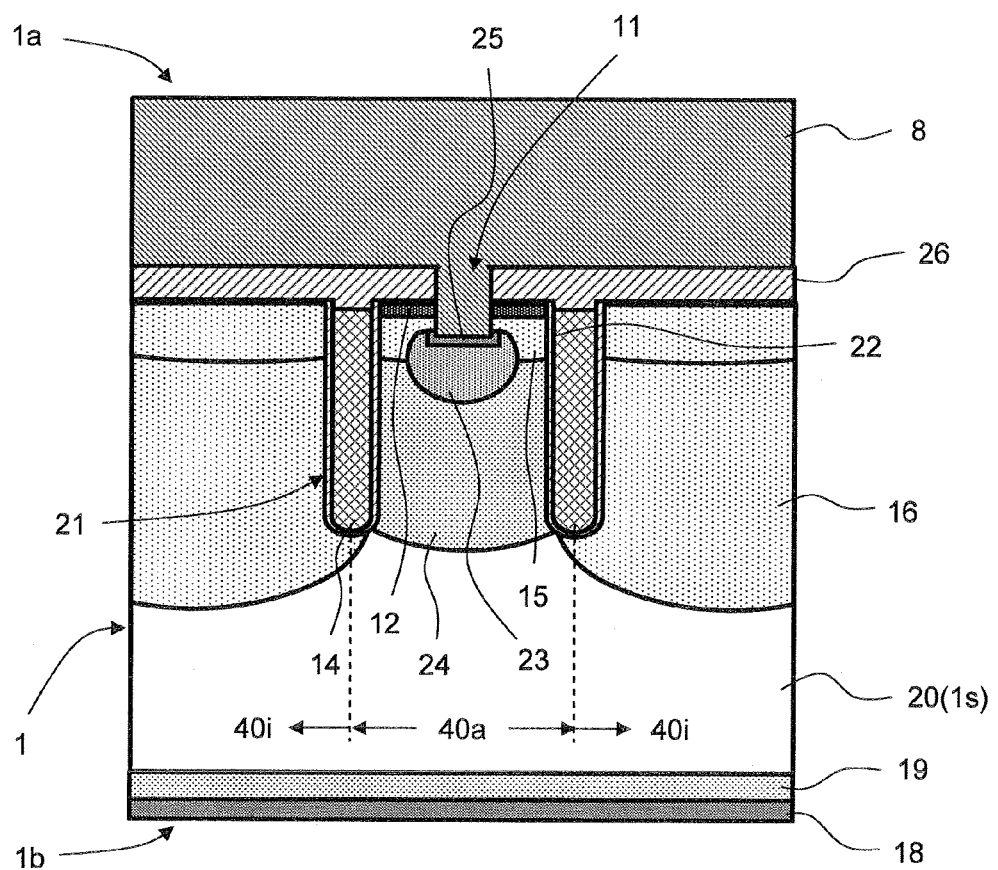
FIG. 26 is a device sectional view in the manufacturing process (backgrinding and back surface impurity introduction step) corresponding to FIG. 8 for describing the manufacturing method corresponding to the device structure of the first embodiment of the present application.

FIG. 9 is a device sectional view in a manufacturing process (hole barrier region introduction step) corresponding to FIG. 8 for describing the manufacturing method corresponding to the device structure of the first embodiment of the present application. FIG. 10 is a device sectional view in the manufacturing process (P-type floating region introduction step) corresponding to FIG. 8 for describing the manufacturing method corresponding to the device structure of the first embodiment of the present application. FIG. 11 is a device sectional view in the manufacturing process (trench processing hardmask deposition step) corresponding to FIG. 8 for describing the manufacturing process corresponding to the device structure of the first embodiment of the present application. FIG. 12 is a device sectional view in the manufacturing process (trench hardmask processing step) corresponding to FIG. 8 for describing the manufacturing method corresponding to the device structure of the first embodiment of the present application. FIG. 13 is a device sectional view in the manufacturing process (trench hardmask processing resist removal step) corresponding to FIG. 8 for describing the manufacturing method corresponding to the device structure of the first embodiment of the present application. FIG. 14 is a device sectional view in the manufacturing process (trench processing step) corresponding to FIG. 8 for describing the manufacturing method corresponding to the device structure of the first embodiment of the present application. FIG. 15 is a device sectional view in the manufacturing process (trench processing hardmask removal step) corresponding to FIG. 8 for describing the manufacturing method corresponding to the device structure of the first embodiment of the present application. FIG. 16 is a device sectional view in the manufacturing process (extension diffusion and gate oxidizing step) corresponding to FIG. 8 for describing the manufacturing method corresponding to the device structure of the first embodiment of the present application. FIG. 17 is a device sectional view in the manufacturing process (gate polysilicon deposition step) corresponding to FIG. 8 for describing the manufacturing method corresponding to the device structure of the first embodiment of the present application. FIG. 18 is a device sectional view in the manufacturing process (gate polysilicon etchback step) corresponding to FIG. 8 for describing the manufacturing method corresponding to the device structure of the first embodiment of the present application. FIG. 19 is a device sectional view in the manufacturing process (gate oxide film etchback step) corresponding to FIG. 8 for describing the manufacturing method corresponding to the device structure of the first embodiment of the present application. FIG. 20 is a device sectional view in the manufacturing process (P-type body region and N+ type emitter region introduction step) corresponding to FIG. 8 for describing the manufacturing method corresponding to the device structure of the first embodiment of the present application. FIG. 21 is a device sectional view in the manufacturing process (interlayer insulating film deposition step) corresponding to FIG. 8 for describing the manufacturing method corresponding to the device structure of the first embodiment of the present application. FIG. 22 is a device sectional view in the manufacturing process (contact hole formation step) corresponding to FIG. 8 for describing the manufacturing method corresponding to the device structure of the first embodiment of the present application. FIG. 23 is a device sectional view in the manufacturing process (substrate etching step) corresponding to FIG. 8 for describing the manufacturing method corresponding to the device structure of the first embodiment of the present application. FIG. 24 is a device sectional view in the manufacturing process (P+ type body contact region and P+ type latchup prevention region introduction step) corresponding to FIG. 8 for describing the manufacturing method corresponding to the device structure of the first embodiment of the present application. FIG. 25 is a device sectional view in the manufacturing process (surface metal deposition step) corresponding to FIG. 8 for describing the manufacturing method corresponding to the device structure of the first embodiment of the present application. FIG. 26 is a device sectional view in the manufacturing process (backgrinding and back surface impurity introduction step) corresponding to FIG. 8 for describing the manufacturing method corresponding to the device structure of the first embodiment of the present application. The manufacturing method corresponding to the device structure of the first embodiment of the present application will be explained based on these.

A 200φ wafer (wafers having various diameters such as 150φ, 100φ, 300φ, 450φ, etc. may be adopted) of an N-type silicon monocrystal (e.g., a phosphorus concentration of $2 \times 10^{14}/cm^3$ or so) is first prepared. Here, a wafer based on, for example, an FZ (Floating Zone) method is most suitable, but a wafer based on a CZ (Czochralski) method may be adopted.

Next, as shown in FIG. 9, an N type hole barrier region introduction resist film 31 is formed approximately over the whole area on a surface 1a (first main surface) of a semiconductor wafer 1 by coating or the like and patterned by the normal lithography. With the patterned N type hole barrier region introduction resist film 31 as a mask, an N type impurity is introduced into a semiconductor substrate is (N− type monocrystal silicon substrate) on the surface 1a (first main surface) side of the semiconductor wafer 1 by, for example, ion implantation to thereby form an N type hole barrier region 24. As ion implantation conditions at this time, there can be illustrated as preferred ones, for example, ion species: phosphorus, dose: $6 \times 10^{12}/cm^2$ or so, and injection energy: 80 KeV or so. Thereafter, the unneeded resist film 31 is removed by ashing or the like.

Next, as shown in FIG. 10, a P type floating region introduction resist film 37 is formed approximately over the whole area on the surface 1a of the semiconductor wafer 1 by coating or the like and patterned by the normal lithography. With the patterned P type floating region introduction resist film 37 as a mask, a P type impurity is introduced into the semiconductor substrate 1s on the surface 1a (first main surface) side of the semiconductor wafer 1 by, for example, ion implantation to thereby form a P type floating region 16. As ion implantation conditions at this time, there can be illustrated as preferred ones, for example, ion species: boron, dose: $3.5 \times 10^{13}/cm^2$ or so, and injection energy: 75 KeV or so. Thereafter, the unnecessary resist film 37 is removed by ashing or the like. Incidentally, when the P type floating region 16 is introduced, the cell peripheral junction region 35 and the floating field ring 36 of FIG. 2 are also simultaneously introduced.

Next, as shown in FIG. 11, a trench formation hardmask film 32 (having a thickness of 450 nm or so, for example) such as a silicon oxide-based insulating film or the like is grown approximately over the whole area on the surface 1a of the semiconductor wafer 1 by, for example, CVD (Chemical Vapor Deposition) or the like.

Next, as shown in FIG. 12, a trench hardmask film processing resist film 33 is formed approximately over the whole area on the surface 1a of the semiconductor wafer 1 by coating or the like and patterned by the normal lithography. With the patterned trench hardmask film processing resist film 33 as a mask, the trench formation hardmask film 32 is patterned by dry etching, for example.

Thereafter, as shown in FIG. 13, the unnecessary resist film 33 is removed by ashing or the like.

Next, as shown in FIG. 14, trenches 21 are formed by, for example, anisotropic dry etching using the patterned trench formation hardmask film 32. As a gas system for the anisotropic dry etching, there can be illustrated as a preferred one, a $Cl_2/O_2$-based gas, for example.

Thereafter, as shown in FIG. 15, the unnecessary trench formation hardmask film 32 is removed by, for example, wet etching using a hydrofluoric acid-system silicon oxide film etching solution or the like.

Next, extension diffusion for the P type floating region 16 and the N type hole barrier region 24 (e.g., 1200° C. and 30 minutes or so) is executed as shown in FIG. 16. Subsequently, a gate insulating film 22 (having a thickness of 120 nm or so, for example) is formed approximately over the whole area on the surface 1a of the semiconductor wafer 1 and the inner surfaces of the trenches 21 by, for example, thermal oxidation or the like.

Next, as shown in FIG. 17, phosphorus-doped doped poly-silicon (Doped Poly-Silicon) film 27 is deposited approximately over the whole area on the surface 1a of the semiconductor wafer 1 and the inner surfaces of the trenches 21, lying on the gate insulating film 22 so as to bury the trenches 21 by, for example, CVD or the like (e.g., 600 nm in thickness).

Next, as shown in FIG. 18, the poly-silicon film 27 is etched back by, for example, dry etching or the like (e.g., gas system: $SF_6$ or the like) to thereby form trench gate electrodes 14 within the trenches 21.

Next, as shown in FIG. 19, the gate insulating film 22 other than the trenches 21 is removed by wet etching using a hydrofluoric acid-system silicon oxide film etching solution or the like.

Next, as shown in FIG. 20, a relatively thin silicon oxide film (nearly equal to the gate insulating film, for example) for the succeeding ion implantation is formed approximately over the whole area on the surface 1a of the semiconductor wafer 1 by, for example, thermal oxidation or CVD. Subsequently, a P type body region introduction resist film is formed over the surface 1a of the semiconductor wafer 1 by the normal lithography. With the P type body region introduction resist film as a mask, a P type impurity is introduced approximately into the whole surface of the cell area 10 and other necessary portions by, for example, ion implantation to thereby form a P type body region 15. As ion implantation conditions at this time, there can be illustrated as preferred ones, for example, ion species: boron, dose: $3 \times 10^{13}/cm^2$ or so, and injection energy: 75 KeV or so. Thereafter, the unnecessary P type body region introduction resist film is removed by ashing or the like.

Further, an N+ type emitter region introduction resist film is formed over the surface 1a of the semiconductor wafer 1 by the normal lithography. With the N+ type emitter region introduction resist film as a mask, an N type impurity is introduced approximately into the whole area of the top surface of the P type body region 15 in the linear active cell area 40a by, for example, ion implantation. As ion implantation conditions at this time, there can be illustrated as preferred ones, for example, ion species: arsenic, dose: $5 \times 10^{15}/cm^2$ or so, and injection energy: 80 KeV or so. Thereafter, the unnecessary N+ type emitter region introduction resist film is removed by ashing or the like.

Next, as shown in FIG. 21, for example, PSG (Phosphsilicate Glass) film is grown approximately over the whole area on the surface 1a of the semiconductor wafer 1 by, for example, CVD or the like as an interlayer insulating film 26 (e.g., 600 nm in thickness). As a material for the interlayer insulating film 26, there can be illustrated as a preferred one, a BPSG (Borophosphsilicate Glass) film, an NSG (Non-doped Silicate Glass) film, an SOG (Spin-On-Glass) film or a complex film of these or the like in addition to the PSG film.

Next, as shown in FIG. 22, a contact groove formation resist film 28 is formed over the surface 1a of the semiconductor wafer 1 on the interlayer insulating film 26 by the normal lithography. Subsequently, a contact groove 11 (or contact hole) is formed by, for example, anisotropic dry etching or the like (gas system: $Ar/CHF_3/CF_4$ or the like, for example).

Thereafter, as shown in FIG. 23, the unnecessary resist film 28 is removed by ashing or the like. Then, the contact groove 11 (or contact hole) is extended to within the semiconductor substrate by, for example, anisotropic dry etching. As a gas system at this time, there can be illustrated as a preferred one, for example, a $Cl_2/O_2$-based gas.

Next, as shown in FIG. 24, for example, a P type impurity is ion-implanted through the contact groove 11 to thereby form a P+ type body contact region 25. Here, as ion implantation conditions, there can be illustrated as preferred ones, for example, ion species: $BF_2$, dose: $5 \times 10^{15}/cm^2$ or so, and implantation energy: 80 KeV or so.

Likewise, for example, a P type impurity is ion-implanted through the contact groove 11 to thereby form a P+ type latchup prevention region 23. Here, as ion implantation conditions, there can be illustrated as preferred ones, for example, ion species: boron, dose: $5 \times 10^{15}/cm^2$ or so, and implantation energy: 80 KeV or so.

Next, as shown in FIG. 25, for example, an aluminum-based electrode 8 (that serves as a metal emitter electrode 8) is formed by sputtering or the like. Described concretely, this is executed by, for example, such a procedure as described below. First, a TiW film (200 nm or so in thickness, for example) is formed approximately over the whole area on the surface 1a of the semiconductor wafer 1 by, for example, sputtering deposition as a barrier metal film (substantial portion of titanium in the TiW film is moved to a silicon interface by subsequent heat treatment to form silicide, thereby contributing to an improvement in contact characteristic, but these processes are not shown in the drawings because of being cumbersome).

Subsequently, for example, silicide anneal is carried out at about 600° C. for about 10 minutes in a nitrogen atmosphere. Then, an aluminum-based metal film (5 micrometers or so in thickness, for example) containing aluminum as a principal component (e.g., addition of a few % silicon, and aluminum contained as the residual) is formed approximately over the whole area on the barrier metal film by, for example, sputtering deposition so as to bury the contact groove 11. Subsequently, the metal emitter electrode 8 comprised of an aluminum-based metal film and a barrier metal film is patterned by the normal lithography (e.g., $Cl_2/BCl_3$ or the like as a gas system for dry etching). Further, for example, an organic film (2.5 micrometers or so in thickness, for example) or the like containing polyimide as a principal component is applied approximately over the whole area of the device surface 1a of the wafer 1 as a final passivation film, and the emitter pad 9, gate pad 6 and the like in FIG. 6 are made open by the normal lithography.

Next, a backgrinding process is performed on the back surface 1b of the wafer 1 (chemical etching or the like for removing damage to the back surface is also performed as needed) to thereby bring a wafer thickness that is originally about 800 micrometers (about 1000 to 450 micrometers as a suitable range), for example, into, for example, about 200 to 30 micrometers into thinning as needed. When the breakdown voltage is assumed to be 600 volts or so, the final thickness becomes 70 micrometers or so.

Next, as shown in FIG. 26, an N type impurity is introduced approximately into the whole area of the back surface 1b of the semiconductor wafer 1 by, for example, ion implantation to thereby form an N type field stop region 19. Here, as ion implantation conditions, there can be illustrated as preferred ones, for example, ion species: phosphorus, dose: $7 \times 10^{12}/cm^2$ or so, and implantation energy: 350 KeV or so. Thereafter, laser anneal or the like is performed on the back surface 1b of the wafer 1 for impurity activation as needed. Next, an N type impurity is introduced approximately into the whole area of the back surface 1b of the semiconductor wafer 1 by, for example, ion implantation to thereby form a P+ type collector region 18. Here, as ion implantation conditions, there can be illustrated as preferred ones, for example, ion species: boron, dose: $1 \times 10^{13}/cm^2$ or so, and implantation energy: 40 KeV or so. Thereafter, laser anneal or the like is performed on the back surface 1b of the wafer 1 for impurity activation as needed.

Figure 49:
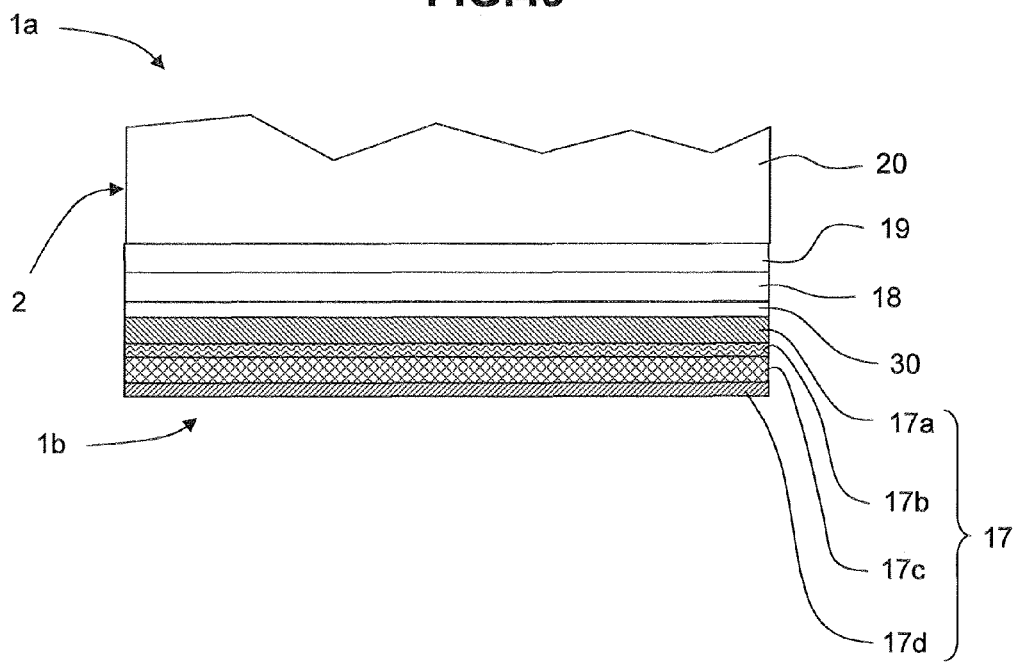
FIG. 49 is a local detailed sectional view of a device back surface for describing a device structure of an eleventh embodiment (back surface aluminum-doped structure) of the present application and its manufacturing method.

Next, a metal collector electrode 17 is formed approximately over the whole area of the back surface 1b of the semiconductor wafer 1 by, for example, sputtering deposition (concrete details thereof refer to FIG. 49 and its description). Thereafter, the semiconductor wafer 1 is divided into chip areas by dicing or the like, which are encapsulated into packages as needed, whereby each device is completed.

4. Description of Device Structure of IE-Type Trench Gate IGBT According to the Second Embodiment (P Type Deep Floating Structure) of the Present Application (Refer Principally to FIG. 27):

A unit cell structure described in this section corresponds to one in which the N type hold barrier region 24 is omitted from the unit cell structure shown in FIG. 8.

Figure 27:
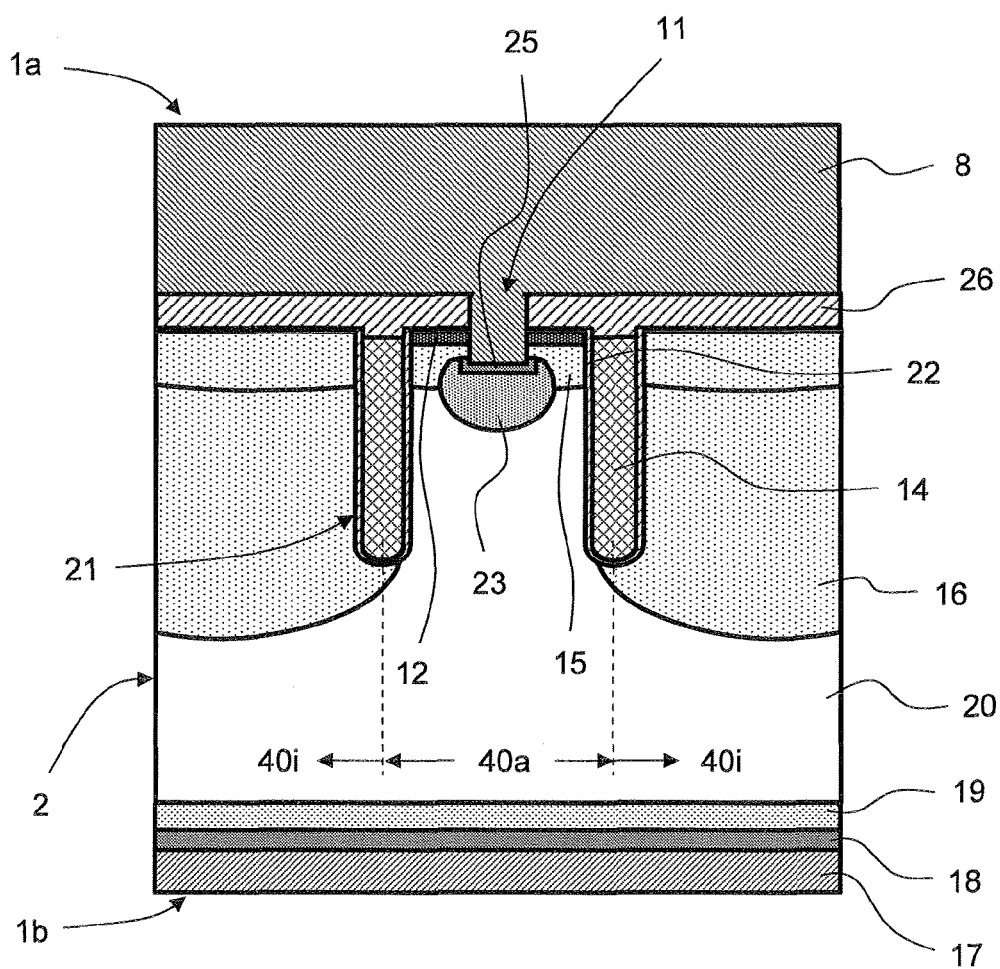
FIG. 27 is a device sectional view corresponding to a section taken along line D-D' of FIG. 7 for describing a device structure of an IE-type trench gate IGBT according to a second embodiment (P-type deep floating structure) of the present application.

FIG. 27 is a device sectional view corresponding to a section taken along line D-D' of FIG. 7 for describing a device structure of an IE-type trench gate IGBT according to the second embodiment (P-type deep floating structure) of the present application. Based on this, the device structure of the IE-type trench gate IGBT according to the second embodiment (P type deep floating structure) of the present application will be explained.

As shown in FIG. 27, the present example shows a structure in which the N type hole barrier region 24 is omitted from the unit cell structure in FIG. 8. Thus, the hole concentration of the N type drift region 20 portion in the linear active cell area 40a has a tendency to be reduced as compared with the structure of FIG. 8. For example, when the linear active cell area 40a is sufficiently narrow and the depth of each trench 21 is sufficiently deep (when the P type floating region 16 is also deep in association therewith), the adoption of the structure of FIG. 27 becomes effective.

5. Description of Device Structure of IE-Type Trench Gate IGBT According to the Third Embodiment (P/N Floating & Hole Barrier Structure) (Refer Principally to FIG. 28):

A unit cell structure described in this section corresponds to one in which in the unit cell structure in FIG. 8, an N+ type floating region 29 (formed in the same process as the N+ type emitter region 12) corresponding to the N+ type emitter region 12 is provided approximately over the whole area of the surface 1a of the semiconductor substrate in the linear inactive cell area 40i in a manner similar to the linear active cell area 40a.

Figure 28:
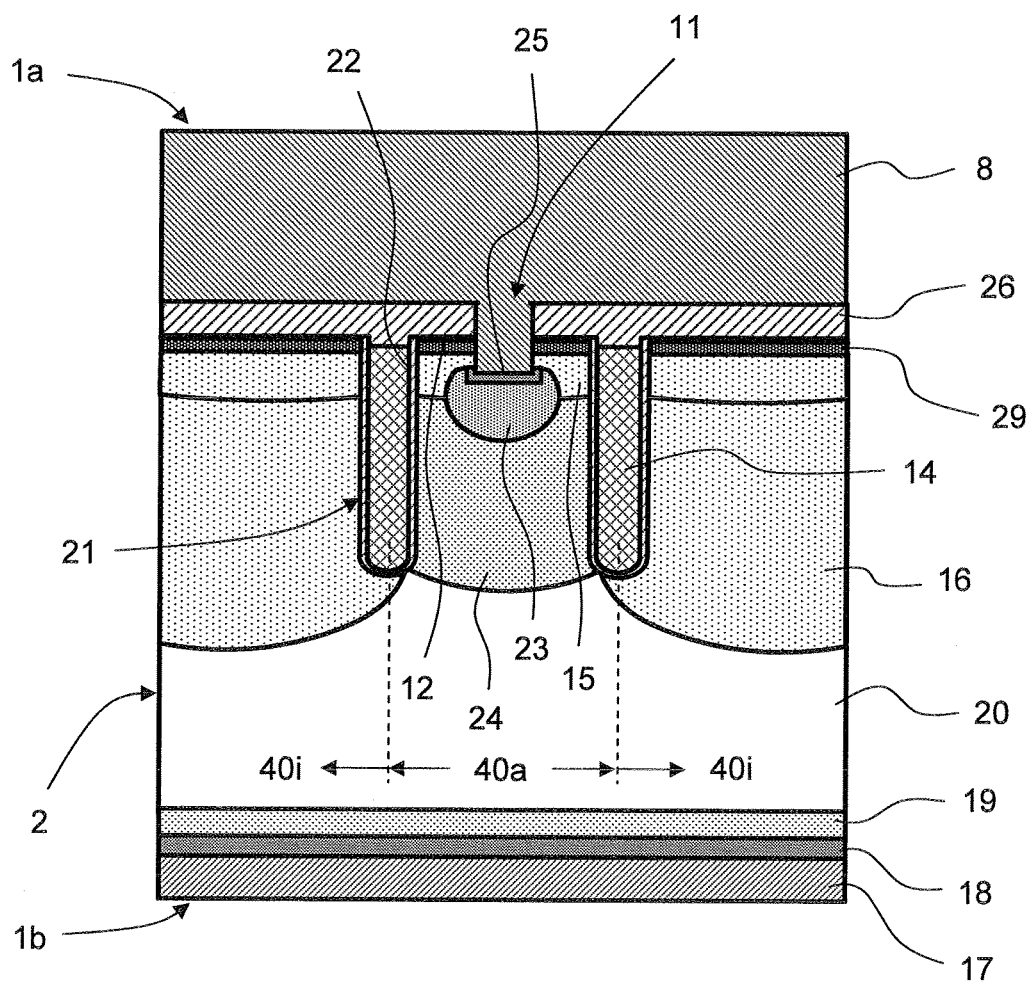
FIG. 28 is a device sectional view corresponding to a section taken along line D-D' of FIG. 7 for describing a device structure of an IE-type trench gate IGBT according to a third embodiment (P/N-type floating & hole barrier structure) of the present application.

FIG. 28 is a device sectional view corresponding to the section taken along line D-D' of FIG. 7 for describing a device structure of an IE-type trench gate IGBT according to the third embodiment (P/N-type floating & hole barrier structure) of the present application. The device structure of the IE-type trench gate IGBT according to the third embodiment (P/N floating & hole barrier structure) of the present application will be explained based on it.

As shown in FIG. 28, there is shown a structure in which an N+ type emitter region 12 (29) is provided approximately over the whole area of the surface 1a of the semiconductor substrate in the cell area 10 unlike FIG. 8. In order to realize this structure, the N+ type emitter region 12 may extend to the full range of the cell area 10 in FIG. 20, for example.

6. Description of Device Structure of IE-Type Trench Gate IGBT According to the Fourth Embodiment (Deep Hole Barrier Structure) of the Present Application (Refer Principally to FIG. 29):

A unit cell structure described in this section corresponds to one in which in the unit cell structure in FIG. 8, the depth of an N type hole barrier region 24 is set deeper than that of the P type floating region 16.

Figure 29:
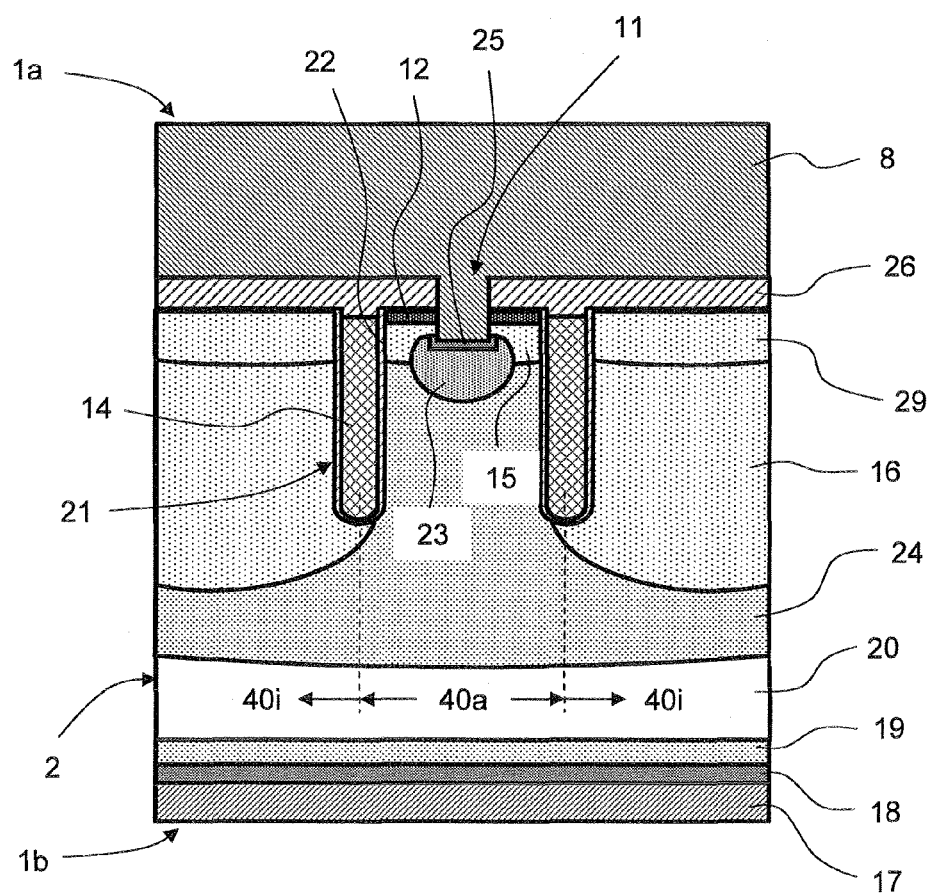
FIG. 29 is a device sectional view corresponding to a section taken along line D-D' of FIG. 7 for describing a device structure of an IE-type trench gate IGBT according to a third embodiment (deep hole barrier structure) of the present application.

FIG. 29 is a device sectional view corresponding to the section taken along line D-D' of FIG. 7 for describing a device structure of an IE-type trench gate IGBT according to the fourth embodiment (deep hole barrier structure) of the present application. The device structure of the IE-type trench gate IGBT according to the fourth embodiment (deep hole barrier structure) of the present application will be explained based on it.

As shown in FIG. 29, the depth of the N type hole barrier region 24 is deeper than that of the P type floating region 16 unlike FIG. 8. As methods of realizing it, there can be illustrated as preferred ones, for example, three methods: a method for expanding the opening of the resist film 31 to the full range of the cell area 10, and a method for adding heat treatment capable of sufficiently diffusing an impurity immediately after ion implantation in addition to a method for slightly increasing the dose and the injection energy in FIG. 9.

7. Description of Device Structure According to the Fifth Embodiment (Active Section Diffusion Structure at Active Cell Two-Dimensional Thinned-Out Structure) of the Present Application (Refer Principally to FIGS. 30 through 32):

A unit cell structure described in this section is a modification with respect to the plane layout described in FIGS. 4 and 8. This relates to the description of a concrete example illustrative of one described in relation to FIG. 5. The planar structure shown herein can be applied to the sectional structure of each of the unit cell structures or the like shown in FIGS. 2, 3 and 8, and FIGS. 27 through 29. One example thereof will be explained in this section.

Figure 30:
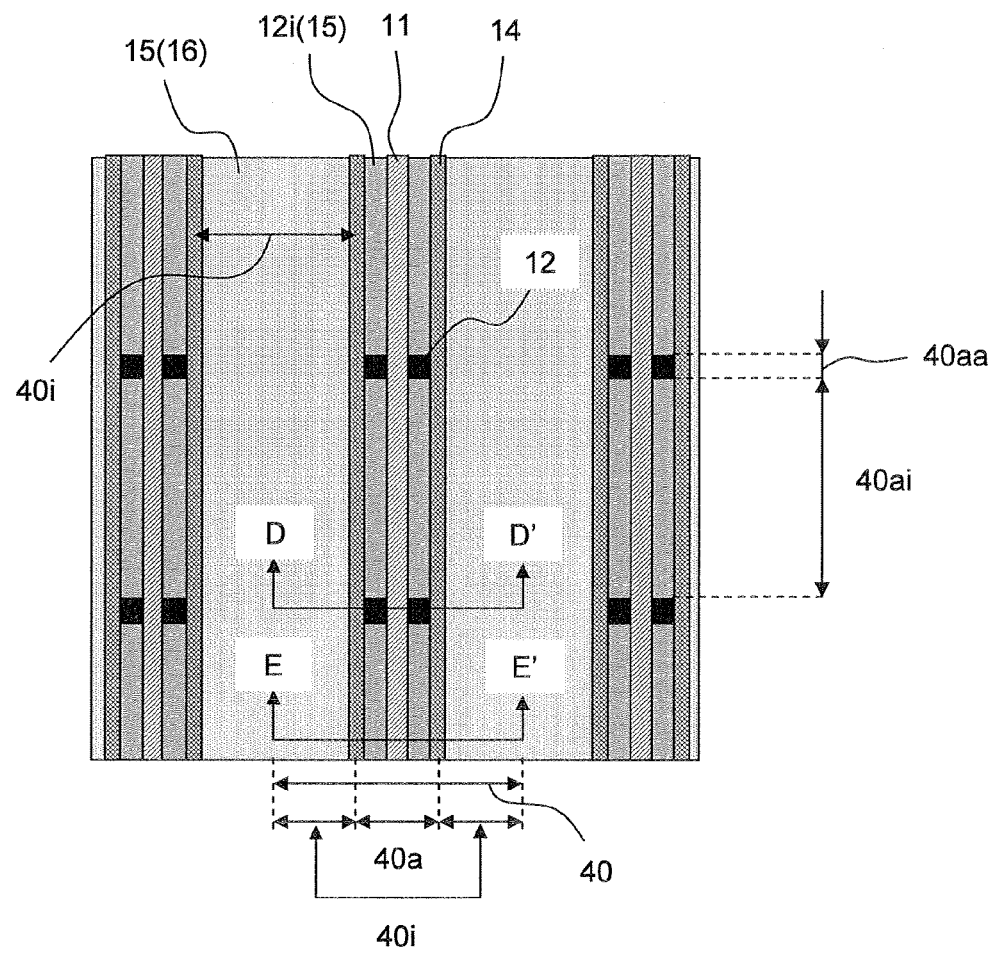
FIG. 30 is an enlarged top view corresponding to FIG. 7 for describing a device structure of a fifth embodiment (active section dispersion structure at active cell two-dimensional thinned-out structure) of the present application.
Figure 31:
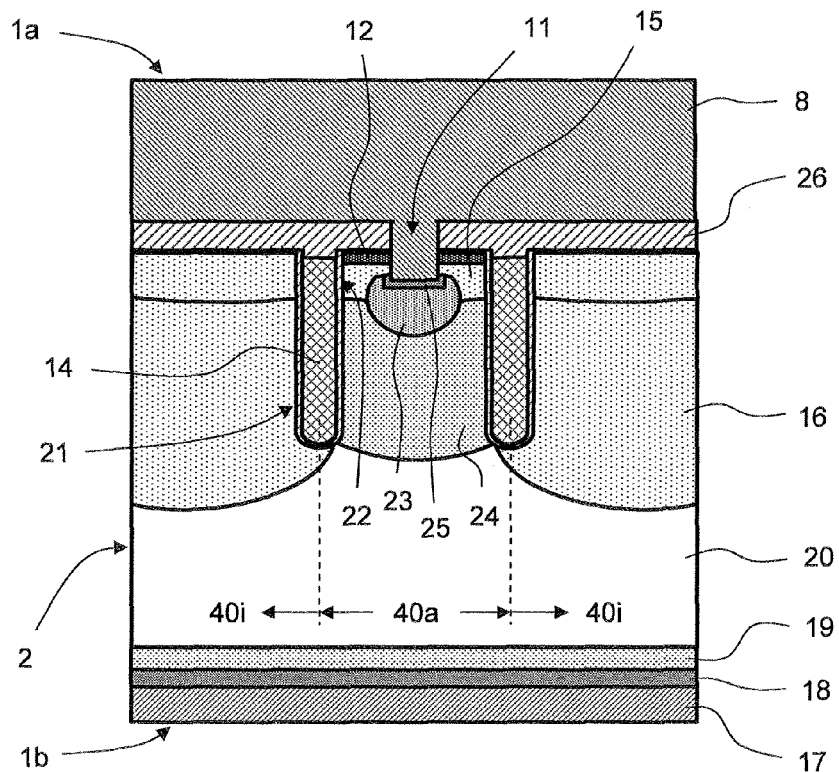
FIG. 31 is a device sectional view corresponding to a section taken along line D-D' of FIG. 30.
Figure 32:
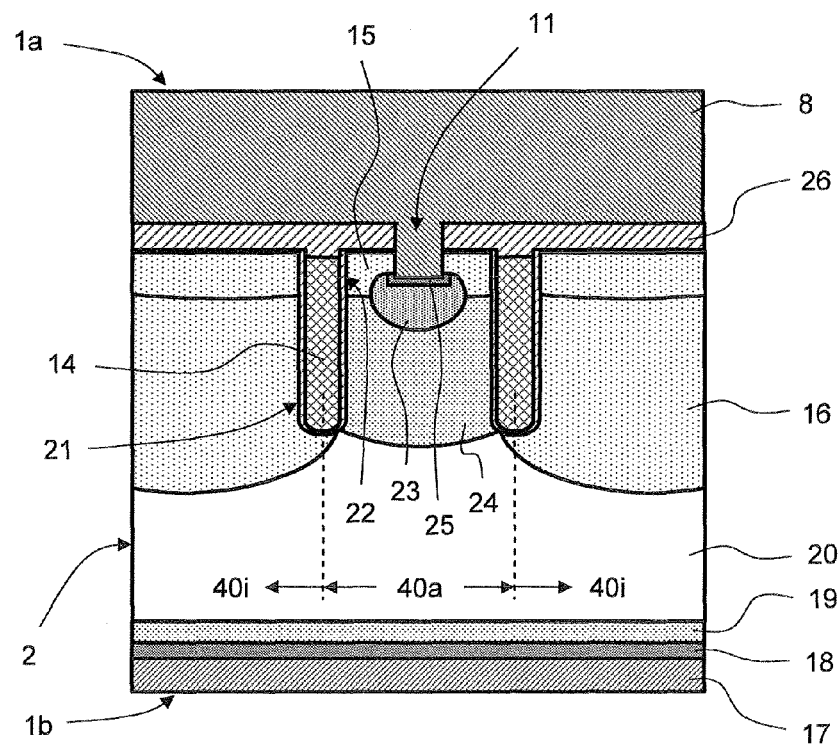
FIG. 32 is a device sectional view corresponding to a section taken along line E-E' of FIG. 30.

FIG. 30 is an enlarged top view corresponding to FIG. 7 for describing the device structure of the fifth embodiment (active section dispersion structure at active cell two-dimensional thinned-out structure) of the present application. FIG. 31 is a device sectional view corresponding to a section taken along line D-D' of FIG. 30. FIG. 32 is a device sectional view corresponding to a section taken along line E-E' of FIG. 30. The device structure of the fifth embodiment (active section diffusion structure at active cell two-dimensional thinned-out structure) of the present application will be explained based on these.

As shown in FIG. 30, the N+ type emitter region 12 is not formed approximately over the entire length of the linear active cell area 40a unlike FIG. 8 (FIG. 4). There are shown an active section 40aa formed with the N+ type emitter region 12 and an inactive section 40ai formed with no N+ type emitter region 12 approximately periodically divided in the longitudinal direction of the linear active cell area 40a. That is, the region corresponding to the N+ type emitter region 12 in FIG. 8 is divided into a relatively short N+ type emitter region 12 and a relatively long region 12i free of introduction of an N type impurity therein.

On the other hand, in the present example, a contact groove 11 (or contact hole) is formed approximately over the entire length of the linear active cell area 40a in a manner similar to FIG. 8 (FIG. 4).

A section taken along line D-D' of FIG. 30 is shown in FIG. 31. As shown in FIG. 31, the sectional structure of this portion is the same as FIG. 8. Further, a section taken along line E-E' of FIG. 30 is shown in FIG. 32. This is identical to FIG. 8 except that no N+ type emitter region 12 is formed in the linear active cell area 40a as shown in FIG. 32.

In the present example, the lengths of the active section 40aa and the inactive section 40ai can be set in various ways according to the time (time endurance under load short-circuit condition) during which the device is capable of enduring without a thermal breakdown, based on energy determined by the required characteristics, i.e., a saturation current, an on resistance in a high current domain, a short-circuit current flowing at load short-circuit, and a voltage to be applied. One example illustrative of concrete dimensions is shown in correspondence with the example shown herein. For example, it is shown as follows: The length of the active section 40aa is about 1 micrometers, and the length of the inactive section 40ai is about 10 micrometers.

Thus, when it is desired to reduce the on resistance in the high current domain in such a case that the time endurance under the load short-circuit condition becomes insignificant, for example, it is also possible to set the length of the active section 40aa to 1 micrometers or so and set the length of the inactive section 40ai to 1 micrometers or so (or not greater than 1 micrometers), for example. Further, when it is desired to sufficiently reduce the saturation current and increase the time endurance under the load short-circuit condition, it is also possible to set the length of the active section 40aa to 1 micrometers or so and set the length of the inactive section 40ai to 20 micrometers or so (or greater than 20 micrometers), for example.

8. Description of Device Structure of Sixth Embodiment (Local Active Section-Active Subblock Structure at Active Cell Two-Dimensional Thinned-Out Structure) of the Present Application (Refer Principally to FIGS. 33 through 36):

An example described in this section is a modification related to, for example, the plane layout of FIG. 30.

A planar structure shown herein is a modification related to the plane layout of FIG. 30, which can be applied to the sectional structure of each of the unit cell structures or the like shown in FIGS. 2, 3 and 8, and FIGS. 27 through 29. One example thereof will be explained in this section.

Figure 33:
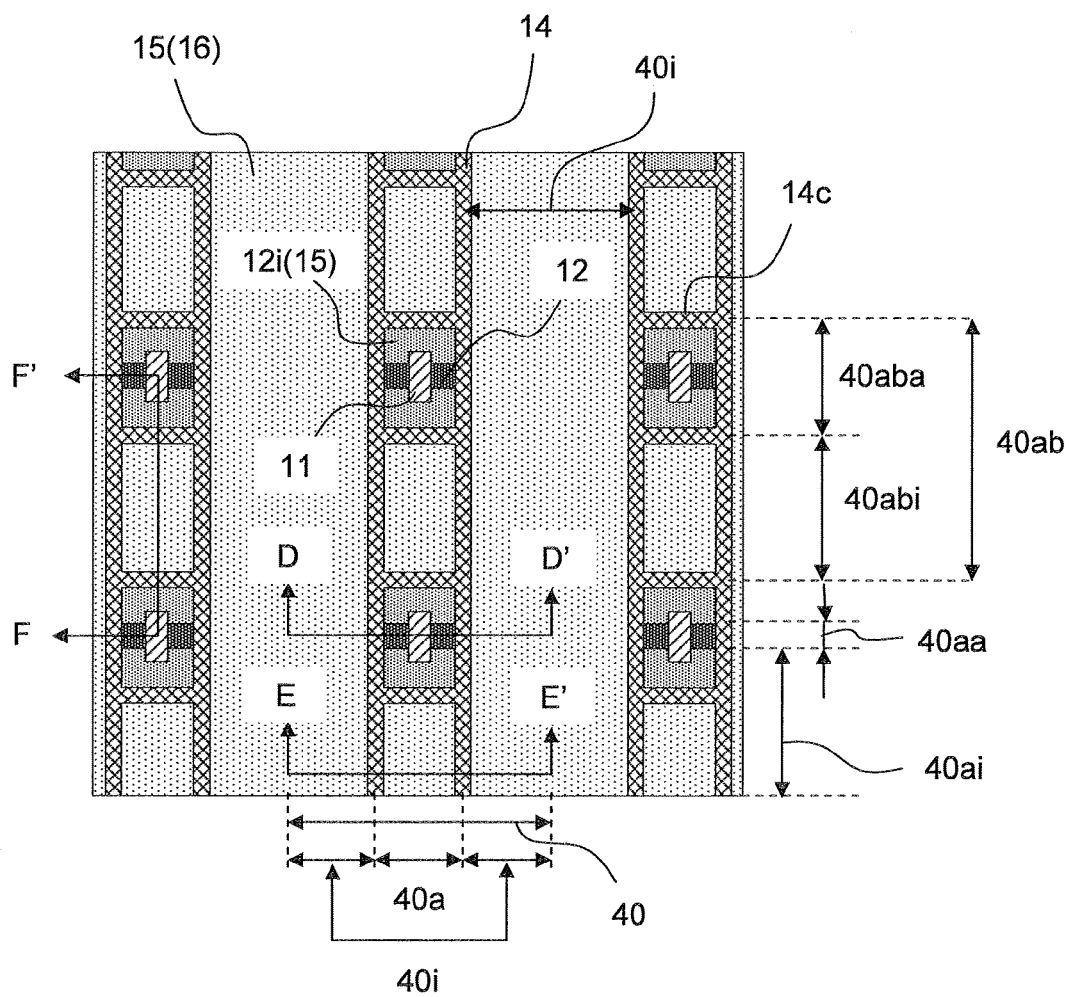
FIG. 33 is an enlarged top view corresponding to FIG. 7 for describing a device structure of a sixth embodiment (local active section-active subblock structure at active cell two-dimensional thinned-out structure) of the present application.
Figure 34:
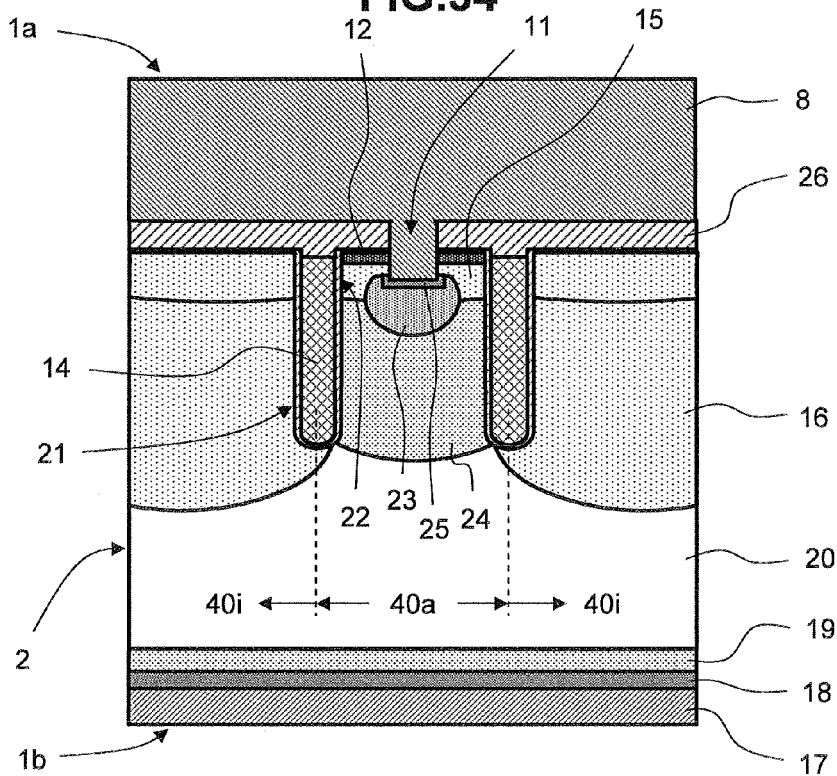
FIG. 34 is a device sectional view corresponding to a section taken along line D-D' of FIG. 33.
Figure 35:
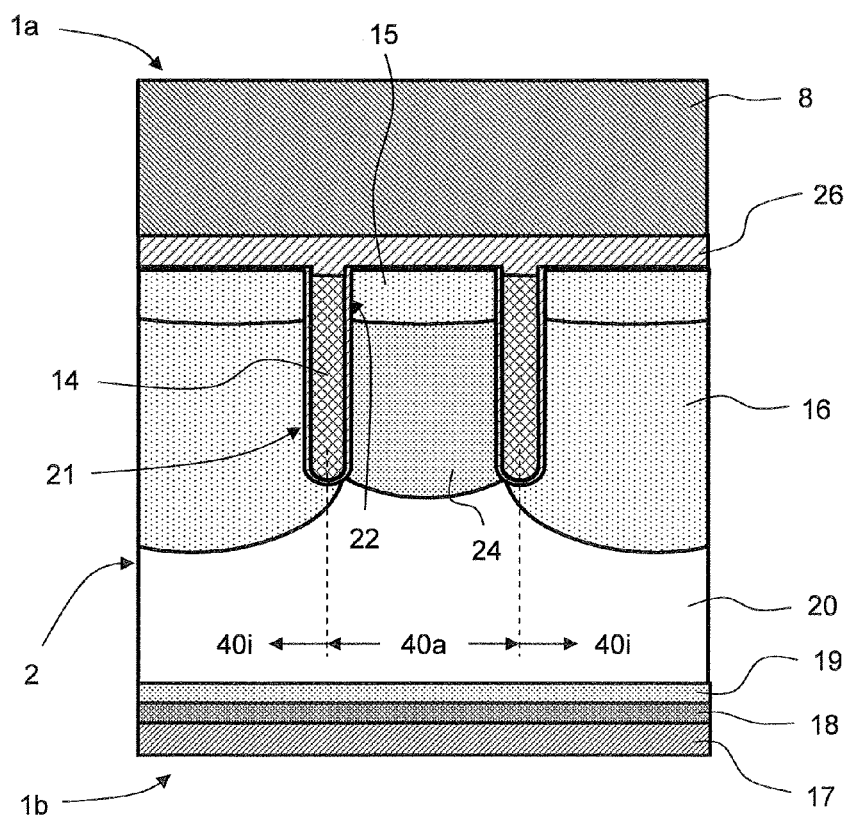
FIG. 35 is a device sectional view corresponding to a section taken along line E-E' of FIG. 33.
Figure 36:
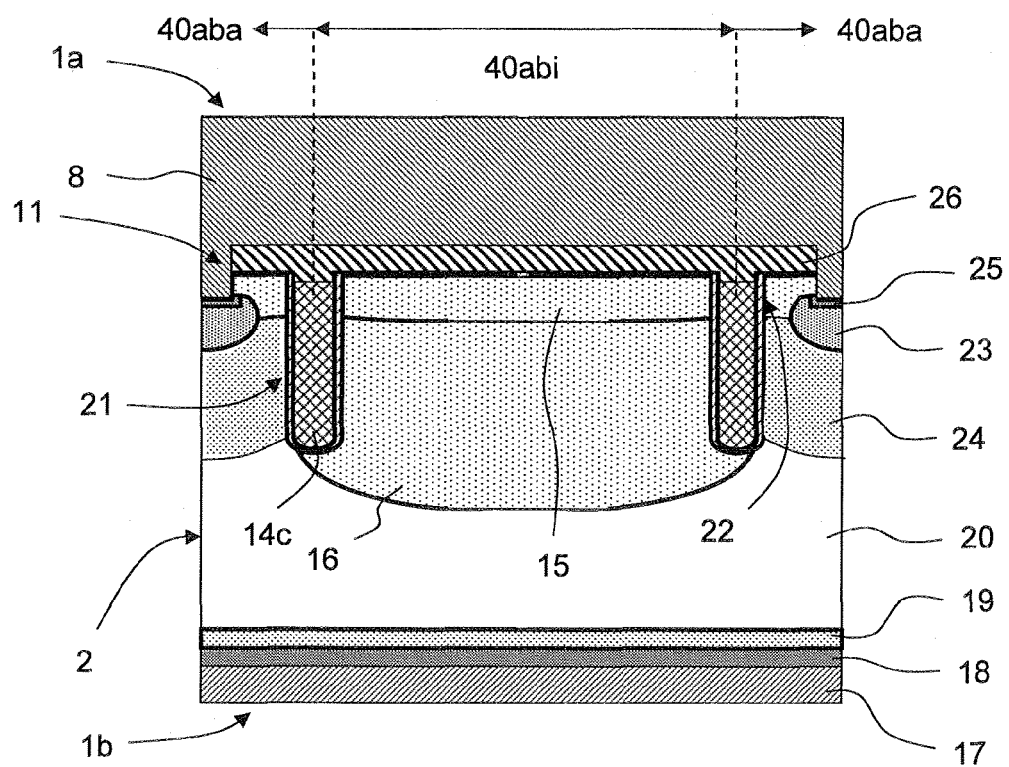
FIG. 36 is a device sectional view corresponding to a section taken along line F-F' of FIG. 33.

FIG. 33 is an enlarged top view corresponding to FIG. 7 for describing the device structure of the sixth embodiment (local active section-active subblock structure at active cell two-dimensional thinned-out structure) of the present application. FIG. 34 is a device sectional view corresponding to a section taken along line D-D' of FIG. 33. FIG. 35 is a device sectional view corresponding to a section taken along line E-E' of FIG. 33. FIG. 36 is a device sectional view corresponding to a section taken along line F-F' of FIG. 33. The device structure of the sixth embodiment (local active section-active subblock structure at active cell two-dimensional thinned-out structure) of the present application will be explained based on these.

As shown in FIG. 33, unlike FIG. 30, a pair of trench gate electrodes 14 (main trench gate electrodes) that configure boundaries on both sides of the same linear active cell area 40a as viewed in its transverse direction is coupled to each other by coupling trench gate electrodes 14c (i.e., trench gate electrodes that couple the adjacent main trench gate electrodes within the cell area) to thereby form a ladder-like planar structure (ladder-like trench gate electrode), whereby the linear active cell area 40a is brought into block form in its longitudinal direction. That is, the linear active cell area 40a is divided into approximately periodic blocks 40ab sectioned by the coupling trench gate electrodes 14c, for example (incidentally, it is not necessarily required to be divided periodically). Each block 40ab is basically comprised of an active subblock 40aba having an active section 40aa, and an inactive subblock 40abi having no active section 40aa. They are partitioned thereamong by the coupling trench gate electrodes 14c in a manner similar to the above. A contact hole 11 (emitter contact portion) is provided in each active subblock 40aba but not provided in each inactive subblock 40abi. In the present example, the active section 40aa is provided only at part of the active subblock 40aba. With the provision of such a structure, a path to an emitter metal electrode can substantially be restricted as compared with FIG. 30 and the like, thereby making it possible to limit the flow of holes into the emitter metal electrode more efficiently.

The section taken along line D-D' of FIG. 33 is shown in FIG. 34. As shown in FIG. 34, this sectional structure is the same as FIG. 31. Further, the section taken along line E-E' of FIG. 33 is shown in FIG. 35. As shown in FIG. 35, a sectional structure of this portion is the same as FIG. 32 except that the contact groove 11 (or contact hole), and the P+ type body contact region 25, P+ type latchup prevention region 23 and the like are not provided in relation to the contact groove 11. The section taken along line F-F' of FIG. 33 is shown in FIG. 36. As shown in FIG. 36, a sectional structure for the active subblock 40aba is approximately identical to the linear active cell area 40a of FIG. 8 or the like, whereas a sectional structure for the inactive subblock 40*abi* is approximately identical to the linear inactive cell area 40*i* of FIG. 8 or the like. They are different from each other in that the main trench gate electrode 14 is provided in the boundary between the linear active cell area 40*a* and the linear inactive cell area 40*i* in FIG. 8 or the like, whereas the coupling trench gate electrode 14*c* is provided in the boundary between the active subblock 40*aba* and the inactive subblock 40*abi*.

A P type floating region 16 and a P type body region 15 are provided in an N− type drift region 20 (semiconductor region on the surface side of the semiconductor substrate) on the surface 1*a* (first main surface) side of the semiconductor chip 2 in the inactive subblock 40*abi* in order from below in a manner similar to FIG. 8 or the like. The depth of the P type floating region 16 is deeper than that of each trench 21. The P type floating region 16 is distributed so as to cover the lower end of each trench 21 (trench in which the coupling trench gate electrode 14*c* is stored). According to such a structure, the coupling trench gate electrode 14*c* serves as a cutoff trench for holes and cuts off an emitter passage, thereby enabling further improvements in hole storage effects.

Even in the present example, the lengths of the active subblock 40*aba* and the inactive subblock 40*abi* can also be changed in various ways depending on the required characteristics in a manner similar to the lengths of the active section 40*aa* and the inactive section 40*ai* described in the section 7. If one example illustrative of concrete dimensions is shown in association with this example, for example, it is as follows: The length of the active subblock 40*aba* is about 5 micrometers, and the length of the inactive subblock 40*abi* is about 6 micrometers.

Incidentally, in the present example, the lengths of the active section 40*aa* and the inactive section 40*ai* are set identical to the example of the section 7, but may be changed as needed in accordance with the previously-described example.

9. Description of Device Structure of Seventh Embodiment (Full Active Section-Active Subblock Structure at Active Cell Two-Dimensional Thinned-Out Structure) of the Present Application (Refer Principally to FIGS. 37 through 40):

An example described in this section is a modification of the plane layout of FIG. 33, for example.

A planar structure shown herein can be applied to the sectional structure of the unit cell structure in each of FIGS. 2, 3 and 8 and FIGS. 27 through 29, for example.

Figure 37:
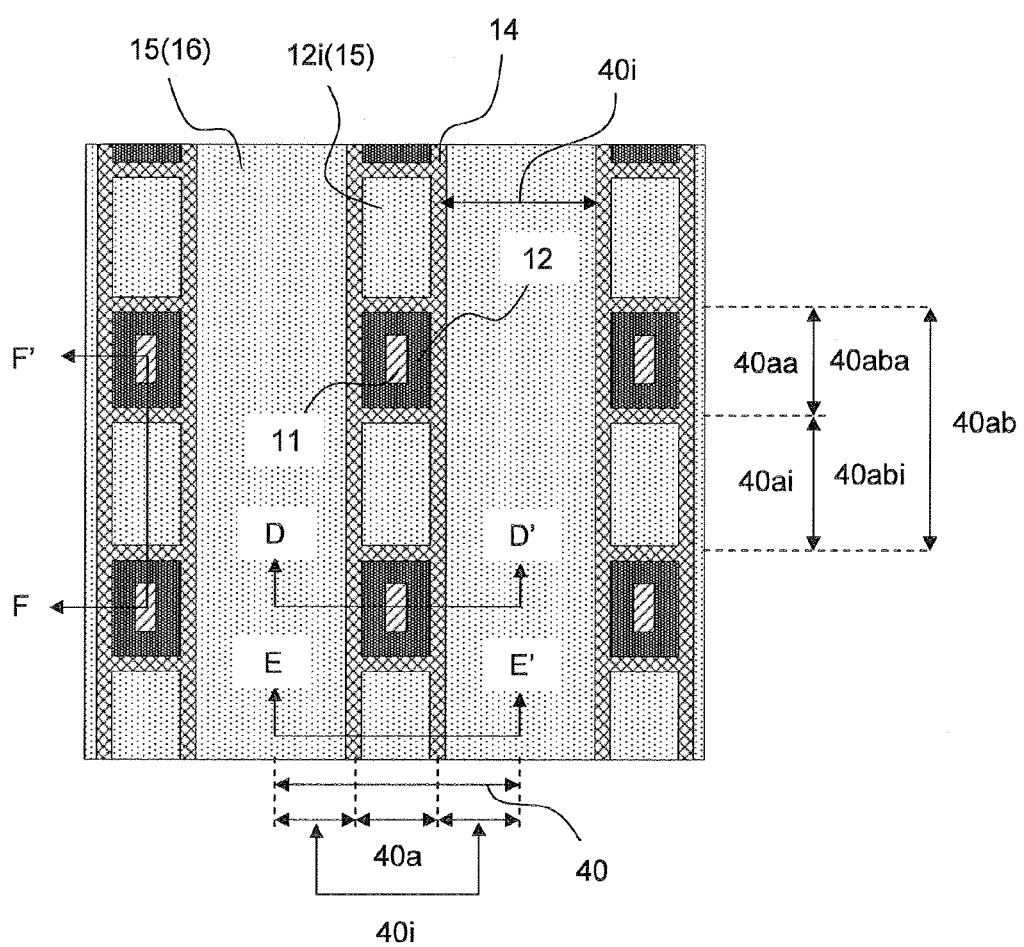
FIG. 37 is an enlarged top view corresponding to FIG. 7 for describing a device structure of a seventh embodiment (full active section-active subblock structure at active cell two-dimensional thinned-out structure) of the present application.
Figure 38:
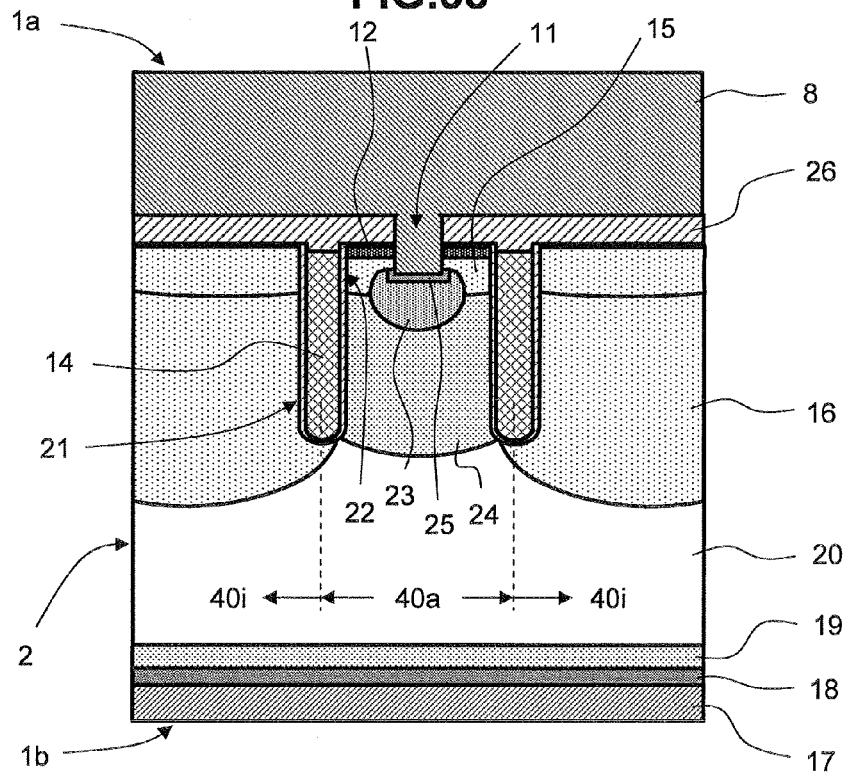
FIG. 38 is a device sectional view corresponding to a section taken along line D-D' of FIG. 37.
Figure 39:
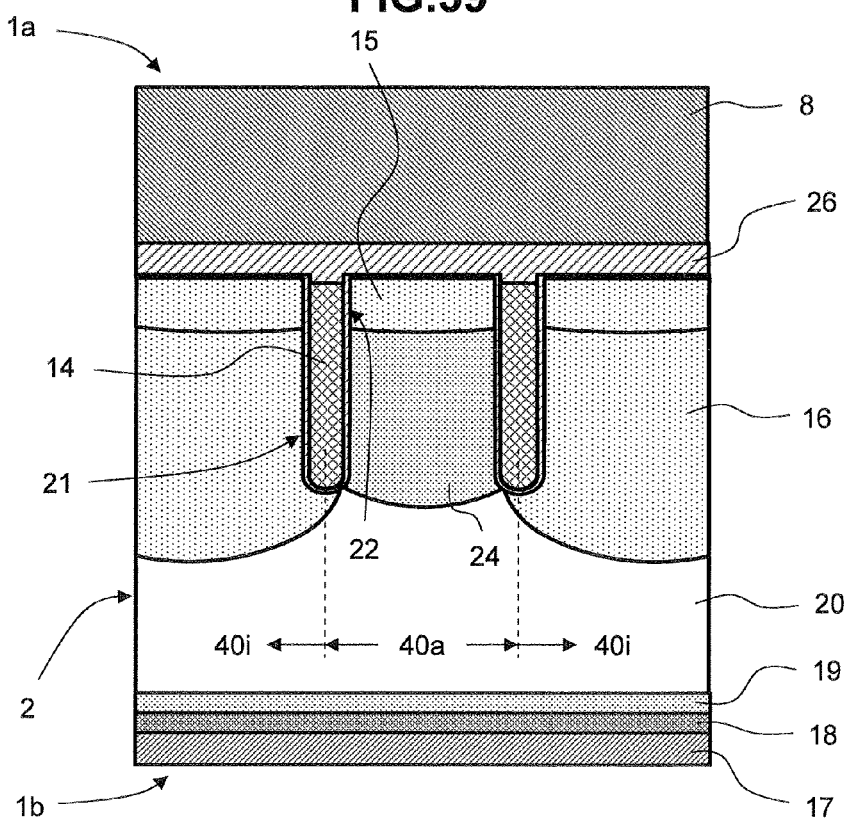
FIG. 39 is a device sectional view corresponding to a section taken along line E-E' of FIG. 37.
Figure 40:
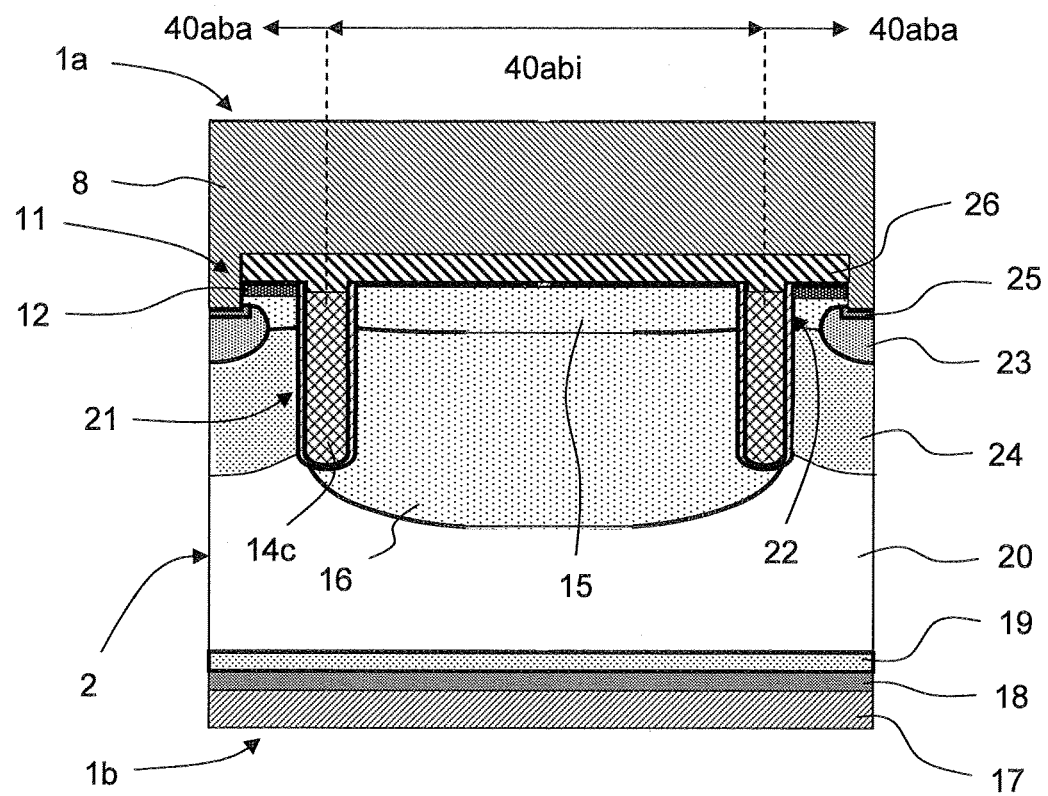
FIG. 40 is a device sectional view corresponding to a section taken along line F-F' of FIG. 37.

FIG. 37 is an enlarged top view corresponding to FIG. 7 for describing the device structure of the seventh embodiment (full active section-active subblock structure at active cell two-dimensional thinned-out structure) of the present application. FIG. 38 is a device sectional view corresponding to a section taken along line D-D' of FIG. 37. FIG. 39 is a device sectional view corresponding to a section taken along line E-E' of FIG. 37. FIG. 40 is a device sectional view corresponding to a section taken along line F-F' of FIG. 37. The device structure of the seventh embodiment (full active section-active subblock structure at active cell two-dimensional thinned-out structure) of the present application will be explained based on these.

As shown in FIG. 37, the present example is different from the example of FIG. 33 in that active subblocks 40*aba* are almost all configured as active sections 40*aa*. That is, in the example of FIG. 33, only the partial section of the active subblock 40*aba* serves as the active section 40*aa* formed with the N+ type emitter region 12. In the present example, however, an N+ type emitter region 12 is formed over the entire surface of the semiconductor substrate in the active subblock 40*aba* except for the portion of each contact groove 11 (or contact hole). On the other hand, each inactive subblock 40*abi* serves as an inactive section 40*ai* approximately over its entire region in a manner similar to the example of FIG. 33. This structure is effective when it is desired to increase a saturation current. There is however a possibility of a reduction in breakdown voltage at load short-circuit.

Thus, the section taken along line D-D' of FIG. 37 is nearly identical to FIG. 34 as shown in FIG. 38. The section taken along line E-E' of FIG. 37 is nearly identical to FIG. 35 as shown in FIG. 39. On the other hand, in the section taken along line F-F' of FIG. 37, the N+ type emitter region 12 is provided in the surface 1*a* of the semiconductor substrate in the active subblock 40*aba* as shown in FIG. 40.

10. Description of Device Structure of Eighth Embodiment (Local N+ Type Floating-Inactive Section Structure at Active Cell Two-Dimensional Thinned-Out Structure) of the Present Application (Refer Principally to FIGS. 41 through 43):

An example described in this section is a modification of the plane layout of FIG. 30, for example.

A planar structure shown herein can be applied to the sectional structure of the unit cell structure shown in each of FIGS. 2, 3 and 8, and FIGS. 27 through 29, for example. In this section, one example thereof will be explained.

Figure 41:
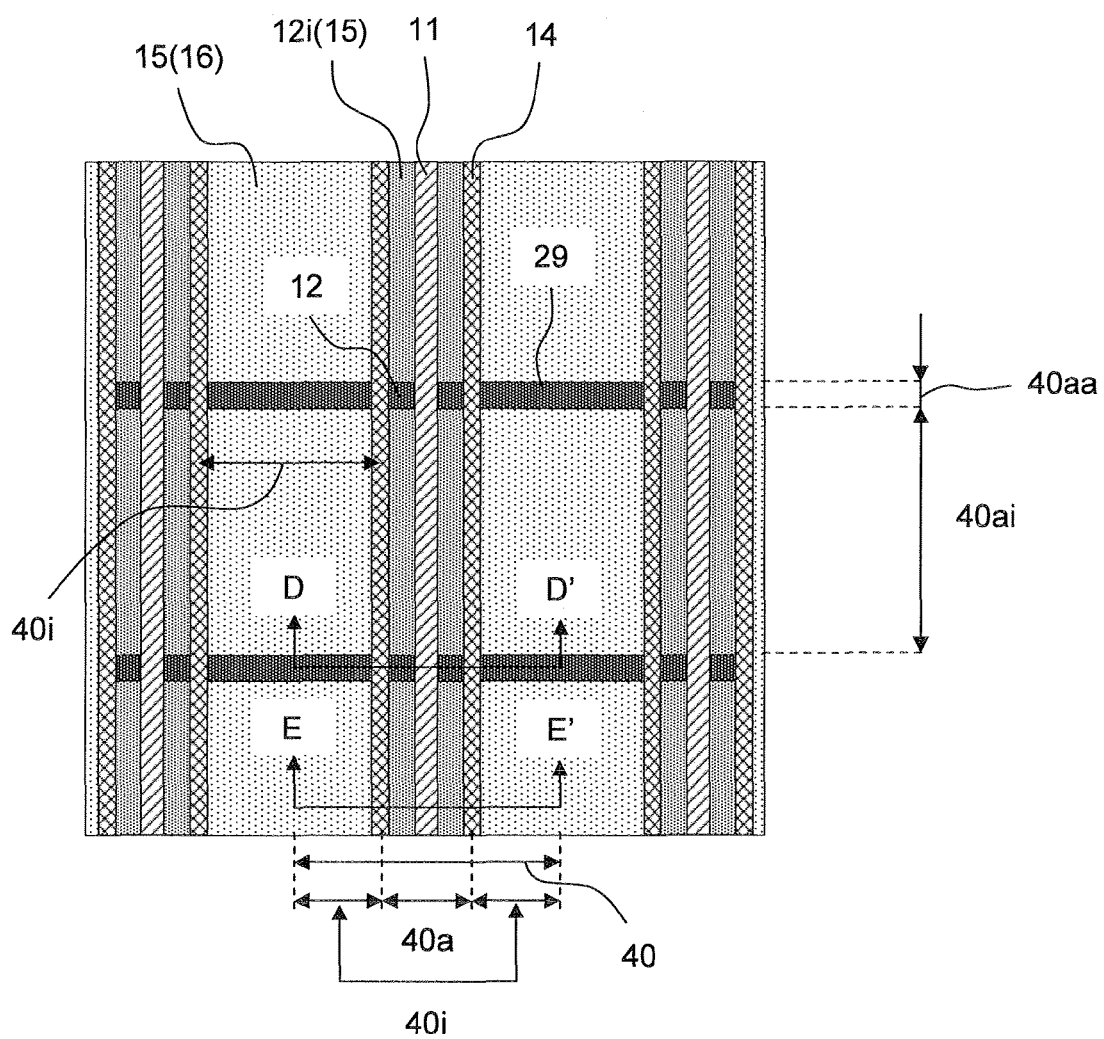
FIG. 41 is an enlarged top view corresponding to FIG. 7 for describing a device structure of an eighth embodiment (local N+ type floating-inactive section structure at active cell two-dimensional thinned-out structure) of the present application.
Figure 42:
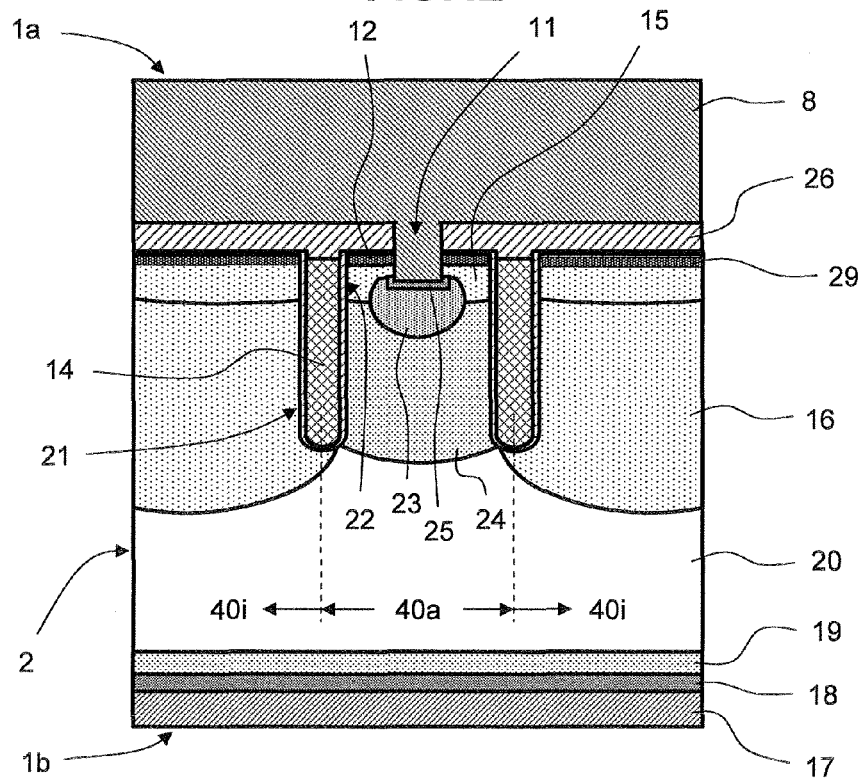
FIG. 42 is a device sectional view corresponding to a section taken along line D-D' of FIG. 41.
Figure 43:
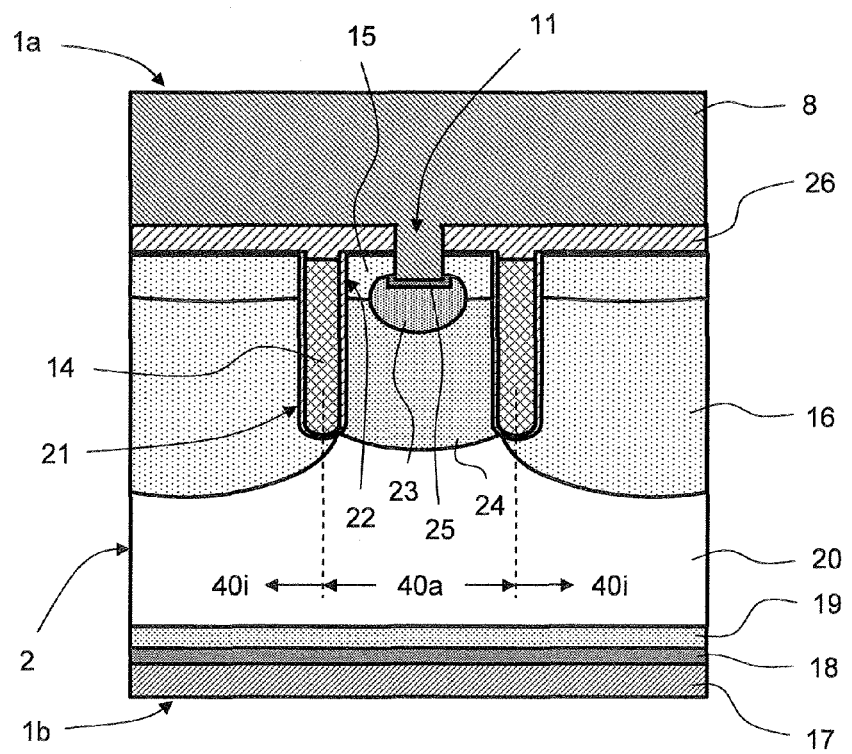
FIG. 43 is a device sectional view corresponding to a section taken along line E-E' of FIG. 41.

FIG. 41 is an enlarged top view corresponding to FIG. 7 for describing the device structure of the eighth embodiment (local N+ type floating-inactive section structure at active cell two-dimensional thinned-out structure) of the present application. FIG. 42 is a device sectional view corresponding to a section taken along line D-D' of FIG. 41. FIG. 43 is a device sectional view corresponding to a section taken along line E-E' of FIG. 41. The device structure of the eighth embodiment (local N+ type floating-inactive section structure at active cell two-dimensional thinned-out structure) of the present application will be explained based on these.

As shown in FIG. 41, unlike FIG. 30, an N+ type floating region 29 (first conductivity type floating region) corresponding to an N+ type emitter region 12 is provided not only in a linear active cell area 40*a* but also in a linear inactive cell area 40*i* portion corresponding to an active section 40*aa*. That is, the N+ type floating region 29 is formed in the same process as the N+ type emitter region 12 and simultaneously therewith, for example. Thus, the linear inactive cell area 40*i* is separated into a first conductivity type floating region formation section formed with the N+ type floating region 29 and a first conductivity type floating region non-formation section formed with no N+ type floating region 29 in its longitudinal direction.

Some of electrons injected from each MOSFET portion in the IGBT reaches even the N+ type floating region 29 via both an accumulation layer that can be formed in an N type layer portion of a trench sidewall, and an inversion layer that can be formed in a P type sidewall portion, and are implanted in the corresponding P type floating region 16. When the IGBT is turned off in this state, the electrons recombine with their corresponding holes remained in the P type floating region 16, followed by being annihilated. It is thus possible to reduce a switching loss at its off.

Thus, the section taken along line D-D' of FIG. 41 is nearly identical to FIG. 31 except that as shown in FIG. 42, the N+ type floating region 29 is provided in the surface 1*a* of the semiconductor substrate of the active section 40*aa* in the linear inactive cell area 40*i*. On the other hand, the section taken along line E-E' of FIG. 41 is nearly identical to FIG. 32 as shown in FIG. 43.

11. Description of Device Structure of Ninth Embodiment (N+ Type Floating-Inactive Section Structure at Active Cell Two-Dimensional Thinned-Out Structure) of the Present Application (Refer Principally to FIGS. 44 and 45):

An example described in this section is a modification of the plane layout of FIG. 41, for example.

A planar structure shown herein can be applied to the sectional structure of each of the unit cell structures in FIGS. 2, 3 and 8, and FIGS. 27 through 29, for example. In this section, one example thereof will be explained.

Figure 44:
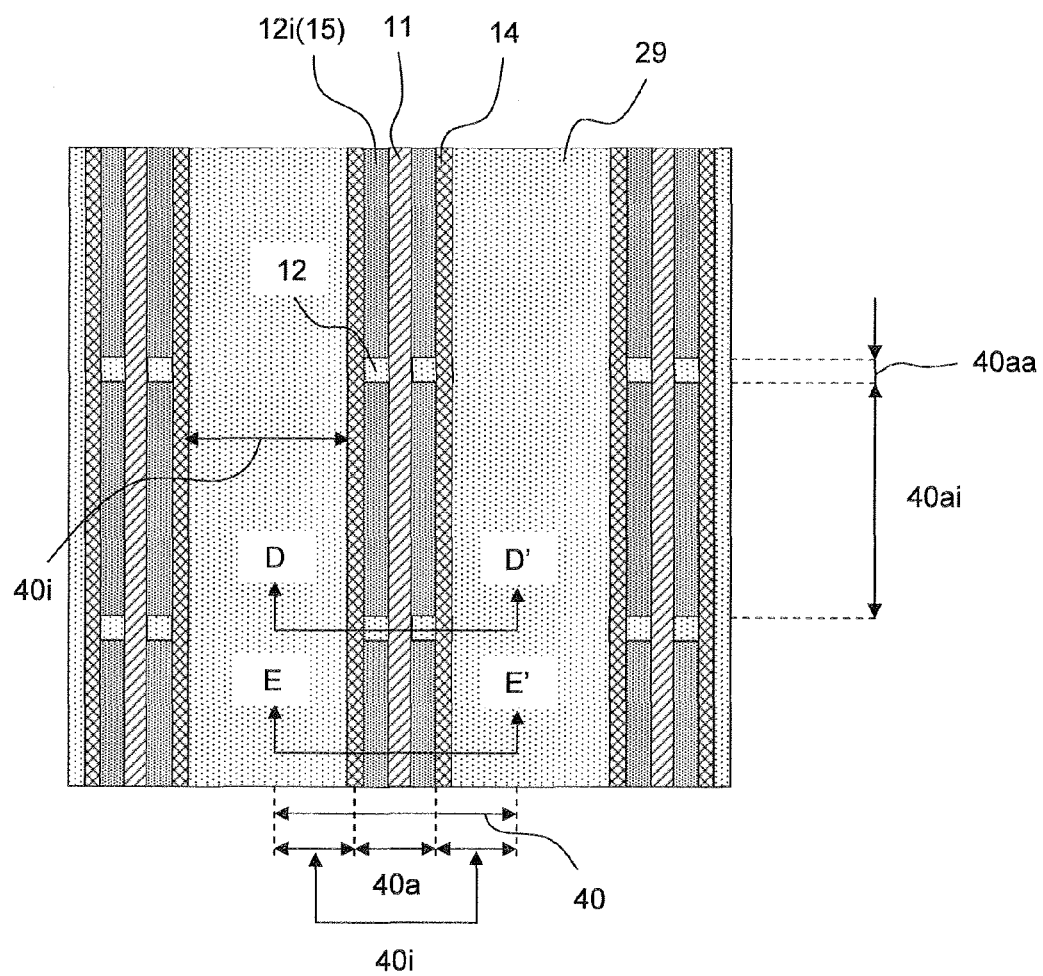
FIG. 44 is an enlarged top view corresponding to FIG. 7 for describing a device structure of a ninth embodiment (full N+ type floating-inactive section structure at active cell two-dimensional thinned-out structure) of the present application.
Figure 45:
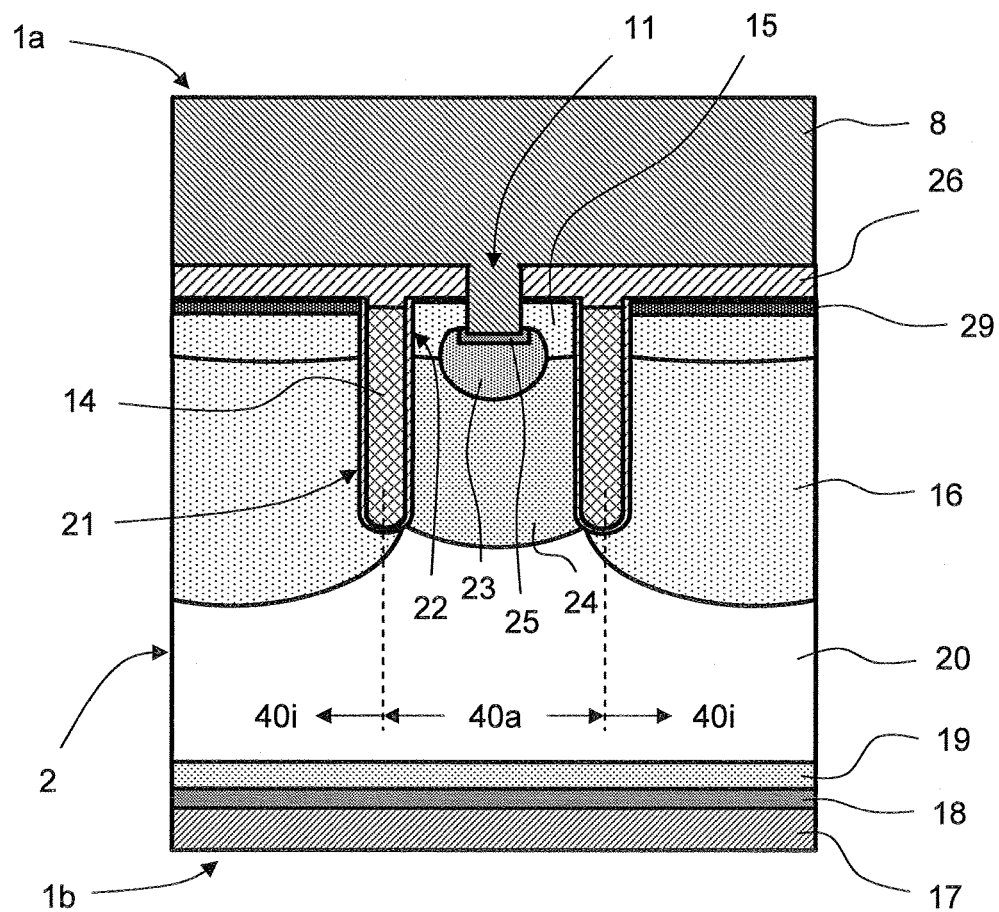
FIG. 45 is a device sectional view corresponding to a section taken along line E-E' of FIG. 44.

FIG. 44 is an enlarged top view corresponding to FIG. 7 for describing the device structure of the ninth embodiment (full N+ type floating-inactive section structure at active cell two-dimensional thinned-out structure) of the present application. FIG. 45 is a device sectional view corresponding to a section taken along line E-E' of FIG. 44. The device structure of the ninth embodiment (full N+ type floating-inactive section structure at active cell two-dimensional thinned-out structure) of the present application will be explained based these.

As shown in FIG. 44, in the present example, an N+ type floating region 29 is provided in the surface 1a of the semiconductor substrate corresponding approximately to the entirety of the corresponding inactive cell area 40i unlike FIG. 41. Thus, the section taken along line D-D' of FIG. 44 is nearly identical to FIG. 42. On the other hand, the section taken along line E-E' of FIG. 44 is different from FIG. 43 as shown in FIG. 45. The N+ type floating region 29 is provided in the surface 1a of the semiconductor substrate in the linear inactive cell area 40i. With the provision of such a structure, a path for the injection of electrons into the P type floating region 16 of the linear inactive cell area 40i such as previously described in FIG. 41 can be made broad.

12. Description of Device Structure of Tenth Embodiment (Full N+ Type Floating-Inactive Section & Local Active Section-Active Subblock Structure at Active Cell Two-Dimensional Thinned-Out Structure) of the Present Application (Refer Principally to FIGS. 46 through 48):

An example described in this section relates to a combination of FIGS. 33 and 44 and its modification, for example.

A planar structure shown herein can be applied to the sectional structure of the unit cell structure in each of FIGS. 2, 3 and 8, and FIGS. 27 through 29. In this section, one example thereof will be explained.

Figure 46:
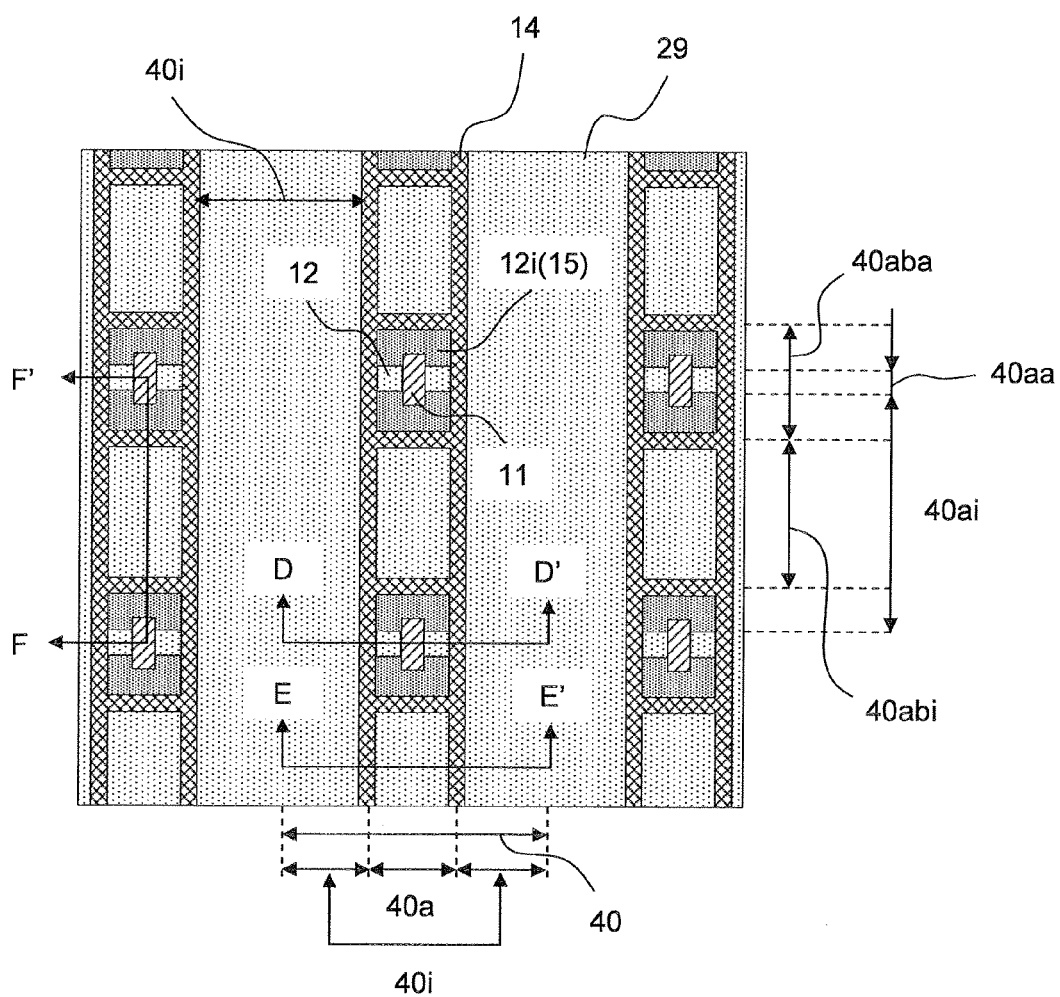
FIG. 46 is an enlarged top view corresponding to FIG. 7 for describing a device structure of a tenth embodiment (full N+ type floating-inactive section & local active section-active subblock structure at active cell two-dimensional thinned-out structure) of the present application.
Figure 47:
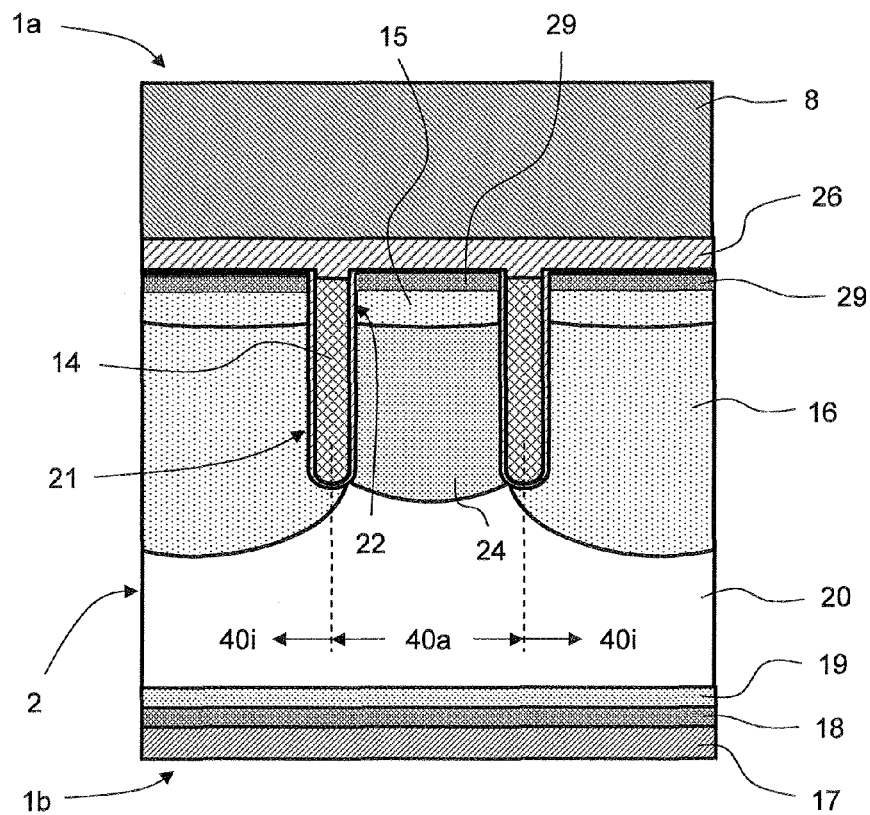
FIG. 47 is a device sectional view corresponding to a section taken along line E-E' of FIG. 46.
Figure 48:
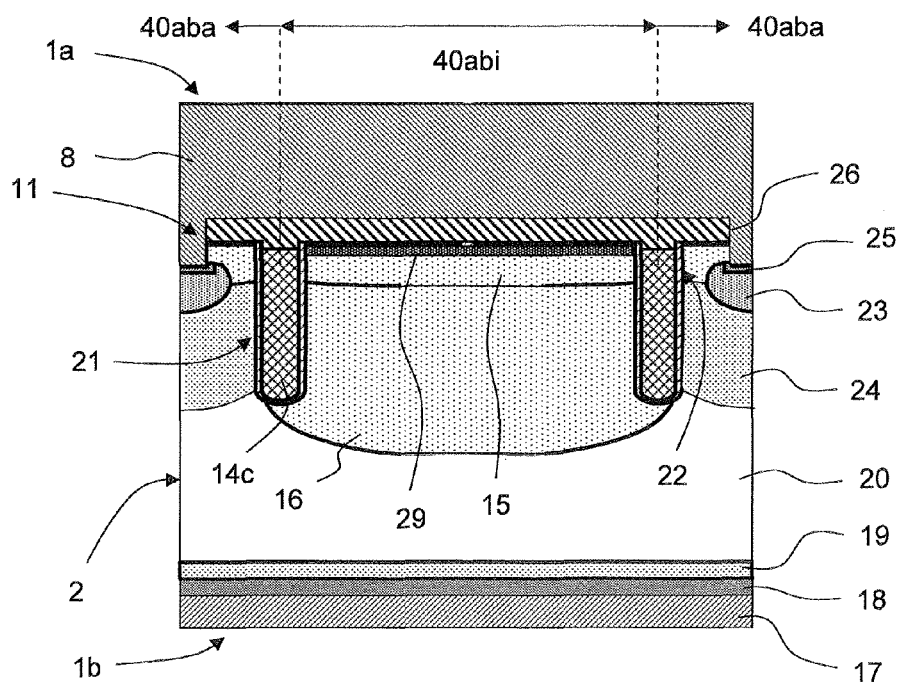
FIG. 48 is a device sectional view corresponding to a section taken along line F-F' of FIG. 46.

FIG. 46 is an enlarged top view corresponding to FIG. 7 for describing the device structure of the tenth embodiment (full N+ type floating-inactive section & local active section-active subblock structure at active cell two-dimensional thinned-out structure) of the present application. FIG. 47 is a device sectional view corresponding to a section taken along line E-E' of FIG. 46. FIG. 48 is a device sectional view corresponding to a section taken along line F-F' of FIG. 46. The device structure of the tenth embodiment (full N+ type floating-inactive section & local active section-active subblock structure at active cell two-dimensional thinned-out structure) of the present application will be explained based on these.

In the present example, as shown in FIG. 46, the structure of an active subblock 40aba in a linear active cell area 40a is nearly identical to FIG. 33, whereas the structure of a linear inactive cell area 40i is nearly identical to FIG. 44. Additionally, an N+ type floating region 29 is provided in the surface 1a of the semiconductor substrate corresponding approximately to the entirety of an inactive subblock 40abi in the linear active cell area 40a. With the provision of such a structure, a path for the injection of electrons into the P type floating region 16 of the inactive subblock 40abi such as described previously in FIG. 41 can be made broad.

Thus, a section taken along line D-D' of FIG. 46 is approximately identical to FIG. 42. In the section taken along line E-E' of FIG. 46, as shown in FIG. 47, an N+ type floating region 29 is provided in the surface 1a of the semiconductor substrate in each of the linear inactive cell area 40i and the linear active cell area 40a unlike FIG. 39. In the section taken along line F-F' of FIG. 46, an N+ type floating region 29 is provided in the surface 1a of the semiconductor substrate at the inactive subblock 40abi unlike FIG. 36.

13. Description of Device Structure of Eleventh Embodiment (Back Surface Aluminum-Doped Structure) of the Present Application and its Manufacturing Method (Refer Principally to FIG. 49):

An example described in this section relates to a back-surface side structure of a semiconductor substrate. Examples other than this section all relate to a surface-side structure of the semiconductor substrate. Thus, the example of this section can be applied to all other examples other than this section. It is needless to say that the present example can be applied even to other general IGBTs or the like each having a surface-side structure.

In this section, the device structure will be explained in accordance with the example of the section 2 for convenience of explanation. Its process will briefly be explained referring to the section 3.

Incidentally, the IE-type trench gate IGBT will specifically be described below. This back surface structure is not limited to an IE-type IGBT and a trench gate IGBT. It is needless to say that it can be applied even to IGBTs or the like of other forms.

FIG. 49 is a local detailed sectional view of a device back surface for describing the device structure of the eleventh embodiment (back surface aluminum-doped structure) of the present application and its manufacturing method. The device structure of the eleventh embodiment (back surface aluminum-doped structure) and its manufacturing method will be explained based on it.

The back side of the semiconductor chip 2 shown in FIG. 8 and its adjacent sectional enlarged view (one in which the structure lying in the neighborhood of the back surface as viewed in the thickness direction of the chip is typically shown in enlarged form) are shown in FIG. 49. As shown in FIG. 49, a relatively thin P type semiconductor region (about 0.04 to 0.1 micrometers in thickness, for example), i.e., an aluminum-doped region 30 (second conductivity type high-concentration collector contact region) is provided in the semiconductor region at the lower end of the P+ type collector region 18 on the back surface side of the semiconductor substrate 2. An impurity concentration ($1 \times 10^{19}$/cm$^3$ or so, for example) is higher than that of the P+ type collector region 18. A metal collector electrode 17 is formed over the back surface 1b of the semiconductor substrate 2 in contact with the aluminum-doped region 30. If one example thereof is shown, it is made up of the following components as viewed from near the semiconductor substrate 2. That is, they are an aluminum back-surface metal film 17a (600 nm or so in thickness, for example) that serves as an impurity source for the aluminum-doped region 30, a titanium back-surface metal film 17b (100 nm or so in thickness, for example), a nickel back-surface metal film 17c (600 nm or so in thickness, for example), and a metal back-surface metal film 17d (100 nm or so in thickness, for example).

The manufacturing method will next be described. Upon the process of FIG. 26 in the section 3, i.e., sputtering deposition, the aluminum back-surface metal film 17a, the titanium back-surface metal film 17b, the nickel back-surface metal film 17c and the metal back-surface metal film 17d are sputter-deposited sequentially. Aluminum is introduced into its corresponding silicon substrate by heat generated upon the sputtering deposition so that the aluminum-doped region 30 is formed. Dividing the semiconductor wafer 1 into each chip area by dicing or the like after its formation results in such one as shown in FIG. 8 (its detailed structure is not manifested in FIG. 8).

Each of the embodiments of the present application shows the structure in which holes are accumulated on the emitter side in the on state and the injection of the holes is promoted. On the other hand, the PN diode on the back collector side is configured as a diode low in injection efficiency in reverse to thereby achieve a reduction in switching loss. Here, in order to form the back surface diode having the low injection efficiency, a reduction in the ratio (hereinafter called a "carrier concentration ratio") between a carrier concentration Qp of the P+ type collector region 18 and a carrier concentration Qn of the N type filed stop region 19, i.e., (Qp/Qn) is effective. When the carrier concentration Qp of the P+ type collector region 18 is however excessively lowered to this end, the characteristic of the back-surface metal contact is degraded. Thus, in the present example, there is provided the aluminum-doped region 30 higher in impurity concentration than the P+ type collector region 18 introduced from the aluminum film at the back surface. As the carrier concentration ratio, there can be illustrated as a preferred one, for example, 1.5 or so (e.g., about 1.1 to 4 as a range). Each embodiment of the present application provides the structure for accumulating the holes on the emitter side in the on state and promoting the injection of the holes. At this time, the holes injected from the surface side reach the back collector side and promote the injection of holes from the back surface PN diode. Further, the injected holes reach the surface and promote the injection of electrons from the surface side. When each embodiment of the present application is used, conductivity modulation of the N− type drift region 20 becomes easy to occur due to such a positive feedback phenomenon. Therefore, even if the PN diode on the back collector side is designed to such specs that it becomes low in injection efficiency, a device hard to cause an increase in on voltage can be achieved.

14. Description of Device Structure of Twelfth Embodiment (Cell Area Peripheral Structure: Dummy Cell & Peripheral Junction Contact Structure) of the Present Application (Refer Principally to FIGS. 50 through 52):

The sections 14 through 16 will show various examples illustrative of the end structure of the cell area 10 described in FIG. 2 and the like. In this section, the example approximately corresponding to FIG. 2 will first be described.

Figure 50:
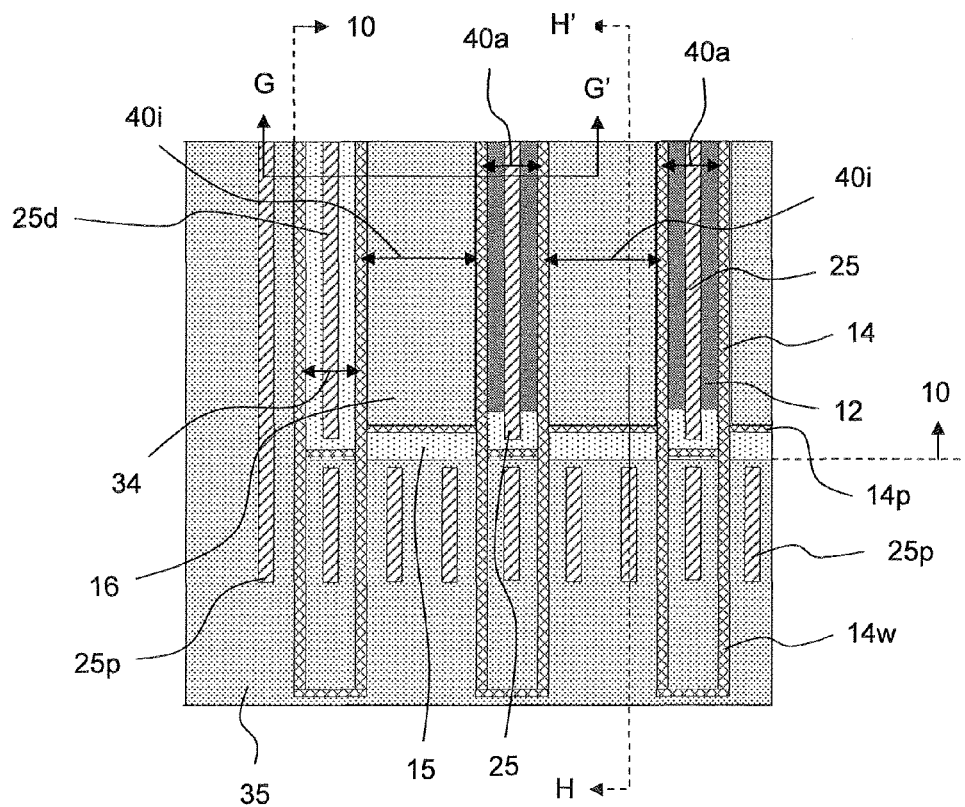
FIG. 50 is an enlarged top view of a cell area corner cutout region R4 of FIG. 6 for describing a device structure of a twelfth embodiment (cell area peripheral structure: dummy cell & peripheral junction contact structure) of the present application.
Figure 51:
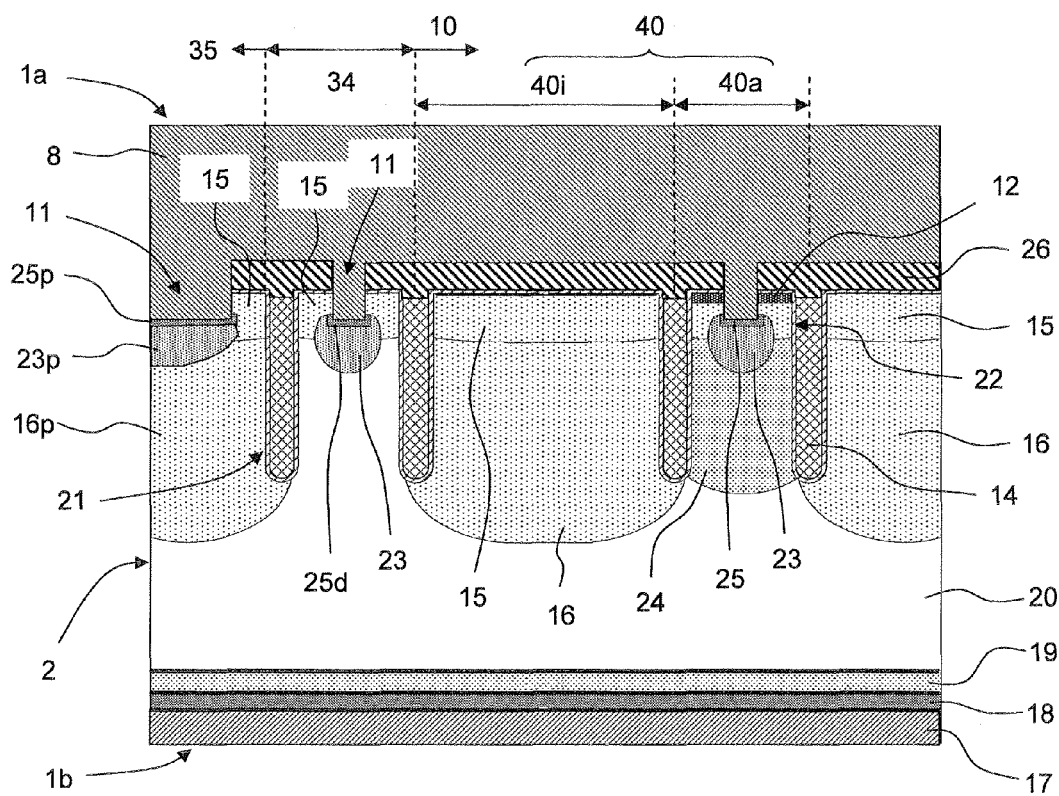
FIG. 51 is a device sectional view corresponding to a section taken along line G-G' of FIG. 50.
Figure 52:
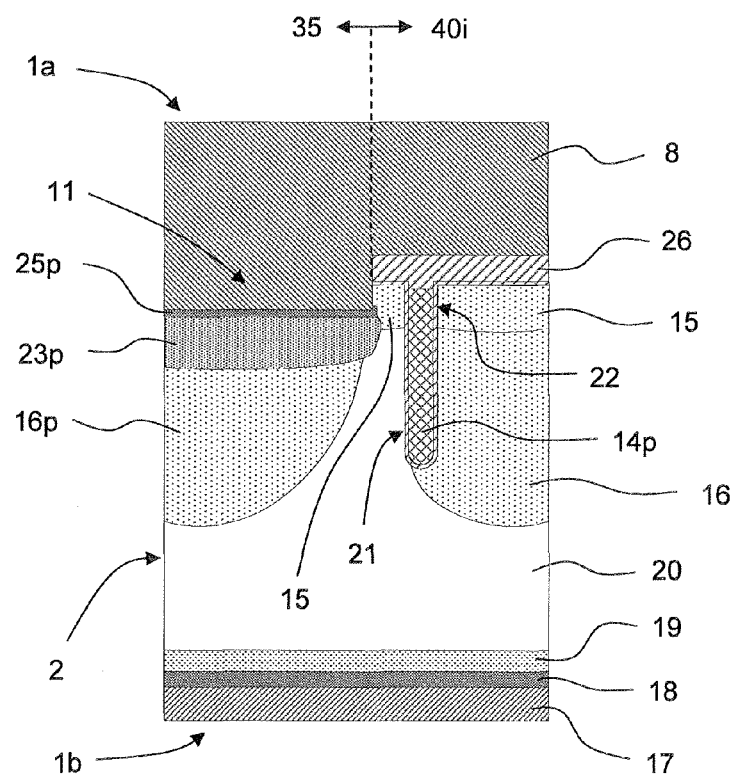
FIG. 52 is a device sectional view corresponding to a section taken along line H-H' of FIG. 50.

FIG. 50 is an enlarged top view of a cell area corner cutout region R4 of FIG. 6 for describing the device structure of the twelfth embodiment (cell area peripheral structure: dummy cell & peripheral junction contact structure) of the present application. FIG. 51 is a device sectional view corresponding to a section taken along line G-G' of FIG. 50. FIG. 52 is a device sectional view corresponding to a section taken along line H-H' of FIG. 50. The device structure of the twelfth embodiment (cell area peripheral structure: dummy cell & peripheral junction contact structure) of the present application will be explained based on these.

As shown in FIG. 50, a single to a few dummy cell areas 34 (linear dummy cell areas) are provided at the end of the cell area 10 in the widthwise direction of each linear unit cell area 40 (refer to FIG. 4) (in the width direction of each of the linear active cell areas 40*a*, linear inactive cell areas 40*i* and the like). A P+ type body contact region 25*d* is provided in the dummy cell area 34 in a manner similar to the linear active cell area 40*a*.

On the other hand, an area not formed with an end trench gate electrode 14*p* and an N+ type emitter region 12 and the like relatively narrow in width (width of the same degree as the linear active cell area 40*a*) (no N type hole barrier region 24 is formed either in this example) is provided at the longitudinal end of the linear unit cell area 40 (refer to FIG. 4) as each end buffer area inclusive of the area in which the previous dummy cell area 34 is provided. A ring-shaped P type cell peripheral junction area 35 (second conductivity type cell peripheral junction area) is provided outside these end buffer areas so as to surround these. A P type cell peripheral region 16*p* that configures the P type cell peripheral junction area 35 is formed in the same process as the P type floating region 16 simultaneously therewith, for example.

Each trench gate electrode 14 extends over the P type cell peripheral junction area 35 from the cell area 10 as a gate lead-out portion 14*w*. A number of P+ type body contact regions 25*p* each having a structure similar to the cell area 10 are provided within the P type cell peripheral junction area 35.

The section taken along line G-G' of FIG. 50 is next shown in FIG. 51. As shown in FIG. 51, the linear unit cell area 40 is identical to one described in FIG. 8 or the like. On the other hand, the cell peripheral portions are also basically identical to those described in FIG. 2 and the like, but will be explained in further detail. P type body regions 15 are provided in the surface 1*a* of the semiconductor substrate 2 in the dummy cell area 34 and the P type cell peripheral junction area 35 (inclusive of up to the floating field ring portion shown in FIG. 2). A contact groove 11 (or contact hole) or the like is provided in the dummy cell area 34, and an emitter contact is also provided therein. Further, a P+ type body contact region 25*d* and a P+ type latchup prevention region 23 are also provided in the dummy cell area 34. The present example is the same structure as the linear active cell area 40*a* except that the N type hole barrier region and the N+ type emitter region 12 are not provided.

In the P type cell peripheral junction area 35, a contact groove 11 (or contact hole) or the like is likewise provided. A P+ type body contact region 25*p* and a P+ type latchup prevention region 23*p* are also provided. A P type cell peripheral region 16*p* is also provided below the P type body region 15. This P type cell peripheral region 16*p* is formed simultaneously with the P type floating region 16 in the linear unit cell area 40 by the same process as the P type floating region 16, for example.

Next, the section taken along line H-H' of FIG. 50 is shown in FIG. 52. As shown in FIG. 52, the P type body region 15 is provided in the surface 1*a* of the semiconductor substrate 2 in the linear inactive cell area 40*i* and the P type cell peripheral junction area 35 or the like in a manner approximately similar to FIG. 51. An end trench gate electrode 14*p* is provided in the neighborhood of the boundary between the linear inactive cell area 40*i* and the P type cell peripheral junction area 35 and serves as part of the end buffer area. A P type floating region 16 is provided on the lower side of the P type body region 15 lying below the linear inactive cell area 40*i*. The P type floating region 16 is deeper in depth than the trench 21 in a manner similar to other portions and covers the lower end of the trench 21 in which the end trench gate electrode 14*p* is accommodated.

Further, in a manner similar to FIG. 51, a contact groove 11 (or contract hole) or the like is provided even at the P type cell peripheral junction area 35 portion, and an emitter contact is also provided thereat. A P+ type body contact region 25*p* and a P+ type latchup prevention region 23*p* are provided in the surface region of the semiconductor substrate 2 located below the emitter contact. A P type cell peripheral region 16*p* is provided therebelow in a manner similar to other portions.

15. Description of Device Structure of Thirteenth Embodiment (Cell Area Peripheral Structure: Broad-Area Peripheral Junction Structure) of the Present Application (Refer Principally to FIGS. 53 and 54):

An example described in this section is one modification of the example described in the section 14.

The example described in this section is of the modification of the example described in the section 14 and is characterized in that a P type floating region lying below a cell peripheral junction area extends to below a dummy cell area.

Figure 53:
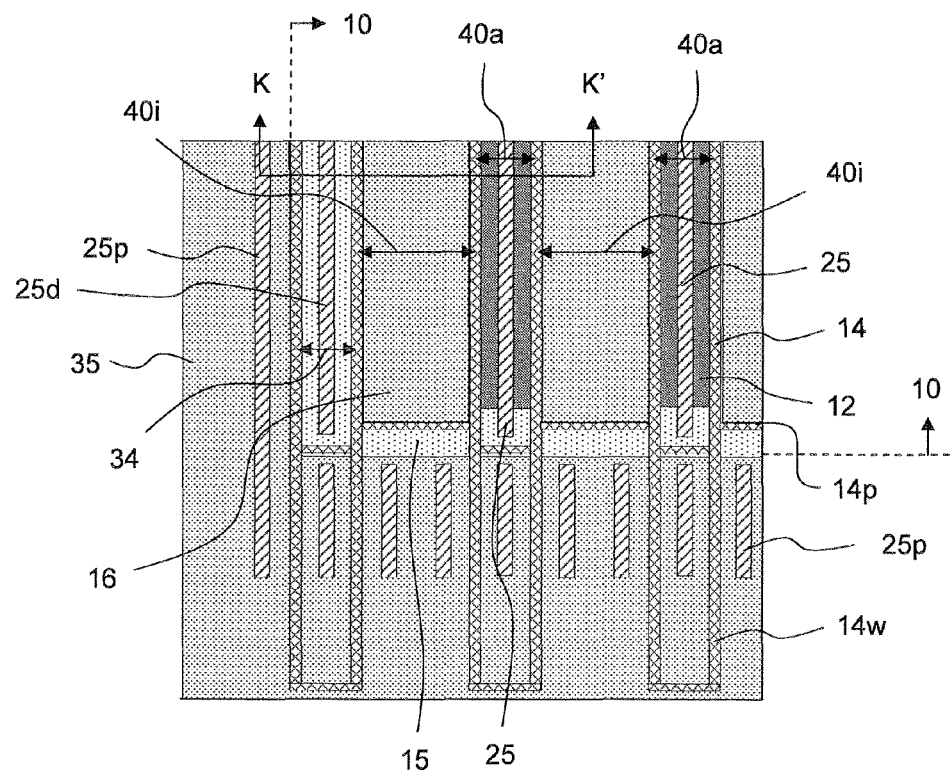
FIG. 53 is an enlarged top view of the cell area corner cutout region R4 of FIG. 6 for describing a device structure of a thirteenth embodiment (cell area peripheral structure: broad-area peripheral junction structure) of the present application.
Figure 54:
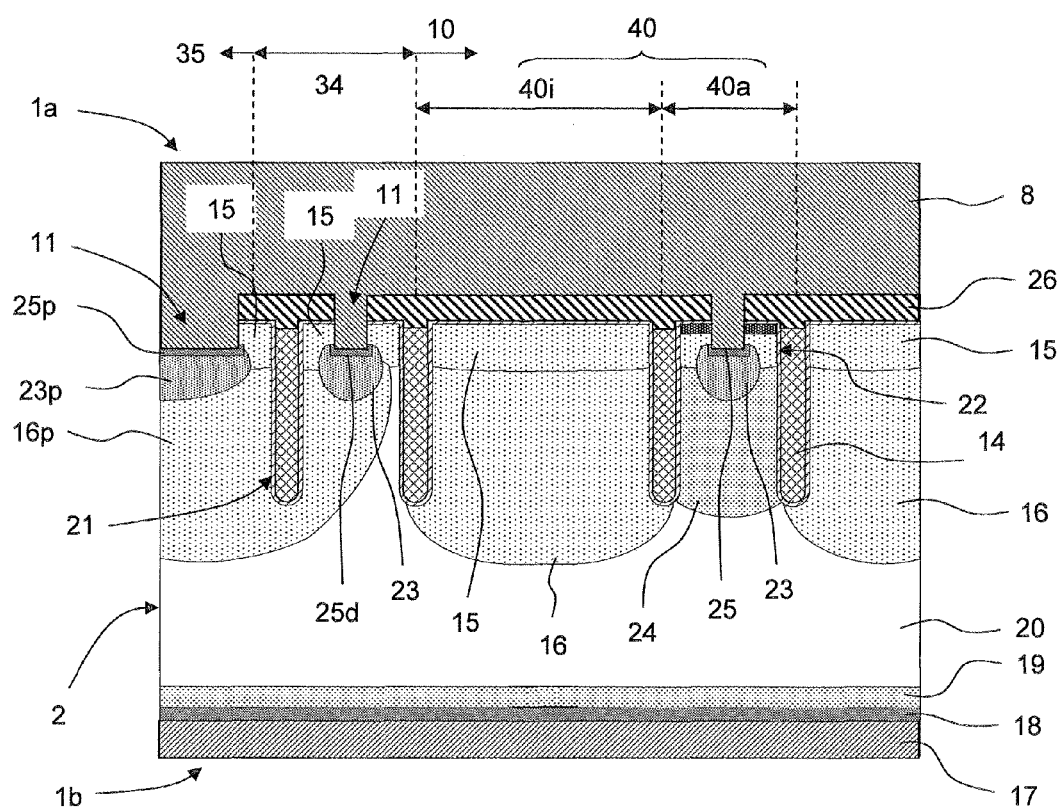
FIG. 54 is a device sectional view corresponding to a section taken along line K-K' of FIG. 53.

FIG. 53 is an enlarged top view of the cell area corner cutout region R4 of FIG. 6 for describing the device structure of the thirteenth embodiment (cell area peripheral structure: broad-area peripheral junction structure) of the present application. FIG. 54 is a device sectional view corresponding to a section taken along line K-K' of FIG. 53. The device structure of the thirteenth embodiment (cell area peripheral structure: broad-area peripheral junction structure) of the present application will be explained based on these.

A plane layout is shown in FIG. 53. This is nearly similar to FIG. 50. They are different from each other in terms of FIG. 54 (corresponding to FIG. 51) that shows the section taken along line K-K' of FIG. 53. That is, unlike FIG. 51, a P type floating region 16$p$ lying below a cell peripheral junction area 35 extends to below a dummy cell area 34.

16. Description of Device Structure of Fourteenth Embodiment (Cell Area Peripheral Structure: Under-Dummy Cell Hole Barrier Structure) of the Present Application (Refer Principally to FIG. 55):

An example described in this section is another modification of the example described in the section 14 and is characterized in that an N type hole barrier region is provided even in a dummy cell area.

Figure 55:
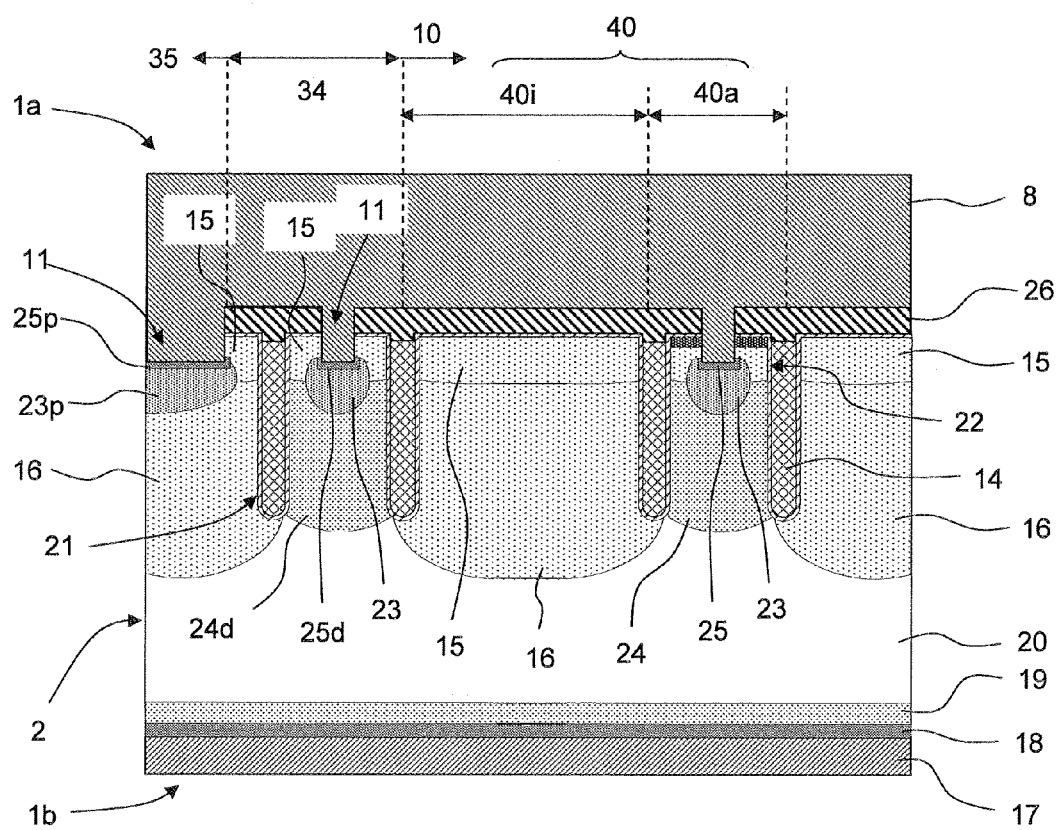
FIG. 55 is a device sectional view corresponding to a section taken along line G-G' of FIG. 50 for describing a device structure of a fourteenth embodiment (cell area peripheral structure: under-dummy cell hole barrier structure) of the present application.

FIG. 55 is a device sectional view corresponding to the section taken along line G-G' of FIG. 50 for describing the device structure of the fourteenth embodiment (cell area peripheral structure: under-dummy cell hole barrier structure) of the present application. The device structure of the fourteenth embodiment (cell area peripheral structure: under-dummy cell hole barrier structure) of the present application will be explained based on it.

The characteristics of the sectional structure of this example are shown in FIG. 55 (corresponding to FIG. 51) which shows the section taken along line K-K' of FIG. 53. As shown in FIG. 55, in the present example, the N type hole barrier region 24$d$ is added below the dummy cell area 34.

17. Consideration Related to the Whole of the Present Application and Supplementary Explanations Related to the Respective Embodiments:

The present inventors et al of the present application have manifested the following design guidelines (at least one of these has been carried out in the embodiment of the present application) under consideration for achieving further improvements in hole storage effects in the IE-type trench gate IGBT. A device having an N-type drift region (N-base region) will concretely be explained below:

(1) In a narrow active cell IE-type trench gate IGBT, a P type region deeper in depth than a P type body region lying underneath an inactive cell area is subjected to floating to thereby facilitate accumulation of holes. That is to say; the introduction of "deep floating P region".

(2) A channel region, i.e., a P type body region is made shallow to thereby increase the distance between the channel deepest portion and the trench deepest portion, thus making long an exit path of each hole (limitation of hole current). In order to realize a device low in on resistance, there is a need to improve electron injection efficiency. To this end, however, it is necessary to reduce the hole current. That is, it is necessary to prevent holes accumulated in an upper end of an N base region from being discharged in an emitter direction.

(3) A trench is deepened due to the same reason as (2). (2) and (3) are combined together to achieve, that is, "deep trenching (limitation of hole current)".

(4) The interval between the trenches located on both sides of an active cell area is narrowed to thereby make narrow an exit path of each hole. That is; "narrow active cell assembling (limitation of hole current)". This also results in "broad inactive cell assembling" in a sense.

(5) An N type hole barrier is introduced underneath the active cell area to thereby inhibit the exit of holes through the emitter. That is to say; "the introduction of hole barrier (limitation of hole current)".

(6) The thickness of an N-type drift region is made thin to thereby increase a hole concentration. That is to say; "chip thinning" (incidentally, the concentration of an electric field on the bottom of a trench increases depending on the thinning).

(7) The lengthwise direction of the active cell area is substantially restricted (the introduction of active section and inactive section). That is to say; "the introduction of active cell two-dimensional thinned-out structure (limitation of hole current)".

(8) A reduction in breakdown voltage is prevented by an improvement in cell peripheral contact or the like. That is to say; "the introduction of structure for cell peripheral contact or the like".

(9) Hole injection efficiency of a back surface diode is reduced while ensuring the contact characteristics of a back surface. That is to say; "the introduction of aluminum high-concentration doped layer and back-surface low injection efficiency enhancing".

Of these, a change in breakdown voltage becomes gentle by the introduction of the deep floating P region (this is because the trench lower end at which a field intensity rises rapidly when a parameter such as the width of the inactive cell area 40$i$ is made broad, is covered with the deep floating P region so that the concentration of an electric field is relaxed). Thus, the degree of design freedom on improvements in hole storage efficiency by internal structures related to deep trenching, narrow active cell assembling, broad inactive cell assembling, the introduction of a hole barrier, chip thinning, the introduction of an active cell two-dimensional thinned-out structure, etc. increases. Accordingly, the improvements in hole storage efficiency by these internal structures can be applied even independently of the introduction of the deep floating P region, but the characteristics of a device can be improved efficiently by their combinations.

On the other hand, measures against the improvements in hole storage efficiency may cause the degradation of switching characteristics. Therefore, when these demerits are complemented by the introduction of an aluminum high-concentration doped layer and back-surface low injection efficiency enhancing or the like, the hole storage efficiency can greatly be improved while avoiding the demerits. It is however needless to say that the introduction of the aluminum high-concentration doped layer and the back-surface low injection efficiency enhancing or the like such as described above are not essential. Accordingly, the introduction of the aluminum high-concentration doped layer and the back-surface low injection efficiency enhancing can also be carried out independently of the introduction of the deep floating P region, hole storage efficiency enhancing by an internal structure other than this, and the like.

Figure 56:
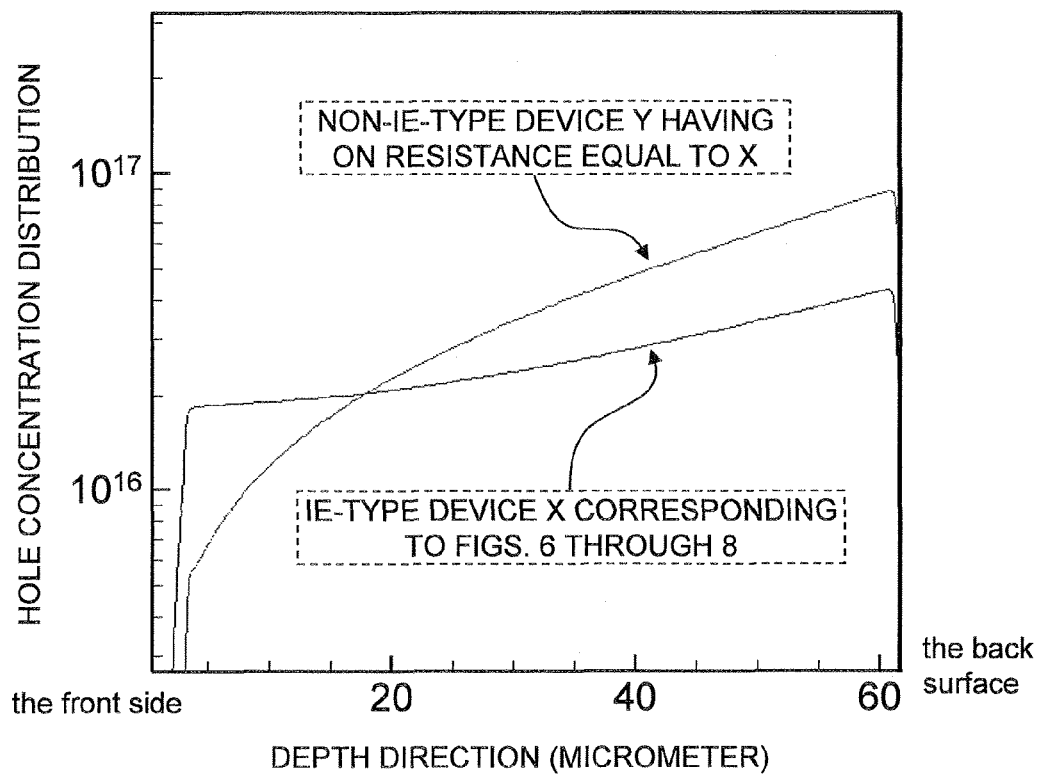
FIG. 56 is a hole concentration distribution in depth directions of an IE-type trench IGBT device "X" corresponding to FIGS. 6 to 8 and a non-IE-type trench IGBT device "Y" (comparison example) having an on resistance and the like equivalent thereto.
Figure 57:
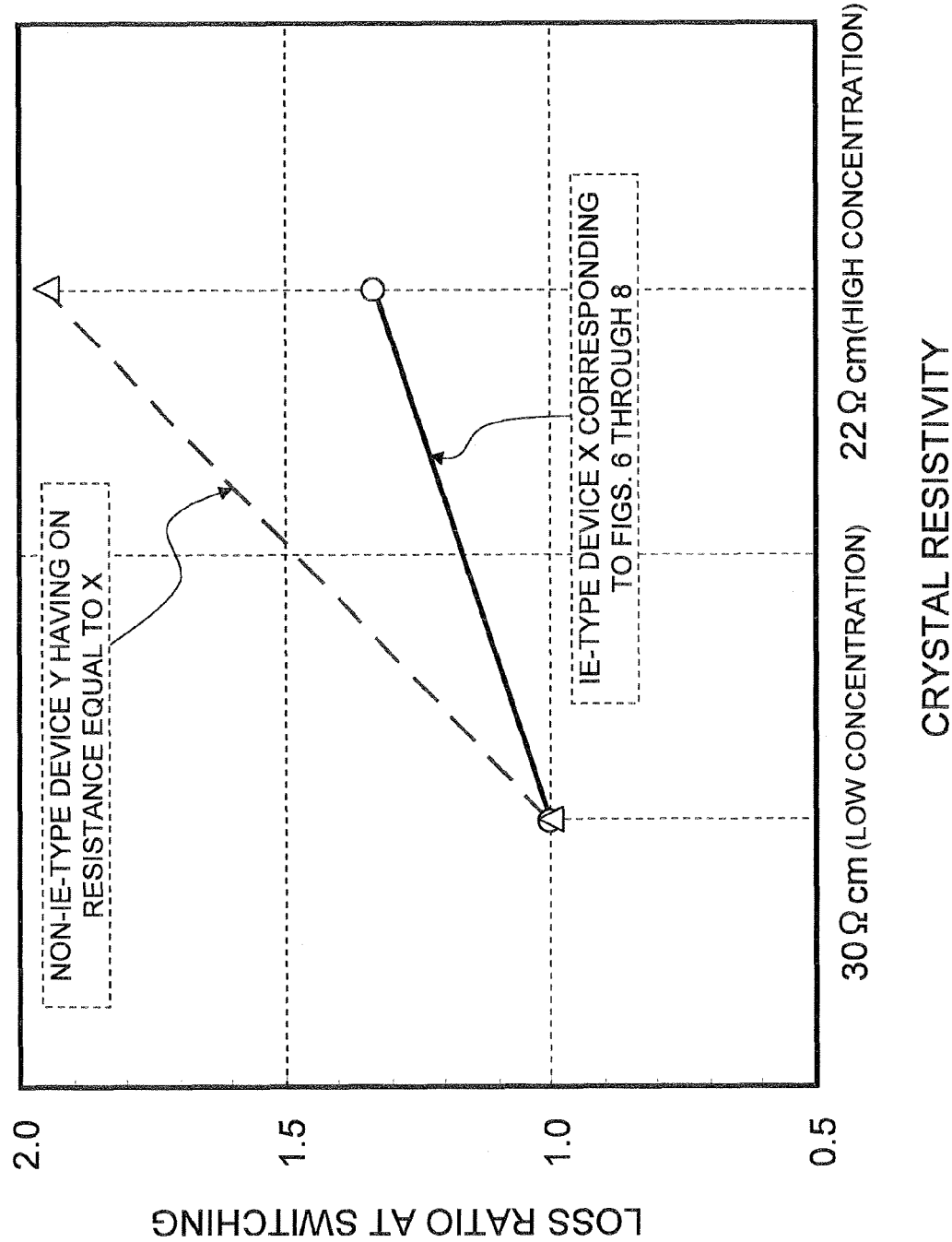
FIG. 57 is a plot diagram showing changes in the rate (assuming as a reference where crystals of the devices are low in concentration) of switching losses where the crystal resistivities of the devices "X" and "Y" of FIG. 56 are changed.

18. Supplementary Explanations Related to Material Wafer (Refer Principally to FIGS. 56 and 57):

FIG. 56 is a hole concentration distribution (vertical axis: logarithmic scale) in the depth directions of an IE-type trench IGBT device "X" corresponding to FIGS. 6 to 8 and a non-IE-type trench IGBT device "Y" (comparison example) having an on resistance and the like equivalent thereto. FIG. 57 is a plot diagram showing changes in the rate (assuming as a reference where crystals of the devices are low in concentration) of switching losses where the crystal resistivities of the devices "X" and "Y" of FIG. 56 are changed. The supplementary explanations related to the material wafer will be made based on these.

As a silicon monocrystal wafer for IGBT, there has generally been used one based on an FZ (Floating Zone) method. This is because an IGBT device important in switching characteristic needs an ingot which is a high resistance crystal easy for a depletion layer to extend in a drift region and is few in wafer-to-wafer variation in resistivity. That is, a CZ (Czochralski) method in which a wafer diameter is easy to increase, but the resistivity (impurity concentration) relatively greatly changes along the main axis of the ingot has been considered to be hard in device design and be generally hard to utilize the substantial full length of the ingot.

For example, the data plot shown in FIG. 57 is one in which the proportions in switching loss at the IE-type trench IGBT device "X" (e.g., 600 volts in breakdown voltage) corresponding to FIGS. 6 to 8 and the non-IE-type trench IGBT device "Y" having the on resistance equivalent thereto are compared. As shown in FIG. 57, in the IE-type trench IGBT device "X", the switching loss is shown as a change of about 30% when the resistivity is changed about 27% (corresponding to variations in the resistivity in the axial direction of the CZ crystal ingot), whereas in the non-IE-type trench IGBT device "Y", the swinging loss becomes a change of about 90% equivalent to three times the above change. Such a range of vibration is generally hard to be allowed as for a product.

This is because as shown in FIG. 56, the injection efficiency of the back surface diode must be increased to reduce the on resistance in the non-IE-type trench IGBT device "Y", whereas in the IE-type trench IGBT device "X", the whole hole distribution becomes relatively flat for the hole storage effects on the front side. Increasing the injection efficiency of the back surface diode in this way causes a demerit that the dependence of various characteristics on crystal concentration becomes steep.

Thus, the IE-type trench gate IGBT according to each embodiment of the present application is generally allowed as a product even depending on the crystals grown by the CZ method, and its device design is enabled. A problem however arises in that when the CZ crystal is annealed in the vicinity of 450° C., a Thermal Donor occurs so that a substantial N-type impurity capability or concentration rises. Thus, in this case, it is preferable to use, even among the CZ crystals, one grown by an MCZ (Magnetic Field Applied CZ) method which is relatively low in oxygen concentration. Even among MCZ crystals, the crystals grown by an HMCZ (Horizontal MCZ) method, a CMCZ (Cusp MCZ) method, etc. in particular are suitable in particular. The oxygen concentrations of these low oxygen MCZ crystals normally range from about $3 \times 10^{17}/cm^3$ to $7 \times 10^{17}/cm^3$. On the other hand, the oxygen concentration of an FZ (Floating Zone) crystal is normally $1 \times 10^{16}/cm^3$ or so. The oxygen concentration of a normal CZ crystal free of the use of a magnetic field is normally $1 \times 10^{18}/cm^3$ or so.

Incidentally, assuming that a range from about 600 volts to about 1200 volts in breakdown voltage is taken as the range for resistivity of a high resistance CZ crystal particularly adapted to the IGBT, the resistivity range becomes a range from about 20 Ωcm to about 85 Ωcm.

Thus, when the CZ crystal is used in the IGBT, the CZ crystal has a merit that it is strong in mechanical strength and resistant to thermal distortion unlike the FZ crystal low in oxygen concentration. The CZ crystal also has a merit that it is relatively easy for a wafer to increase in its diameter as compared with the FZ crystal. The more the increase in its diameter, the more the problem of thermal stress becomes important. Therefore, the usage of the CZ crystal is increasingly advantaged. When wafers each having the same diameter are compared in unit price, the CZ crystal is much cheaper (50% or so of FZ crystal in 8 inches).

Although not essential, it is advantageous for the IE-type trench IGBT device using the CZ crystal to reduce the injection efficiency of the back surface diode in terms of switching characteristics. It is advantageous to use the back-surface aluminum-based contact structure described in the section 13 (refer to FIG. 49). That is, even though the concentration of the P+ type collector region 18 (refer to FIG. 49) is reduced, a satisfactory contact can be ensured by the combination of the aluminum-doped region 30 and the aluminum back-surface metal film 17a.

Incidentally, the CZ crystal described in this section can be applied to all the embodiments described in the present application.

19. Supplementary Explanations Related to Cell Area Peripheral Structure (Refer Principally to FIGS. 58 and 59):

The description of this section is basically related to supplementary explanations related to the section 14.

Figure 58:
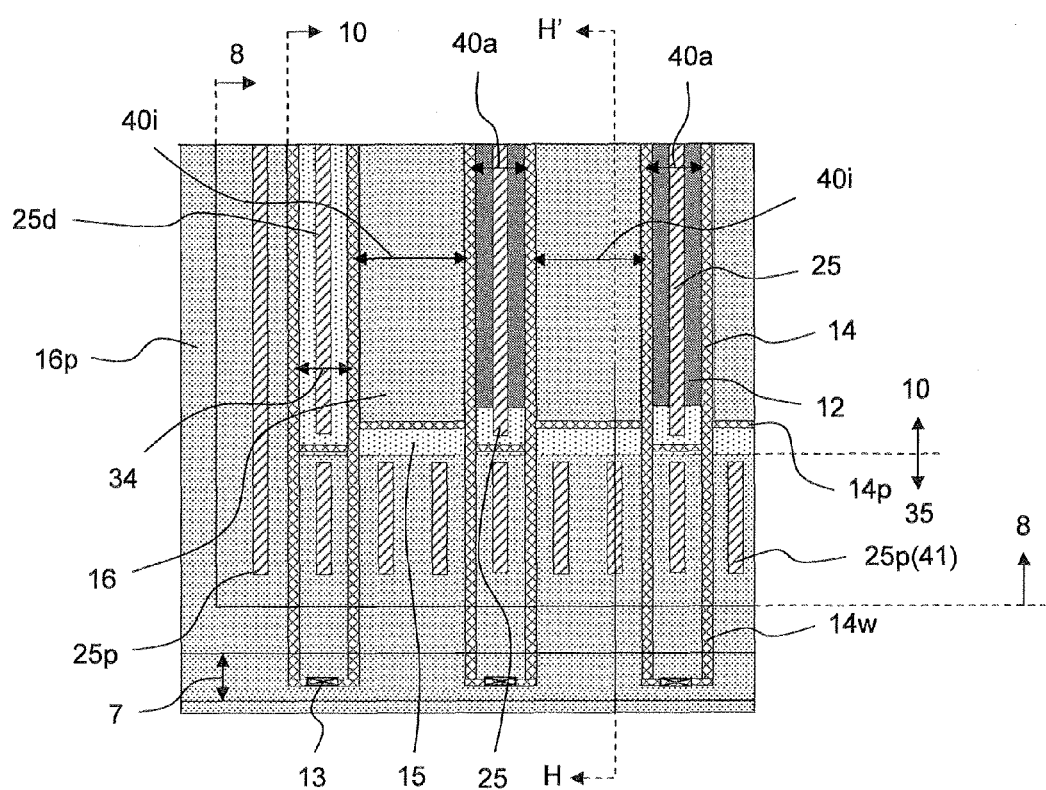
FIG. 58 is an enlarged top view of the cell area corner cutout region R4 of FIG. 6 and its periphery, which illustrates a portion (peripheral portion other than the cell area in particular) approximately identical to FIG. 50 in more detail.
Figure 59:
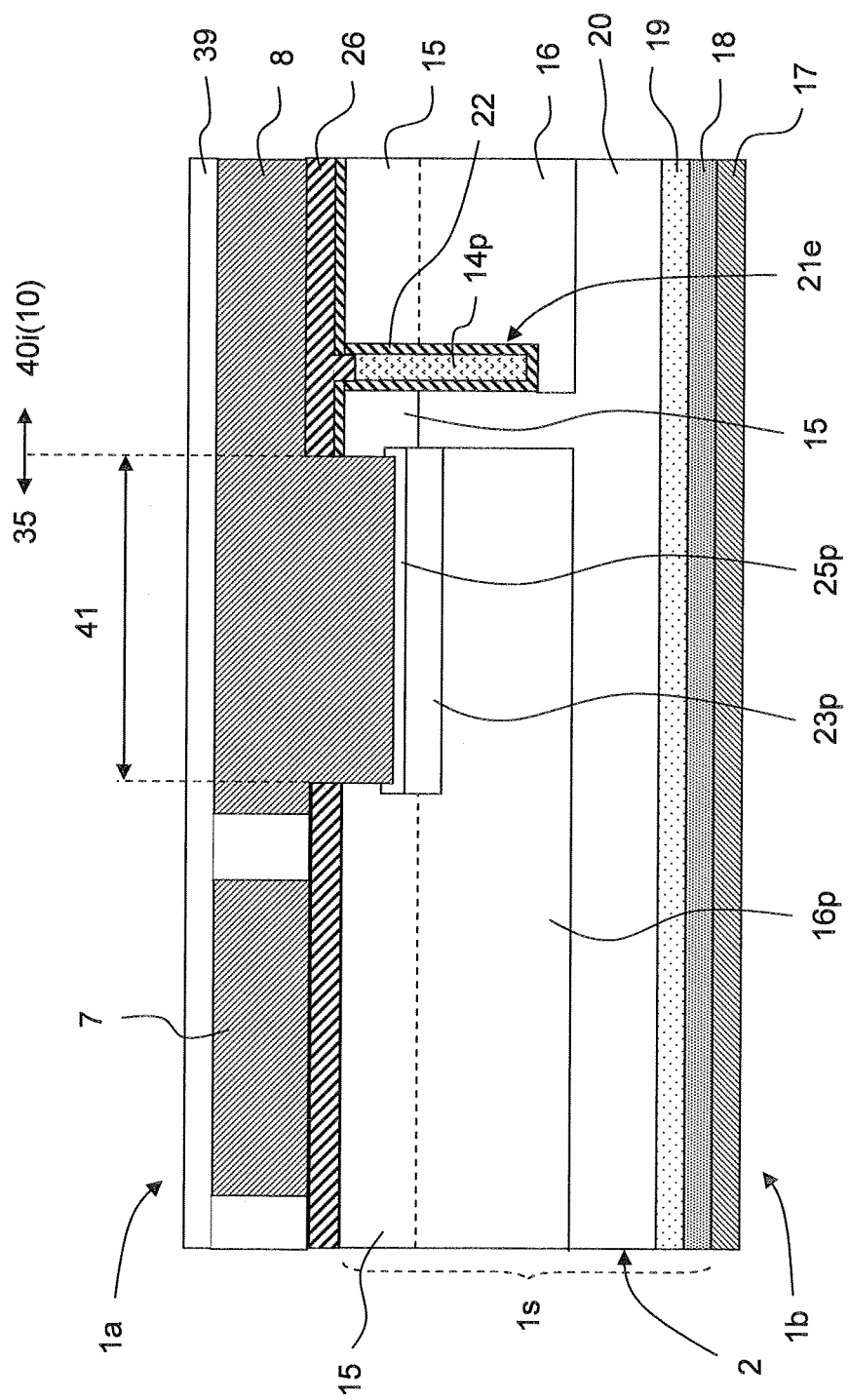
FIG. 59 is a device sectional view (corresponding nearly to FIG. 52) corresponding to a section taken along line H-H' of FIG. 50.

FIG. 58 is an enlarged top view of the cell area corner cutout region R4 of FIG. 6 and its periphery, which illustrates a portion (peripheral portion other than the cell area in particular) approximately identical to FIG. 50 in more detail. FIG. 59 is a device sectional view (corresponding nearly to FIG. 52) corresponding to the section taken along line H-H' of FIG. 50. The supplementary explanations related to the cell area peripheral structure will be made based on these.

As shown in FIG. 58, a single to a few dummy cell areas 34 (linear dummy cell areas) are provided at the end of the cell area 10 in the widthwise direction of each linear unit cell area 40 (refer to FIG. 4) (in the width direction of each of the linear active cell areas 40a, linear inactive cell areas 40i and the like). A P+ type body contact region 25d is provided in the dummy cell area 34 in a manner similar to the linear active cell area 40a.

On the other hand, an area not formed with an end trench gate electrode 14p and an N+ type emitter region 12 and the like relatively narrow in width (width of the same degree as the linear active cell area 40a) (no N type hole barrier region 24 is formed either in this example) is provided at the longitudinal end of the linear unit cell area 40 (refer to FIG. 4) as each end buffer area inclusive of the area in which the previous dummy cell area 34 is provided. A ring-shaped P type cell peripheral junction area 35 (second conductivity type cell peripheral junction area) is provided outside these end buffer areas so as to surround these. A P type cell peripheral region 16p (peripheral second conductivity type region) that configures the P type cell peripheral junction area 35 is formed in the same process as the P type floating region 16 simultaneously therewith, for example.

Each trench gate electrode 14 extends over the P type cell peripheral junction area 35 from the cell area 10 as a gate lead-out portion 14w. A number of P+ type body contact regions 25p (this portion corresponds even to a peripheral contact portion 41) each having a structure similar to the cell area 10 are provided within the P type cell peripheral junction area 35.

A metal emitter electrode 8 covers up to the peripheral external portion of the cell area 10 and is electrically coupled to the P type cell peripheral region 16p at the peripheral contact portion 41. A metal gate wiring 7 extends to the peripheral portion of the metal emitter electrode 8 and is interconnected with the gate lead-out portion 14w at a metal gate wiring-trench gate electrode coupling portion 13.

Next, a section taken along H-H' of FIG. 58 is shown in FIG. 59. As shown in FIG. 59, a P type body region 15 is provided in the surface 1a of the semiconductor substrate 2 in the linear inactive cell area 40i and the P type cell peripheral junction area 35 or the like in a manner similar to FIG. 52. An end trench gate electrode 14p is provided in the neighborhood of the boundary between the linear inactive cell area 40i and the P type cell peripheral junction area 35 and serves as part of the end buffer area. A P type floating region 16 is provided on the lower side of the P type body region 15 lying below the linear inactive cell area 40i. The P type floating region 16 is deeper in depth than a trench 21e (21) in a manner similar to other portions and covers the lower end of the trench 21e (21) in which the end trench gate electrode 14p is accommodated.

Further, a contact groove (or contract hole) or the like is provided even at the P type cell peripheral junction area 35 portion, and an emitter contact (peripheral contact portion 41) is also provided thereat. A P+ type body contact region 25p and a P+ type latchup prevention region 23p are provided in the surface region of the semiconductor substrate 2 located below the emitter contact. A P type cell peripheral region 16p (peripheral second conductivity type region) is provided therebelow in a manner similar to other portions.

The reason why the peripheral contact portion 41 is provided is as follows: As shown in FIGS. 1 and 6, the cell peripheral junction area 35 is provided in ring form at the outer periphery of the cell area 10, and the P type cell peripheral region 16p (peripheral second conductivity type region) is provided in the substrate region at that portion. The area of the cell peripheral junction area 35 is considerably wide and holes are apt to remain therein where the peripheral contact portion 41 is not provided. When the peripheral contact portion 41 is not provided, the remaining holes inevitably flow into the cell area (undesired flow of holes), thereby resulting in a reduction in latchup breakdown voltage. In relation to this, the electrical separation of the P type cell peripheral region 16p (peripheral second conductivity type region) of the cell peripheral junction area 35, and the P type floating region 16 of the cell area 10 from each other as shown in FIG. 59 is effective in preventing the undesired flow of holes from occurring. The existence of the end trench 21e also contributes to this. Incidentally, in the present example, there is no provided beyond the end trench 21e, such a trench as to couple the gate lead-out portions 14w to each other. This is because when such a trench (one equivalent to the end trench 21e or deeper than that) exists, a voltage drop is developed at that portion due to the flow of holes, thereby reducing a latchup breakdown voltage. Extending the peripheral contact portion 41 in the width direction of the cell peripheral junction area 35 is limited by the existence of the normally existing metal gate wiring 7. This is because the metal emitter electrode 8 and the meal gate wiring 7 are normally comprised of a metal layer of the same layer.

20. Supplementary Explanations or Consideration Related to One Outline of Typical Embodiment (Refer Principally to FIG. 60):

As one example of the typical embodiment, supplementary explanations or consideration will be made herein with respect to the example of the section 7. Incidentally, the device structure has already been described in detail, and the description thereof will therefore not be repeated.

Figure 60:
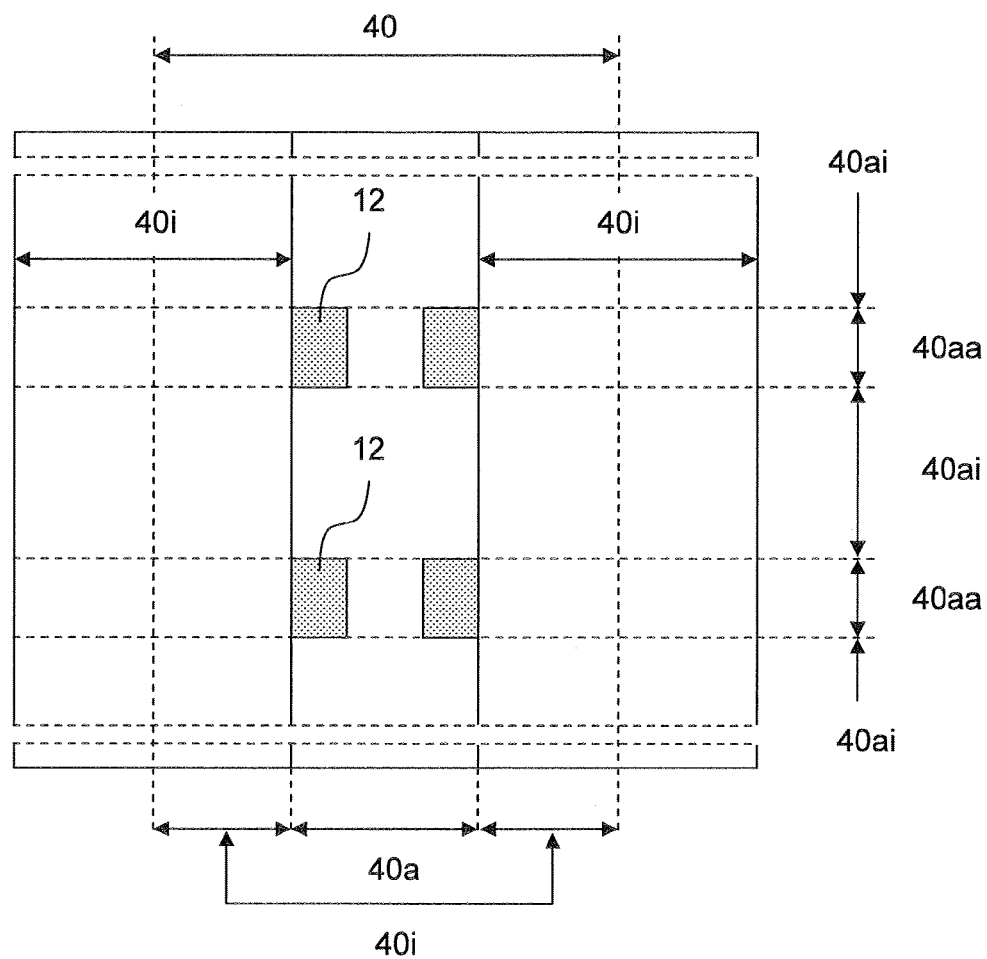
FIG. 60 is an enlarged top view corresponding to FIG. 30 for describing one outline of a typical embodiment.

FIG. 60 is an enlarged top view corresponding to FIG. 30 for describing one outline of the typical embodiment.

The feature of this example resides in that as shown in FIG. 60, unlike the case of FIG. 7, N+ type emitter regions 12 are provided only at portions corresponding to active sections 40aa without being provided approximately over the full length of a linear active cell area 40a as seen in its longitudinal direction.

21. Summary

Although the invention made above by the present inventors has been described specifically on the basis of the preferred embodiments, the present invention is not limited to the embodiments referred to above. It is needless to say that various changes can be made thereto within the scope not departing from the gist thereof.

Although, for example, each of the embodiments has specifically described the example in which the Doped Poly-silicon or the like is used as the gate polysilicon material, the invention of the present application is not limited to it. A Nondoped Poly-silicon film is applied and necessary impurities may be added by ion implantation or the like after deposition.

Further, although the embodiment has described the example in which the high concentration impurity layer is formed from the back surface after backgrinding using the non-epitaxial wafer, the invention of the present application is not limited to it. It is needless to say that the invention can be applied even to one manufactured using an epitaxial wafer.

Although the embodiment has specifically described the punch-through type IGBT by mainly taking it as the example, it is needless to say that the respective characterizing portions of the embodiments of the present application can be applied even to a non-punch through type IGBT inclusive of the structure described in the section 13.

Although the embodiment has specifically described the single IGBT by mainly taking it as the example, the respective embodiments of the present application are not limited to it. It is needless to say that the invention can be applied even to one integrated into a chip as part of an integrated circuit.

What is claimed is:

1. An IE-type trench gate IGBT comprising:
    (a) a semiconductor substrate comprising a first main surface and a second main surface;
    (b) a drift region of a first conductivity type provided within the semiconductor substrate;
    (c) a cell area provided over the first main surface; and
    (d) a number of linear unit cell areas provided within the cell area in a planar view;
    wherein the each linear unit cell area comprises:
    (d1) a linear active cell area provided from over the first main surface in the drift region to the inside thereof;
    (d2) a pair of linear trench gate electrodes lying within a pair of trenches provided in the surface of the first main surface so as to sandwich the linear active cell area therebetween from both sides in a planar view;
    (d3) a second conductivity type body region of a conductivity type opposite to the first conductivity type, the second conductivity type body region being provided in a surface region on the first main surface side, of the drift region;
    (d4) linear inactive cell areas provided adjacent to each other on both sides so as to sandwich the linear active cell area therebetween from both sides thereof in a planar view with the pair of linear trench gate electrodes as boundaries;

(d5) an active section provided within the linear active cell area and divided in a longitudinal direction thereof;

(d6) a first conductivity type emitter region of the same conductivity type as the first conductivity type, the first conductivity type emitter region being provided in a surface region on the first main surface side, of the second conductivity type body region at the active section; and (d7) an inactive section not having the first conductivity type emitter region, the inactive section being provided within the linear active cell area and divided in a longitudinal direction thereof.

2. The IE-type trench gate IGBT according to claim 1 wherein the width of the linear active cell area is narrower than the width of the linear inactive cell area.

3. The IE-type trench gate IGBT according to claim 2,
wherein a second conductivity type floating region of a conductivity type opposite to the first conductivity type is provided in a surface region on the first main surface side, of the drift region in the linear inactive cell area over a whole area thereof, and
wherein the second conductivity type floating region covers lower ends of the pair of trenches and is deeper than the pair of trenches in depth.

4. The IE-type trench gate IGBT according to claim 3, wherein each of the linear unit cell areas comprises a plurality of blocks which form longitudinal direction columns thereof, the each block comprising:

(x1) an active subblock comprising the active section;

(x2) an inactive subblock free of the active section;

(x3) a coupling trench gate electrode which couples between the pair of linear trench gate electrodes and separates the active subblock and the inactive subblock from each other; and (x4) an emitter contact portion not provided in the inactive subblock and provided in the active subblock.

5. The IE-type trench gate IGBT according to claim 4, wherein the active section is provided at part of the active subblock.

6. The IE-type trench gate IGBT according to claim 4, wherein the active sections are provided over a full range of the active subblock.

7. The IE-type trench gate IGBT according to claim 3, wherein the linear inactive cell area comprises:

(y1) a first conductivity type floating region formation section which is divided in a longitudinal direction of the linear inactive cell area and which is formed in the surface region thereof on the first main surface side and provided with a first conductivity type floating region of the same conductivity type as the first conductivity type; and (y2) a first conductivity type floating region non-formation section which is divided in a longitudinal direction of the linear inactive cell area and which is formed in the surface region thereof on the first main surface side and not having the first conductivity type floating region.

8. The IE-type trench gate IGBT according to claim 3, wherein a first conductivity type floating region of the same conductivity type as the first conductivity type is provided in the surface region on the first main surface side, of the linear inactive cell area over a whole area thereof.

9. The IE-type trench gate IGBT according to claim 5, wherein a first conductivity type floating region of the same conductivity type as the first conductivity type is provided in the surface region on the first main surface side, of each of the inactive subblock and the linear inactive cell area over a whole area thereof.

10. An IE-type trench gate IGBT comprising:

(a) a semiconductor substrate comprising a first main surface and a second main surface;

(b) a drift region of a first conductivity type provided within the semiconductor substrate;

(c) a cell area provided over the first main surface; and (d) a number of linear unit cell areas provided within the cell area in a planar view;

wherein the each linear unit cell area comprises:

(d1) a linear active cell area provided from over the first main surface in the drift region to the inside thereof;

(d2) a pair of linear trench gate electrodes lying within a pair of trenches provided in the surface of the first main surface so as to sandwich the linear active cell area therebetween from both sides in a planar view;

(d3) a second conductivity type body region of a conductivity type opposite to the first conductivity type, the second conductivity type body region being provided in a surface region on the first main surface side, of the drift region;

(d4) linear inactive cell areas provided adjacent to each other on both sides so as to sandwich the linear active cell area therebetween from both sides thereof in a planar view with the pair of linear trench gate electrodes as boundaries;

(d5) a first conductivity type emitter region of the same conductivity type as the first conductivity type, the first conductivity type emitter region being provided in a surface region on the first main surface side, of the second conductivity type body region in the linear active cell area;

(d6) a first conductivity type hole barrier region being of the same conductivity type as the first conductivity type, provided in the drift region lying underneath the second conductivity type body region in the linear active cell area, the first conductivity type hole barrier region being higher than the drift region and lower than the first conductivity type emitter region in impurity concentration; and (d7) a second conductivity type floating region of a conductivity type opposite to the first conductivity type, the second conductivity type floating region being provided over a whole area of the surface region on the first main surface side in the linear inactive cell area, wherein the second conductivity type floating region covers lower ends of the pair of trenches and is deeper than the pair of trenches in depth.

11. The IE-type trench gate IGBT according to claim 10, wherein the width of each of the pair of trenches is less than or equal to 0.8 micrometers.

12. The IE-type trench gate IGBT according to claim 10, wherein the second conductivity type floating region is formed simultaneously with a floating field ring at an outer periphery of the cell area.

13. The IE-type trench gate IGBT according to claim 10, wherein the thicknesses of gate insulating films on both sides of each of the pair of linear trench gate electrodes are substantially the same.

14. An IE-type trench gate IGBT comprising:

(a) a semiconductor substrate comprising a first main surface and a second main surface;

(b) a drift region of a first conductivity type provided within the semiconductor substrate;

(c) a cell area provided over the first main surface;

(d) a number of linear unit cell areas provided within the cell area in a planar view;
(e) a metal collector electrode provided over the second main surface of the semiconductor substrate;
(f) a second conductivity type collector region of a conductivity type opposite to the first conductivity type, the second conductivity type collector region being provided in the second main surface of the semiconductor substrate;
(g) a first conductivity type field stop region being of the same conductivity type as the first conductivity type, provided on the second main surface side in the drift region so as to contact the second conductivity type collector region, the first conductivity type field stop region being higher than the drift region in impurity concentration;
(h) a second conductivity type high-concentration collector contact region being of the same conductivity type as the second conductivity type collector region, provided on the metal collector electrode side in the second conductivity type collector region, the second conductivity type high-concentration collector contact region being more higher in impurity concentration,
wherein the each linear unit cell area comprises:
(d1) a linear active cell area provided from over the first main surface in the drift region to the inside thereof;
(d2) a pair of linear trench gate electrodes lying within a pair of trenches provided in the surface of the first main surface so as to sandwich the linear active cell area therebetween from both sides in a planar view;
(d3) a second conductivity type body region of a conductivity type opposite to the first conductivity type, the second conductivity type body region being provided in a surface region on the first main surface side, of the drift region;
(d4) linear inactive cell areas provided adjacent to each other on both sides so as to sandwich the linear active cell area therebetween from both sides thereof in a planar view with the pair of linear trench gate electrodes as boundaries;
(d5) a first conductivity type emitter region of the same conductivity type as the first conductivity type, the first conductivity type emitter region being provided in a surface region on the first main surface side, of the second conductivity type body region in the linear active cell area; and
(d6) a second conductivity type floating region of a conductivity type opposite to the first conductivity type, the second conductivity type floating region being provided approximately over a whole area of the surface region on the first main surface side in the linear inactive cell area,
wherein the second conductivity type floating region covers lower ends of the pair of trenches and is deeper than the pair of trenches in depth.

15. The IE-type trench gate IGBT according to claim 14, wherein each of the linear unit cell areas further comprises:
(d7) a first conductivity type hole barrier region being of the same conductivity type as the first conductivity type, provided in the drift region lying underneath the second conductive type body region in the linear active cell area, the first conductivity type hole barrier region being higher than the drift region and lower than the first conductivity type emitter region in impurity concentration.

16. An IE-type trench gate IGBT comprising:
(a) a semiconductor substrate comprising a first main surface and a second main surface;
(b) a drift region of a first conductivity type provided within the semiconductor substrate;
(c) a cell area provided over the first main surface; and
(d) a number of linear unit cell areas provided within the cell area in a planar view;
wherein the each linear unit cell area comprises:
(d1) a linear active cell area provided from over the first main surface in the drift region to the inside thereof;
(d2) a pair of linear trench gate electrodes lying within a pair of trenches provided in the surface of the first main surface so as to sandwich the linear active cell area therebetween from both sides in a planar view;
(d3) a second conductivity type body region of a conductivity type opposite to the first conductivity type, the second conductivity type body region being provided in a surface region on the first main surface side, of the drift region;
(d4) linear inactive cell areas provided adjacent to each other on both sides so as to sandwich the linear active cell area therebetween from both sides thereof in a planar view with the pair of linear trench gate electrodes as boundaries;
(d5) a first conductivity type emitter region of the same conductivity type as the first conductivity type, the first conductivity type emitter region being provided in a surface region on the first main surface side, of the second conductivity type body region in the linear active cell area; and
(d6) a second conductivity type floating region of a conductivity type opposite to the first conductivity type, the second conductivity type floating region being provided over a whole area of the surface region on the first main surface side in the linear inactive cell area,
wherein further the second conductivity type floating region covers lower ends of the pair of trenches and is deeper than the pair of trenches in depth, and
wherein the IE-type trench gate IGBT further comprises:
(e) a metal emitter electrode provided over the first main surface of the semiconductor substrate;
(f) linear dummy cell areas each provided on the outermost side of the cell area, the linear dummy cell area extending in the same direction as the linear active cell area and comprising a contact portion with the metal emitter electrode; and
(g) a second conductivity type cell peripheral junction area being a conductivity type opposite to the first conductivity type, provided outside each linear dummy cell area so as to surround the periphery of the cell area in a planar view in the surface region on the first main surface side in the drift region, the second conductivity type cell peripheral junction area comprising a contact portion with the metal emitter electrode.

17. The IE-type trench gate IGBT according to claim 16, wherein the linear dummy cell area comprises the same structure as the linear active cell area except that the first conductivity type emitter region is not provided therein.

18. The IE-type trench gate IGBT according to claim 16, wherein the second conductivity type cell peripheral junction area extends to the inside of the linear dummy cell area.

19. The IE-type trench gate IGBT according to claim 16, wherein each of the linear unit cell areas further comprises:
(d7) a first conductivity type hole barrier region being of the same conductivity type as the first conductivity type, provided in the drift region lying underneath the second conductivity type body region in the linear active cell area, the first conductivity type hole barrier region being higher than the drift region and lower than the first conductivity type emitter region in impurity concentration.

20. The IE-type trench gate IGBT according to claim 17, wherein each of the linear unit cell areas further comprises:
   (d7) a first conductivity type hole barrier region being of the same conductivity type as the first conductivity type, provided in the drift region lying underneath the second conductivity type body region in the linear active cell area, the first conductivity type hole barrier region being higher than the drift region and lower than the first conductivity type emitter region in impurity concentration.

* * * * *